United States Patent
Yamamoto et al.

(10) Patent No.: US 7,259,389 B2
(45) Date of Patent: Aug. 21, 2007

(54) ORGANIC ELECTRONIC DEVICE AND METHOD FOR MANUFACTURING THE SAME

(75) Inventors: Shinichi Yamamoto, Hirakata (JP); Norihisa Mino, Osaka (JP); Kazufumi Ogawa, Takamatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/503,829

(22) PCT Filed: Feb. 7, 2003

(86) PCT No.: PCT/JP03/01290

§ 371 (c)(1),
(2), (4) Date: Aug. 6, 2004

(87) PCT Pub. No.: WO03/067675

PCT Pub. Date: Aug. 14, 2003

(65) Prior Publication Data
US 2005/0145839 A1    Jul. 7, 2005

(30) Foreign Application Priority Data

| Feb. 8, 2002 | (JP) | ............................. 2002-033179 |
| Feb. 8, 2002 | (JP) | ............................. 2002-033180 |
| Feb. 8, 2002 | (JP) | ............................. 2002-033181 |

(51) Int. Cl.
*H01L 35/24* (2006.01)

(52) U.S. Cl. ............................ 257/40; 257/49; 257/59; 257/66

(58) Field of Classification Search ................. 257/40, 257/49, 59, 66

See application file for complete search history.

(56) References Cited

U.S. PATENT DOCUMENTS

| 5,008,127 A | 4/1991 | Ogawa |
| 5,017,975 A | 5/1991 | Ogawa |
| 5,270,417 A * | 12/1993 | Soga et al. ................. 526/279 |

(Continued)

FOREIGN PATENT DOCUMENTS

EP    0 339 677    11/1989

(Continued)

*Primary Examiner*—Long Pham
(74) *Attorney, Agent, or Firm*—Hamre, Schumann, Mueller & Larson, P.C.

(57) ABSTRACT

An organic electronic device of the present invention includes a substrate, at least two electrodes formed on the substrate, a conductive organic thin film that is formed on the substrate and electrically connects the electrodes, and a coating film for coating at least a portion of the electrodes. The conductive organic thin film is a polymer of organic molecules containing a conjugated-bondable group, and one end of each of the organic molecules is chemically bonded to the surface of the substrate and the conjugated-bondable groups in the organic molecules are polymerized with other conjugated-bondable groups to form a conjugated bond chain. The coating film electrically connects the electrodes to the conductive organic thin film and achieves a smaller connection resistance than that in the case where the electrodes and the conductive organic thin film are connected directly. As the coating film, a film made of metal selected from gold, platinum, and silver, a conductive polymeric film, or a monomolecular film that is chemically bonded to the electrodes can be used.

40 Claims, 22 Drawing Sheets

U.S. PATENT DOCUMENTS

| | | |
|---|---|---|
| 5,353,632 A | 10/1994 | Nakagawa |
| 5,461,166 A | 10/1995 | Mino |
| 5,681,442 A * | 10/1997 | Ogawa et al. .............. 205/122 |
| 6,136,702 A | 10/2000 | Crone et al. |

FOREIGN PATENT DOCUMENTS

| | | |
|---|---|---|
| EP | 0 385 656 | 9/1990 |
| EP | 0 540 839 | 5/1993 |
| EP | 0 552 637 | 7/1993 |
| EP | 0 587 159 | 3/1994 |
| EP | 1 104 035 | 5/2001 |
| JP | 2-27766 | 1/1990 |
| JP | 4-69971 | 3/1992 |
| JP | 5-87559 | 4/1993 |
| JP | 6-92971 | 4/1994 |
| JP | 7-22670 | 1/1995 |

\* cited by examiner

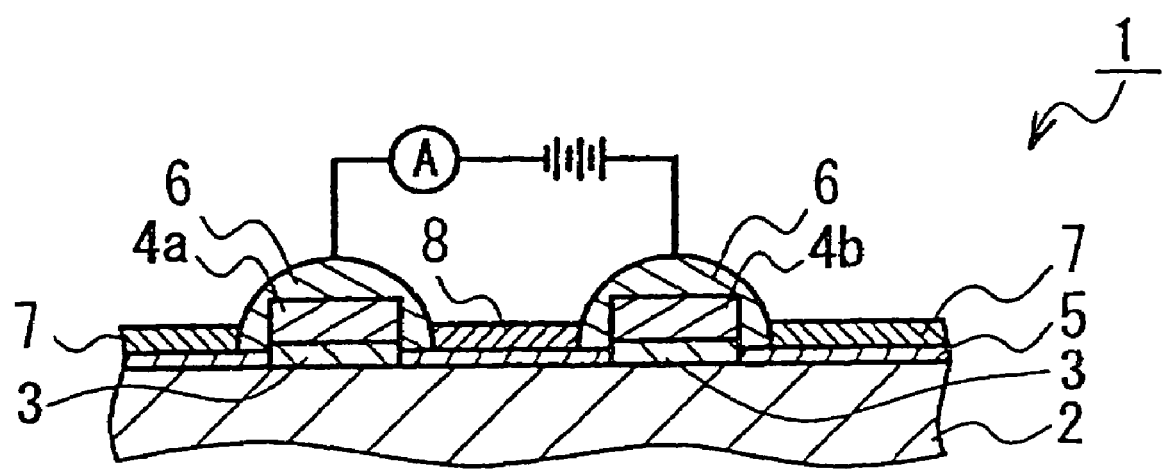
F I G. 1

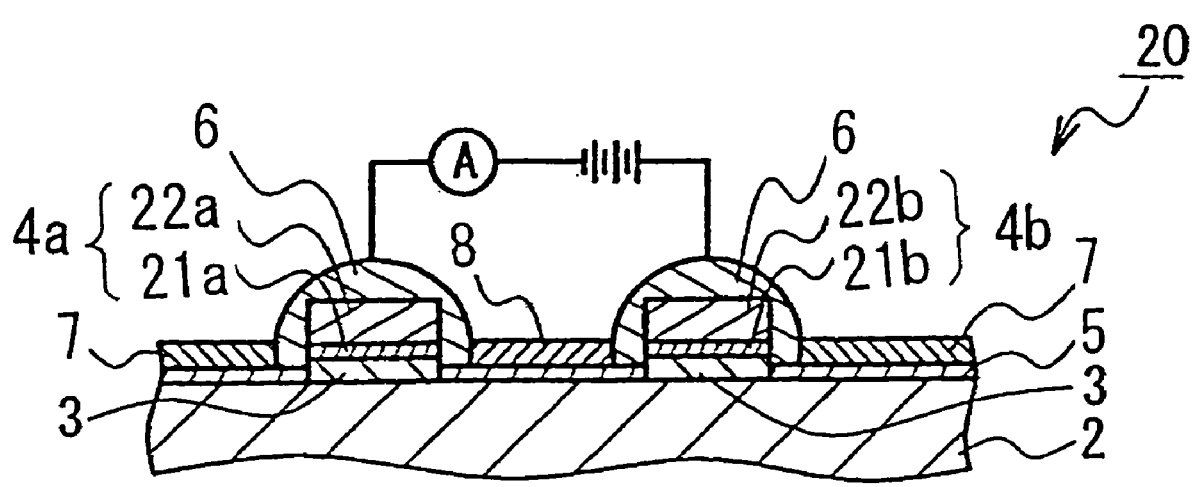
F I G. 6

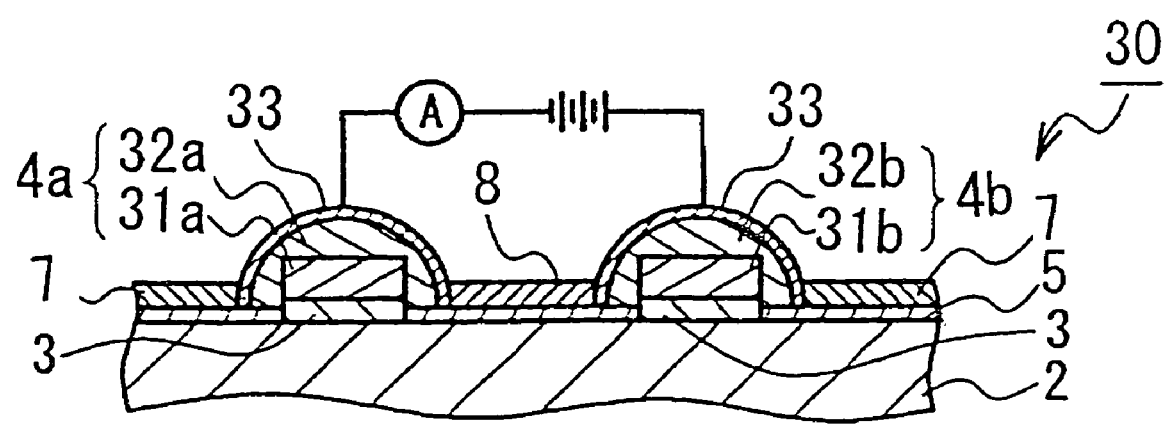
F I G. 7

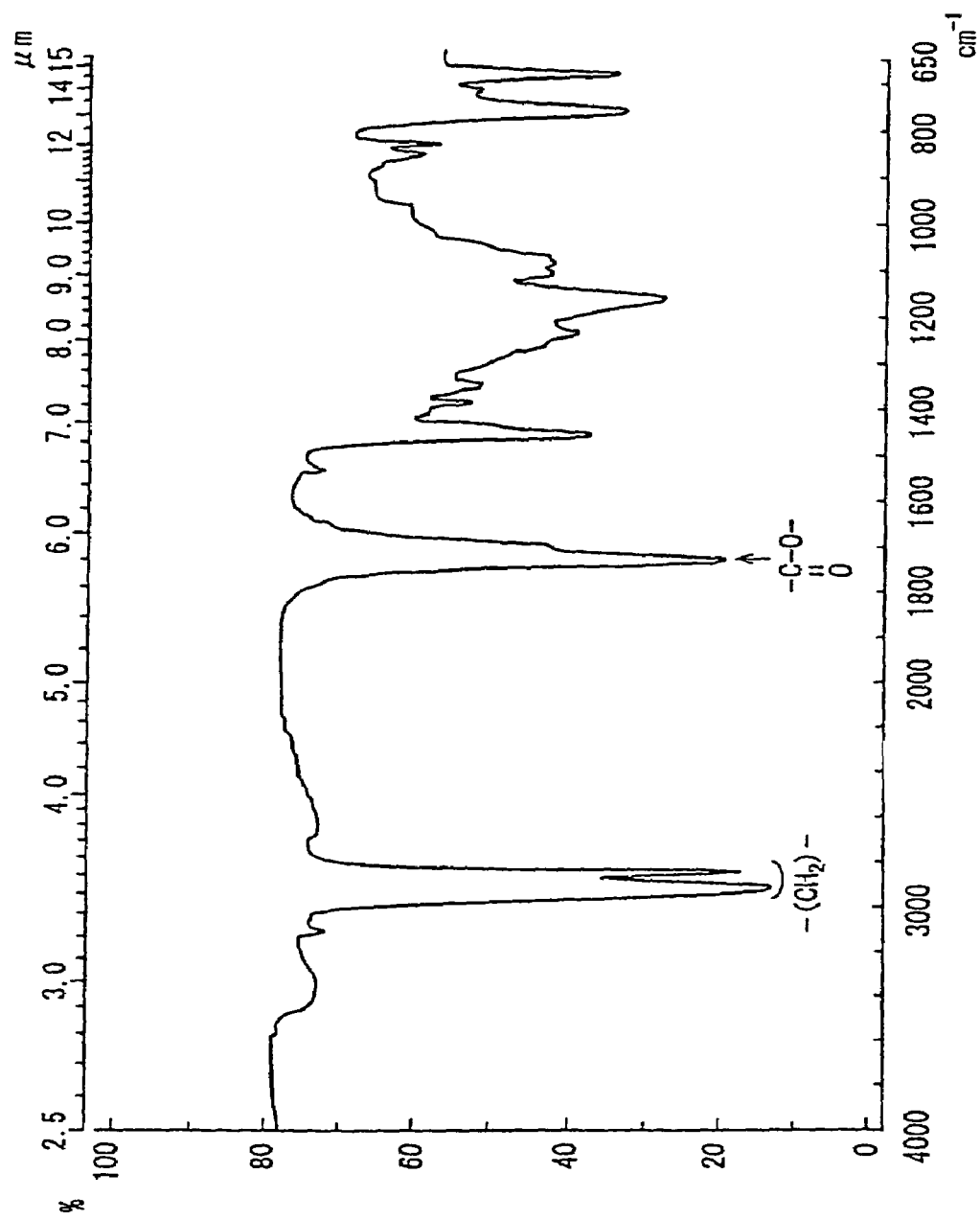
F I G. 22

ORGANIC ELECTRONIC DEVICE AND METHOD FOR MANUFACTURING THE SAME

TECHNICAL FIELD

The present invention relates to an organic electronic device using a conductive organic thin film and a method for manufacturing the same.

BACKGROUND ART

Conventionally, inorganic materials, a typical example of which is silicon crystals, have been used for electronic devices. However, such inorganic materials have a disadvantage that as the devices are made finer, crystal defects become critical, and the device performance disadvantageously depends largely on the crystals.

On the contrary, conductive organic thin films have been given attention as a material that can cope with the development of device miniaturization because the properties of the conductive organic thin films hardly deteriorate even when they are subjected to fine processing. The applicant already has suggested organic thin films containing a conjugated bond chain such as polyacetylene, polydiacetylene, polyacene, polyphenylene, polythiophene, polypyrrole, and polyaniline (e.g., JP H2(1990)-27766A, U.S. Pat. No. 5,008,127, EP-A-0385656, EP-A-0339677, EP-A-0552637, U.S. Pat. No. 5,270,417, JP H5(1993)-87559A, and JP H6(1994) JP6-92971A).

An electronic device using a conductive organic thin film (hereinafter, referred to as "organic electronic device") generally has a structure in which two electrodes formed on a substrate are connected electrically by a conductive organic thin film. As the electrodes, inorganic materials such as metals are used. In such an organic electronic device, it is required that electrical connectivity between the electrodes is good, and with this requirement, there is a demand for further improvement in connectivity between each of the electrodes and the conductive organic thin film.

DISCLOSURE OF INVENTION

An organic electronic device of the present invention includes a substrate, at least two electrodes formed on the substrate, a conductive organic thin film that is formed on the substrate and electrically connects the electrodes, and a coating film for coating at least a portion of the electrodes, wherein the conductive organic thin film is a polymer of organic molecules containing a conjugated-bondable group, and one end of each of the organic molecules is chemically bonded to the surface of the substrate and the conjugated-bondable groups in the organic molecules are polymerized with other conjugated-bondable groups to form a conjugated bond chain, and the coating film electrically connects the electrodes to the conductive organic thin film and achieves a smaller connection resistance than that in the case where the electrodes and the conductive organic thin film are connected directly.

Moreover, a method for manufacturing the organic electronic device of the present invention includes forming at least two electrodes on a substrate having active hydrogen on its surface, forming a coating film on the surfaces of the electrodes, forming a precursor of a conductive organic thin film on the surface of the substrate such that at least a portion of the precursor is in contact with the coating film by bringing organic molecules containing a conjugated-bondable group that can be polymerized with other molecules and an end-bondable group that can be chemically bonded to the surface of the substrate at one end into contact with the surface of the substrate to form a chemical bond by a reaction between the active hydrogen on the surface of the substrate and the end-bondable group, and forming the conductive organic thin film by polymerizing the conjugated-bondable groups in the organic molecules constituting the precursor of the conductive organic thin film with other conjugated-bondable groups to form a conjugated bond chain to connect electrically the electrodes via the conductive organic thin film.

Examples of the coating film include a metal film, a conductive polymeric film, and a monomolecular film that is chemically bonded to the surfaces of the electrodes.

BRIEF DESCRIPTION OF DRAWINGS

FIG. 1 is a cross-sectional view showing an example of an organic electronic device according to a first embodiment of the present invention.

FIG. 5A is a graph showing change in current with respect to light irradiation time, and FIG. 5B is a schematic diagram showing a switching operation by irradiation with two types of light having different wavelengths.

FIG. 6 is a cross-sectional view showing an example of an organic electronic device according to a second embodiment of the present invention.

FIG. 7 is a cross-sectional view showing an example of an organic electronic device according to a third embodiment of the present invention.

FIG. 13A shows a region on a substrate and FIG. 13B shows a region on an electrode.

FIG. 14A shows a region on the substrate and FIG. 14B shows a region on the electrode.

FIG. 18A is a graph showing change in current with respect to voltage change, and FIG. 18B is a schematic diagram showing a switching operation depending on whether or not a voltage is applied.

FIG. 22 is an IR chart of the thienyl compound.

BEST MODE FOR CARRYING OUT THE INVENTION

Figure 2A:
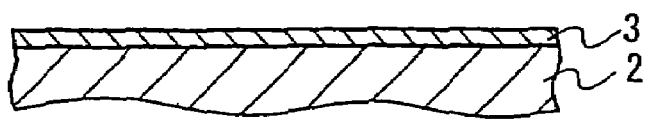
FIGS. 2A through 2G are views showing a process sequence of an example of a method for manufacturing the organic electronic device according to the first embodiment.

As described above, an organic electronic device of the present invention includes a substrate, at least two electrodes formed on the substrate, a conductive organic thin film that is formed on the substrate and electrically connects the electrodes, and a coating film for coating at least a portion of the electrodes. The conductive organic thin film is a polymer of organic molecules containing a conjugated-bondable group, and one end of each of the organic molecules is chemically bonded to the surface of the substrate and the conjugated-bondable groups in the organic molecules are polymerized with other conjugated-bondable groups to form a conjugated bond chain. The coating film electrically connects the electrodes to the conductive organic thin film and achieves a smaller connection resistance than that in the case where the electrodes and the conductive organic thin film are connected directly.

According to such an organic electronic device, the coating film electrically connects the electrodes to the conductive organic thin film and reduces the connection resistance, so that excellent electrical connectivity between the electrodes and the conductive organic thin film is achieved.

Furthermore, since the conductive organic thin film is used for electrically connecting the electrodes, for example, even when further fine processing is performed to increase the density of the device, an excellent property of independece of crystallinity is provided. In the conductive organic thin film in the organic electronic device of the present invention, a conjugated bond chain is formed by polymerizing organic molecules and a conductive network is formed using this conjugated bond chain, and thus conductivity is generated. Moreover, "conductive network" refers to an aggregate of conjugated bond chains involved in electrical conduction.

Such an organic electronic device can be utilized for various apparatuses such as liquid crystal display apparatuses, electroluminescent display apparatuses, and electroluminescence devices, and is useful.

Preferred examples of the coating film include a metal film containing at least one selected from the group consisting of gold, platinum, and silver. These metal films have good contact with the conjugated bond chains involved in conductivity that are formed by polymerizing the organic molecules in the conductive organic thin film. Moreover, the electrodes can be protected from corrosion by coating the electrodes with such a metal film. Hereinafter, the metal film for coating the electrodes is referred to as "metal film for coating."

In this case, it is preferable that the electrodes contain at least one metal selected from the group consisting of Ni, Ti, indium tin oxide (ITO), Cr, and W. In particular, it is preferable that each of the electrodes is a single Ni layer or a layered product having a Ni layer as an uppermost layer. When a Ni layer is used for the electrodes as described above, the contacting property of the electrodes with the coating film made of gold or the like is improved. "Ni layer" refers not only to a layer containing only Ni but also a layer made of, for example, Ni alloys. The same is true of the other layers containing a metal.

Another preferred example of the coating film is a conductive polymeric film. Since the conductive polymeric film is organic, the conductive polymeric film has good contact with the conjugated bond chains involved in conductivity in the conductive organic thin film. Hereinafter, the conductive polymeric film for coating the electrodes is referred to as "polymeric film for coating."

There is no particular limitation regarding the polymeric film for coating, as long as it exhibits conductivity, and examples thereof include a conductive polymeric film based on at least one selected from the group consisting of polypyrrole, polythiophene, polyaniline, polyacetylene, polydiacetylene, and polyacene. Such conductive polymers can, for example, connect to the conductive organic thin film by conjugated bonding as will be described later and therefore have excellent electrical connectivity.

Still another preferred example of the coating film is a monomolecular film that is chemically bonded to the surfaces of the electrodes. Since the monomolecular film is organic, the monomolecular film has good contact with the conjugated bond chains involved in conductivity in the conductive organic thin film. Moreover, the monomolecular film has a very small film thickness, so that a tunneling effect occurs, and for example, even when the monomolecular film itself has no conductivity, the tunneling effect enables conduction. Hereinafter, the monomolecular film for coating the electrodes is referred to as "monomolecular film for coating."

It is preferable that the monomolecular film for coating is a monomolecular film containing constituent molecules that are chemically bonded to the surfaces of the electrodes by a —S— bond. The constituent molecules are firmly fixed to the surfaces of the electrodes, so that a very thin monomolecular film having excellent durability against exfoliation and the like can be formed.

Preferred examples of the monomolecular film for coating include a monomolecular film in which at least a part of the constituent molecules are conjugated-bonded to the conjugated-bondable groups in the organic molecules constituting the conductive organic thin film. Such a monomolecular film is particularly excellent in electrical connectivity with the conductive organic thin film.

Examples of the constituent molecule of such a monomolecular film include a molecule selected from the group consisting of pyrrole derivatives, thiophene derivatives, aniline derivatives, acetylene derivatives, and diacetylene derivatives containing a substituent that is bonded to the surface of the electrode by a —S— bond. It should be noted that a thiophene derivative refers to a compound having a thienyl group and a pyrrole derivative refers to a compound having a pyrrolyl group.

It is preferable that the pyrrole derivative is a pyrrole derivative having a substituent that is bonded to the surface of the electrode by a —S— bond in nitrogen (N) in position 1 of a pyrrole ring. Moreover, it is preferable that the thiophene derivative is a thiophene derivative having a substituent that is bonded to the surface of the electrode by a —S— bond in at least one of carbons (C) in positions 3 and 4 of a thiophene ring.

Moreover, it is preferable that the constituent molecules of the monomolecular film for coating are polymerized by conjugated bonding. The reason for this is that since the monomolecular film itself is provided with conductivity, electrical connectivity between the electrodes and the conductive organic thin film is further improved.

Furthermore, another preferred example of the monomolecular film for coating is a monomolecular film in which at least a part of the constituent molecules are bonded covalently to portions other than the conjugated-bondable groups in the organic molecules constituting the conductive organic thin film. In particular, it is preferable that the constituent molecules of the coating film and the organic molecules constituting the conductive organic thin film are bonded by at least one of a siloxane bond (—SiO—) and a —SiN— bond. Such a monomolecular film forms a particularly firm chemical bond with the conductive organic thin film and is particularly excellent in connectivity.

Moreover, when a monomolecular film is used as the coating film, it is preferable to orient the constituent molecules of the monomolecular film. Orienting refers to tilting the constituent molecules in a predetermined direction.

When a conductive polymeric film and a monomolecular film are used as the coating film, it is preferable that at least surface portions of the electrodes contain at least one metal selected from the group consisting of gold, platinum, and silver. The reason for this is that when the surface portions of the electrodes contain such a metal, the insides of the electrodes can be prevented from being corroded. Moreover, the surfaces of the electrodes made of such a metal easily can be bonded to the constituent molecules via the thiol groups when forming a monomolecular film for coating as described above.

In particular, it is preferable that each of the electrodes has a structure constituted by an inner layer formed on the substrate and an outer layer for coating the inner layer and this outer layer is a layer containing at least one metal selected from the group consisting of gold, platinum, and silver. As the inner layer, for example, a layer containing at least one metal selected from the group consisting of Ni, Ti, indium tin oxide (ITO), Cr, and W can be used, and it is particularly preferable that the inner layer is a single Ni layer or a layered product having a Ni layer as an uppermost layer. When Ni is used for the inner layer as described above, the inner layer also has good contact with the outer layer made of gold or the like.

Moreover, in the organic electronic device, it is preferable that the conductive organic thin film is a monomolecular film or a monomolecular built-up film. Such a conductive organic thin film advantageously exhibits extremely good conductivity even when the film thickness is small. Furthermore, in the case of the monomolecular built-up film, a desired conductivity can be achieved by changing the number of monolayers. The conductivity of the monomolecular built-up film depends on, for example, the number of layers of monomolecules that are layered, and for example, when the same monomolecular films are built up, conductivity is almost proportional to the number of the built-up monomolecular films.

Moreover, it is preferable that the chemical bond between the conductive organic thin film and the substrate is at least one bond selected from a siloxane bond (—SiO—) and a —SiN— bond. In this case, Si and N may be bonded to other bonding groups corresponding to respective valences. An example of the form in which other bonding groups are bonded is a form in which end-bonding groups of the organic molecules are bonded to each other and thus the organic molecules are polymerized.

Moreover, the conductive organic thin film has a conjugated bond chain polymerized by conjugated bonding of the organic molecules, and the conjugated bond chain is preferably a chain of at least one selected from the group consisting of polypyrrole, polythiophene, polyacetylene, polydiacetylene, polyacene, polyphenylene, polyphenylenevinylene, polypyridinopyridine, and polyaniline, and derivatives thereof, and among these, polypyrrole, polythiophene, polyacetylene, polydiacetylene, and polyacene are more preferable, and polypyrrole and polythiophene are particularly preferable. Furthermore, examples of the derivative of polyacetylene include polymethylacetylene, polybutylacetylene, polycyanoacetylene, polydicyanoacetylene, polypyridylacetylene, and polyphenylacetylene.

Moreover, the organic electronic device in the present invention is not limited to a particular type, but, for example, a three-terminal organic electronic device and a two-terminal organic electronic device are preferable.

In the case of the three-terminal organic electronic device, it is preferable that the organic molecule constituting the conductive organic thin film contains a polar functional group containing no active hydrogen between the conjugated-bondable group and a site that is chemically bonded to the surface of the substrate. In the conductive organic thin film constituted by the organic molecules having a polar functional group as described above, sensitivity to an applied voltage is further increased, so that the conductivity can be changed at a high speed. Therefore, with such a conductive organic thin film, an excellent device having a high response speed is obtained. It is believed that such a change in the conductivity was caused by the fact that the structure of the conductive network was influenced by the electric field response of the polar functional group.

Examples of the polar functional group include at least one group selected from the group consisting of an ester group (—COO—), an oxycarbonyl group (—OCO—), a carbonyl group (—CO—), and a carbonate (—OCOO—) group. With a functional group in which polarization increases by application of an electric field as described above, sensitivity to the applied electric field becomes very high and also the response speed becomes very high.

It is possible that the three-terminal organic electronic device has a structure in which a third electrode for applying an electric field to the conductive organic thin film is provided in addition to the two electrodes (the first electrode and the second electrode). Moreover, for example, a configuration in which the substrate is a silicon substrate and the conductive organic thin film is provided on the substrate via a film containing an oxide, and the substrate functions as the electrode for controlling the electric field that acts on the conductive organic thin film by applying a voltage between the two electrodes is also possible.

On the other hand, in the case of the two-terminal organic electronic device, it is preferable that the organic molecule contains a photoresponsive functional group between the conjugated-bondable group and a site that is chemically bonded to the surfaces of the coating films or the surface of the substrate. An example of the photoresponsive functional group is an azo group (—N=N—). In the conductive organic thin film constituted by the organic molecules having a photoresponsive group as described above, for example, sensitivity to light is improved, so that the conductivity can be changed at a high speed by irradiation with light. Therefore, with such a conductive organic thin film, an excellent device having a high response speed is obtained, and thus the device can be used for, for example, variable resistances, switching devices, optical sensor devices, and memory devices. It is believed that such a change in the conductivity was caused by the fact that the photoresponsive functional group produced a response to light with which it was irradiated and the structure of the conductive network was influenced by this response.

Photoresponsivity refers to a characteristic that the state of a molecule is changed reversibly by irradiation with light, and photoresponse includes photoisomerization, a typical example of which is cis-trans isomerization, and the like by which the order (sequence) in which atoms constituting the molecule are bonded remains unchanged but spatial arrangement thereof is changed. Therefore, the change in the conductivity of the conductive organic thin film is reversible and the conductivity can be restored to a predetermined state by combined irradiation with light having different wavelengths and the like.

Furthermore, in the organic electronic device, it is preferable that the organic molecules constituting the conductive organic thin film are oriented. The conductive organic film can be provided with high conductivity by orienting the organic molecules. Moreover, the conjugated bond chains constituting the conductive network can be arranged almost parallel to each other in a particular plane in the conductive organic thin film by orienting the organic molecules. Thus, a directional conductive network can be formed, and the conductive organic thin film also can be provided with conduction anisotropy.

Orienting refers to tilting each of the organic molecules constituting the organic thin film in a predetermined direction. Moreover, in the present invention, orientation direction of the organic molecules refers to the direction of a line segment on which major axes of the organic molecules are projected.

Furthermore, in the organic electronic device, there is no particular limitation regarding a material of the substrate, but, for example, known insulative materials such as glass and quartz are preferable. The reason for this is that a glass substrate, a quartz substrate and the like can easily form a covalent bond with an end of each of the organic molecules constituting the conductive organic thin film and have good durability against exfoliation and the like and also have good contact with the metal electrodes formed on the substrate because the surfaces of these substrates are hydrophilic and have active hydrogen. Moreover, when the substrate is made of an insulative material, for example, the substrate itself is never charged, and thus leakage current is small and an organic electronic device having excellent operating stability can be provided.

Moreover, another preferred example of the substrate is a plastic substrate such as polyethersulfone, polyethylene terephthalate, epoxy resin, and acrylic resin. These substrates have flexibility, so that an organic electronic device using such a substrate has wide applicability.

Furthermore, in the present invention, the surface of the substrate may be coated with an oxide film. When the substrate is coated with an oxide film, the type of the substrate is not limited to the insulative substrates as described above. The reason for this is that when an oxide film is formed on the surface of the substrate, this film serves as an insulating film. Moreover, such an oxide film easily can form a covalent bond with an end of each of the organic molecules constituting the conductive organic thin film and has good durability against exfoliation and the like because the surface of the oxide film is hydrophilic and has active hydrogen. Therefore, when an oxide film is formed on the surface of the substrate, it is sufficient that each of the organic molecules is covalently bonded to the surface of the oxide film in place of the surface of the substrate.

Examples of the oxide film include inorganic oxides such as $SiO_2$, $Al_2O_3$, $Y_2O_3$, $ZrO_2$, $Ta_2O_5$, $La_2O_3$, $Nb_2O_3$, and $TiO_2$, and among these, $SiO_2$, $ZrO_2$, $Ta_2O_5$, and $La_2O_3$ are preferable. Moreover, the oxide film may be, for example, a complex oxide such as barium zirconate titanate (BZT) and barium strontium titanate (BST), or may be an amorphous metal oxide film. It is also possible to use, for example, an organic oxide such as polyvinyl phenol. Moreover, the oxide film may contain one type of oxide or two or more types of oxides.

A method for manufacturing the organic electronic device of the present invention includes, as described above, forming at least two electrodes on a substrate having active hydrogen on its surface, forming a coating film on the surfaces of the electrodes, forming a precursor of a conductive organic thin film on the surface of the substrate such that at least a portion of the precursor is in contact with the coating film by bringing organic molecules containing a conjugated-bondable group that can be polymerized with other molecules and an end-bondable group that can be chemically bonded to the surface of the substrate in one end into contact with the surface of the substrate to form a chemical bond by a reaction between the active hydrogen on the surface of the substrate and the end-bondable group, and forming the conductive organic thin film by polymerizing the conjugated-bondable groups in the organic molecules constituting the precursor of the conductive organic thin film with other conjugated-bondable groups to form a conjugated bond chain to connect the electrodes electrically via the conductive organic thin film.

With such a manufacturing method, the organic electronic device of the present invention as described above can be manufactured.

When forming a metal film containing, for example, gold, platinum, and silver as the coating film, plating using substitution can be performed as a formation method thereof Moreover, when forming a conductive polymeric film as the coating film, electrolytic polymerization using the electrodes formed on the substrate as electrolytic electrodes can be employed as a formation method thereof More specifically, for example, a method of immersing the substrate provided with the electrodes in a solution containing organic molecules containing at least one group selected from the group consisting of a pyrrolyl group, a thienyl group, an ethynylene group (—C≡C—), and a diacetylene group (—C≡C—C≡C—), and electrolyzing the solution using the electrodes as the electrolytic electrodes can be employed.

Furthermore, when forming a monomolecular film as the coating film, the monomolecular film can be formed by contacting organic molecules containing a reactive group that can be chemically bonded to the surfaces of the electrodes in one end and a group that can form a conjugated bond with the organic molecule constituting the precursor of the conductive organic thin film in the other end to form a chemical bond by a reaction between the reactive group and the electrodes.

In this case, in the step of forming the conductive organic thin film, the organic molecules constituting the precursor of the conductive organic thin film can be conjugated-bonded to each other, and also the organic molecules constituting the precursor of the conductive organic thin film can be conjugated-bonded to the organic molecules constituting the coating film.

Examples of the group that can form a conjugated bond with the organic molecule constituting the precursor of the conductive organic thin film include at least one group selected from the group consisting of a pyrrolyl group, a thienyl group, an ethynylene group (—C≡C—), and a diacetylene group (—C≡C—C≡C—).

Moreover, when forming a monomolecular film as the coating film, it is also possible to employ a method of contacting organic molecules containing a reactive group that can be chemically bonded to the surfaces of the electrodes at one end and a group having active hydrogen at the other end to form a chemical bond by a reaction between the reactive group and the electrodes as a formation method.

In this case, in the step of forming the precursor of the conductive organic thin film, a chemical bond can be formed by a reaction between reactive groups in the organic molecules constituting the precursor of the conductive organic thin film and groups containing active hydrogen in the organic molecules constituting the coating film.

Examples of the group having active hydrogen include at least one group selected from the group consisting of an —OH group, a —COOH group, a —NH$_2$ group, and a —NH group.

Furthermore, when forming a monomolecular film as the coating film, it is also possible to employ a method of forming a precursor of the coating film on the surfaces of the electrodes by contacting organic molecules containing a reactive group that can be chemically bonded to the surfaces of the electrodes in one end and a group that can be provided with active hydrogen in the other end to form a chemical bond by a reaction between the reactive group and the electrodes, and then performing a treatment for providing active hydrogen to the precursor of the coating film as a formation method.

Also in this case, in the step of forming the precursor of the conductive organic thin film, a chemical bond can be formed by a reaction between reactive groups in the organic molecules constituting the precursor of the conductive organic thin film and groups containing active hydrogen in the organic molecules constituting the coating film.

The group that can be provided with active hydrogen refers to a group that can be changed into a group having active hydrogen as described above by performing an appropriate treatment after a film is formed. Examples thereof include a group containing at least one group selected from the group consisting of an unsaturated hydrocarbon group (in this case, active hydrogen is provided by oxidation) and an ester group (in this case, active hydrogen is provided by hydrolysis).

Moreover, examples of the treatment for providing active hydrogen include a treatment of oxidizing or hydrolyzing the group that can be provided with active hydrogen in the organic molecule constituting the precursor of the coating film. For example, when the group that can be provided with active hydrogen contains an unsaturated group, an —OH group and the like can be introduced by oxidizing this group. Alternatively, when the group that can be provided with active hydrogen contains an ester group, an —OH group and the like can be introduced by hydrolyzing this group.

In all of the above-described methods, an example of the reactive group that can be chemically bonded to the surfaces of the electrodes is a mercapto (—SH) group. When the reactive group is a mercapto group, a —S— bond is formed as the chemical bond between the surface of the electrode and the coating film.

In the manufacturing method, it is preferable that at least surface portions of the electrodes contain at least one metal selected from the group consisting of gold, platinum, and silver.

In the manufacturing method, it is preferable that the precursor of the conductive organic thin film is a monomolecular film or a monomolecular built-up film. According to this preferred example, a conductive organic thin film in the form of a monomolecular film or in the form of a monomolecular built-up film can be formed.

In the manufacturing method, the organic molecules for forming the precursor of the conductive organic thin film contain an end-bondable group and a conjugated-bondable group.

It is preferable that the conjugated-bondable group is a functional group containing at least one group selected from the group consisting of a pyrrolyl group, a thienyl group, an ethynylene group (—C≡C—), and a diacetylene group (—C≡C—C≡C—). When the conjugated-bondable group contains a pyrrolyl group, a polypyrrole-based conjugated bond chain can be formed, and when containing a thienyl group, a polythiophene-based conjugated bond chain can be formed. Moreover, when the conjugated-bondable group contains an ethynylene group, a polyacetylene-based conjugated bond chain can be formed, and when containing a diacetylene group, a polydiacetylene- or a polyacene-based conjugated bond chain can be formed.

It is preferable that the end-bondable group is a silyl halide group, an alkoxysilyl group, or an isocyanate silyl group. It is preferable that the silyl halide group is, in particular, a chlorosilyl group. Moreover, it is preferable that the alkoxysilyl group is, in particular, an alkoxysilyl group having 1 to 3 carbon atoms.

When the end-bondable group is a silyl halide group, a covalent bond can be formed by a dehydrohalogenation reaction with active hydrogen on the surface of the substrate. When the end-bondable group is an alkoxysilyl group, a covalent bond can be formed by a dealcoholization reaction with active hydrogen on the surface of the substrate. Moreover, when the end-bondable group is an isocyanate silyl group, a covalent bond can be formed by a reaction for removing isocyanate groups with active hydrogen on the surface of the substrate.

Furthermore, it is preferable that the organic molecules for forming the precursor of the conductive organic thin film contain a polar functional group containing no active hydrogen between the end-bondable group and the conjugated-bondable group. According to this preferred example, molecules freely rotate easily in the polar functional group portion, and thus there is an advantage that the organic molecules constituting the organic thin film are oriented easily. Examples of the polar functional group include at least one group selected from the group consisting of an ester group (—COO—), an oxycarbonyl group (—OCO—), a carbonyl group (—CO—), and a carbonate (—OCOO—) group.

Moreover, it is preferable that the organic molecules for forming the precursor of the conductive organic thin film contain a photoresponsive functional group between the end-bondable group and the conjugated-bondable group. An example of the the photoresponsive functional group is an azo group (—N=N—).

In the manufacturing method, it is preferable that polymerization is performed by at least one polymerization method selected from electrolytic polymerization, catalytic polymerization, and energy beam irradiation polymerization.

Furthermore, in the manufacturing method, it is preferable to orient the organic molecules constituting the precursor of the conductive organic thin film. The conjugated-bondable groups can be arranged in a certain direction and also the conjugated-bondable groups can be arranged in close proximity to each other by orienting the organic molecules. Consequently, polymerization of the organic molecules can proceed easily and a conducting region with high conductivity can be formed.

Examples of the orientation method include rubbing, a treatment of draining liquid from the surface of the substrate provided with the coating film in a predetermined direction, and polarized light irradiation. Moreover, the organic molecules constituting the coating film also can be oriented using fluctuation of molecules during the polymerization.

Next, preferred examples of the conductive organic thin film constituting the organic electronic device of the present invention will be described in further detail. This conductive organic thin film is a polymer of organic molecules and a conjugated bond chain is formed by polymerization of the organic molecules. A conductive network is formed by such a conjugated bond chain, and thus conductivity is provided.

In the conductive organic thin film, the conductive network is preferably directional. In this case, the direction of the conductive network preferably is matched with the direction of the connection between the electrodes. It should be noted that even when the conductive network is directional, the conjugated bond chains constituting the conductive network are not required to lie in strictly one direction. For example, it is sufficient that although the conductive network includes the conjugated bond chains that lie in various directions, the conductive network as a whole is formed to be in a particular direction (i.e., the direction of the connection between the electrodes).

Moreover, the conductivity (ρ) of the conductive organic thin film is, for example, but not limited to, 1 S/cm or more, preferably $1 \times 10^3$ S/cm or more, more preferably $1 \times 10^4$ S/cm or more, even more preferably $5.5 \times 10^5$ S/cm or more, and most preferably $1 \times 10^7$ S/cm or more. All of the above values are obtained at room temperature (25° C.) without a dopant. As above, the conductive organic thin film also can have a conductivity that is equivalent to or larger than that of metals.

The conductive organic thin film can be formed, for example, by forming an organic thin film (hereinafter, referred to as "precursor thin film") constituted by organic molecules having a conjugated-bondable group and then polymerizing the conjugated-bondable groups in the organic molecules.

As the organic molecule that serves as a material of the precursor thin film, one containing an end-bondable group in one end of a molecule and containing a conjugated-bondable group in any portion of the molecule is used, as described above.

The conjugated-bondable group is a functional group that can form a conjugated bond by polymerization with other molecules. With the conjugated bond chain formed by this polymerization, the conductive network is formed as described above, and thus the conductivity of the organic conductive thin film is generated. Specific examples of the conjugated-bondable group are as described above.

The end-bondable group is a functional group that can react with the surface of the substrate and form a chemical bond, preferably a covalent bond. Reacting with the surface of the substrate and forming a bond refers not only to bonding directly with the surface of the substrate but also, for example, bonding with the surface of an insulating film in the case where the insulating film is formed on the surface of the substrate. Specific examples of the end-bondable group are as described above.

Furthermore, the organic molecule preferably has the polar functional group or the photoresponsive functional group containing no active hydrogen between the conjugated-bondable group and the end-bondable group. Specific examples of the polar functional group and the photoresponsive functional group are as described above.

Preferred examples of the organic molecule include a compound expressed by chemical formula (5) or (6) below.

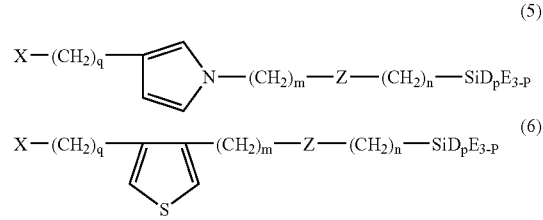

In the above formulae, X is hydrogen, an organic group containing an ester group, or an organic group containing an unsaturated group. q is an integer of 0 to 10, Z is an ester group (—COO—), an oxycarbonyl group (—OCO—), a carbonyl group (—CO—), or a carbonate group (—OCOO—), D is halogen, an isocyanate group, or an alkoxyl group having 1 to 3 carbon atoms, E is hydrogen or an alkyl group having 1 to 3 carbon atoms, m and n are integers satisfying $2 \leq (m+n) \leq 25$, preferably $10 \leq (m+n) \leq 20$, and p is an integer of 1 to 3.

When X is an organic group containing an ester group, examples thereof include a linear hydrocarbon group or a linear hydrocarbon group containing an unsaturated hydrocarbon group, and X has, for example, 1 to 10 carbon atoms, and preferably 1 to 6 carbon atoms. Specific examples of X include $CH_3COO$—, $C_2H_5$—COO—, and $C_3H_7$—COO—.

When X is an organic group containing an unsaturated group, examples thereof include a chain unsaturated hydrocarbon and a cyclic hydrocarbon such as an alicyclic hydrocarbon and an unsubstituted aromatic hydrocarbon. These may be substituted with a substituent or may not be substituted, and may be linear or branched. Examples of the unsaturated hydrocarbon include an alkenyl group such as $CH_2$=CH— and $CH_3$—CH=CH— and an alkynyl group, and the number of carbon atoms thereof is, for example, preferably in the range of 2 to 10, more preferably in the range of 2 to 7, and particularly preferably in the range of 2 to 3. Examples of the alicyclic hydrocarbon include a cycloalkenyl group. Moreover, examples of the aromatic hydrocarbon include an aryl group and an arylene group.

Specific examples of the chemical formula (5) include a compound (PEN: 6-pyrrolylhexyl-12,12,12-trichloro-12-siladodecanoate) expressed by chemical formula (9) below and a compound (8-pyrrolyloctyl-8,8,8-trichloro-8-silaoctanoate) expressed by chemical formula (10) below.

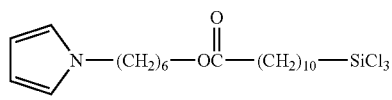

(9)

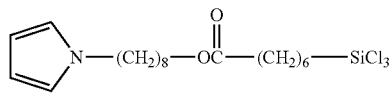

(10)

Furthermore, specific examples of the chemical formula (6) include a compound (TEN: 6-(3-thienyl)hexyl-12,12,12-trichloro-12-siladodecanoate) expressed by chemical formula (11) below and a compound (8-(3-thienyl)octyl-8,8,8-trichloro-8-silaoctanoate) expressed by chemical formula (12) below.

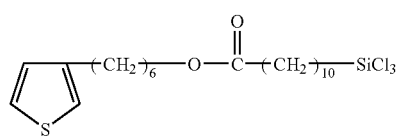

(11)

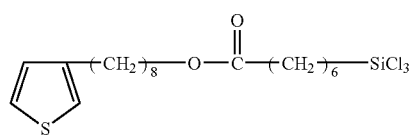

(12)

When the organic molecules shown in the formula (5) or (6) are polymerized, a conductive organic thin film constituted by units shown in chemical formula (1) or (2) below, respectively, is formed. In the formulae (1) and (2), X, Z, E, q, m, n and p are the same as those in the formulae (5) and (6).

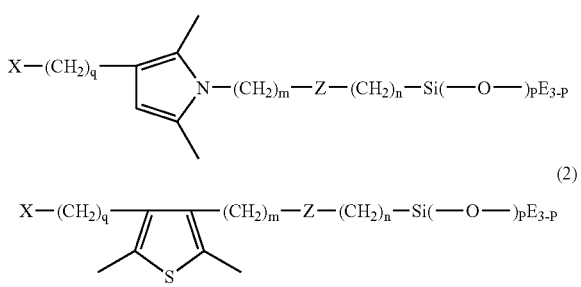

(1)

(2)

In addition to these, examples of the organic molecule include an organic molecule having the polar functional group that can be expressed by the following chemical formulae. In both of the following formulae, X, D, E, p, m and n are the same as those in the formulae (5) and (6).

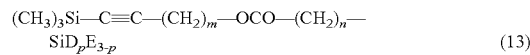

(13)

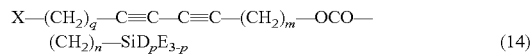

(14)

When the organic molecules shown in the formulae (13) and (14) are polymerized, conductive organic thin films constituted by units shown in formulae (15) and (16) below, respectively, are formed. In both of the following formulae, X, D, E, p, m and n are the same as those in the formulae (13) and (14).

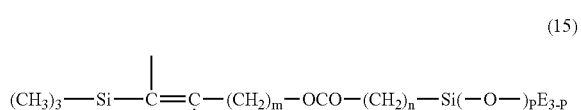

(15)

(16)

Moreover, it is also preferable that the organic molecule has a photoresponsive functional group containing no active hydrogen, and specific examples of such an organic molecule include substances as shown below. It should be noted that the organic molecule is not limited to these substances.

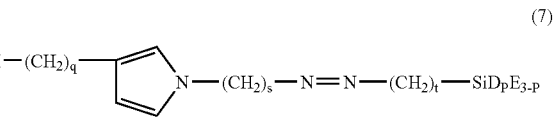

(7)

(8)

In the chemical formulae (7) and (8), X, D, E and p are the same as above, and each s and t is an integer of 1 to 20.

Specific examples of the chemical formulae (7) and (8) include compounds expressed by chemical formulae (17) and (18) below.

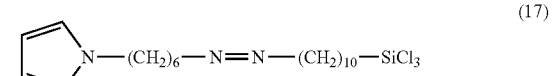

(17)

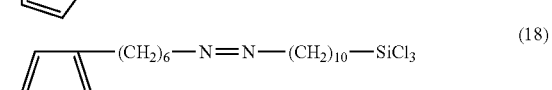

(18)

When the organic molecules shown in the formula (7) or (8) are polymerized, a conductive organic thin film constituted by units shown in chemical formula (3) or (4) below, respectively, is formed. In the chemical formulae (3) and (4), X, E, q, s and t are the same as those in the formulae (7) and (8).

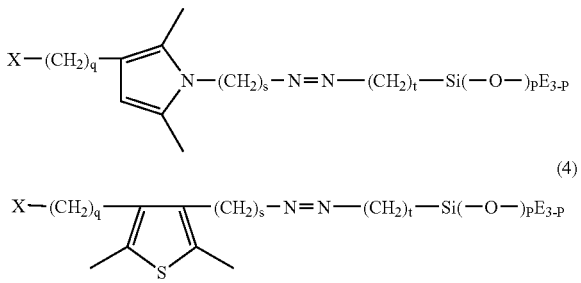
(3)

(4)

Furthermore, in addition to these, examples of the organic molecule include organic molecules expressed by chemical formulae (19) and (20) below. In the following formulae, X, D, E, p, s and t are the same as those in the formulae (15) and (16).

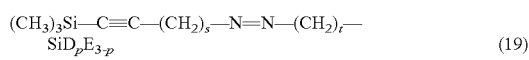
(19)

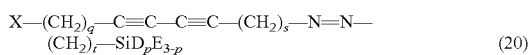
(20)

When the organic molecules shown in the formulae (19) and (20) are polymerized, conductive organic thin films constituted by units shown in formulae (21) and (22) below, respectively, are formed. In both of the following formulae, X, D, E, p, s and t are the same as those in the formulae (19) and (20).

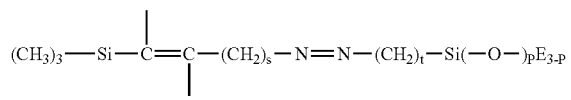
(21)

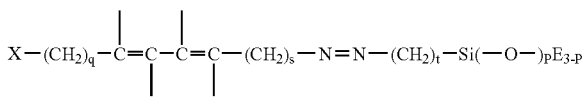
(22)

Moreover, examples of the organic molecule having neither polar functional group nor photoresponsive functional group as described above include, but are not limited to, substances as shown below.

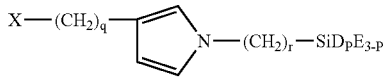
(23)

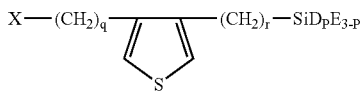
(24)

In the formulae (23) and (24), X, D, E, q and p are the same as those in the formulae (5) and (6), and r is an integer of 2 or more and 25 or less.

Next, preferred embodiments of the organic electronic device of the present invention will be described by way of examples.

FIRST EMBODIMENT

In this embodiment, a form in which a metal film is used as a coating film will be described. FIG. 1 is a schematic cross-sectional view showing an example of a two-terminal organic electronic device according to this embodiment.

As shown in FIG. 1, in this organic electronic device 1, an insulating film 3 is formed on a substrate 2, and a first electrode 4a and a second electrode 4b are formed on this insulating film 3 so as to be spaced from each other. Moreover, the first electrode 4a and the second electrode 4b are coated with a metal film for coating 6. Furthermore, on the substrate 2, a conductive organic thin film 8 is formed on the substrate 2 via an insulating film 5 so as to coat a region between the electrodes on the substrate 2. As shown in FIG. 1, the conductive organic thin film 8 is in contact with the electrodes 4a and 4b via the metal film for coating 6. Moreover, on a region of the substrate 2 where the electrodes 4a and 4b and the conductive organic thin film 8 are not formed, an insulative organic thin film 7 is formed via the insulating film 5.

FIG. 1 illustrates a side contact structure in which the side faces of the electrodes are in contact with the conductive organic thin film via the metal films for coating, but the present invention is not limited to such a structure, and for example, a top contact structure in which the top faces of the electrodes are in contact with the conductive organic thin film via the metal films for coating is also possible.

This organic electronic device can be manufactured, for example, in the following manner. FIGS. 2A through 2G are schematic cross-sectional views showing a manufacturing process of the organic electronic device.

First, as shown in FIG. 2A, a substrate 2 is prepared and an insulating film 3 is formed on one surface thereof. Examples of the insulating film 3 include inorganic oxides such as $SiO_2$, $Al_2O_3$, $Y_2O_3$, $ZrO_2$, $Ta_2O_5$, $La_2O_3$, $Nb_2O_3$, and $TiO_2$, and among these, $SiO_2$, $ZrO_2$, $Ta_2O_5$, and $La_2O_3$ are particularly preferable. Moreover, for example, a complex oxide such as barium zirconate titanate (BZT) and barium strontium titanate (BST) and an amorphous metal oxide can be used. Furthermore, for example, an organic oxide film such as polyvinyl phenol can be used.

There is no particular limitation regarding the method for forming the inorganic oxide, and for example, it may be formed by a conventionally known method such as thermal oxidation, CVD (chemical vapor deposition) and sputtering. Specifically, for example, it is possible that a Si substrate is used as the substrate and oxidized by heat treatment to form a $SiO_2$ film on the surface thereof. Moreover, also there is no particular limitation regarding the method for forming the organic oxide film, and for example, a method of mixing with an appropriate solvent such as an alcohol and applying this mixture to the surface of the substrate by, for example, spin coating can be employed.

When the insulating film 3 as above is formed, there is no limitation regarding the type of the substrate 2, and it may be an insulative substrate, a semiconductor substrate or a conductive substrate. Moreover, it may be a substrate having active hydrogen or a substrate deficient in active hydrogen. As the substrate, for example, an inorganic substrate such as silicon, glass, and quartz, and a plastic substrate such as polyethersulfone, polyethylene terephthalate, epoxy resin, and acrylic resin can be used.

When the substrate 2 is an insulative substrate such as a glass substrate and a quartz substrate as described above, it is also possible to use this substrate without forming the insulating film. With such an electrically insulative substrate, the leakage current is small and an organic electronic device having excellent operating stability can be provided. Furthermore, when a substrate having active hydrogen on its surface is used as the substrate 2, it is possible to use this substrate without forming an insulating film 8 described later. As such a substrate, for example, a glass substrate, a quartz substrate, and a silicon nitride substrate can be used. On the surfaces of these substrates, active hydrogen is present in the form of, for example, an —OH group, a —COOH group, a —NH$_2$ group, or a —NH group.

Moreover, when a plastic substrate as described above is used as the substrate 2, this substrate has flexibility, which advantageously broadens the applications of the organic electronic device. In this case, the thickness of the substrate can be, for example, from 0.1 mm to 0.3 mm.

Figure 2B:
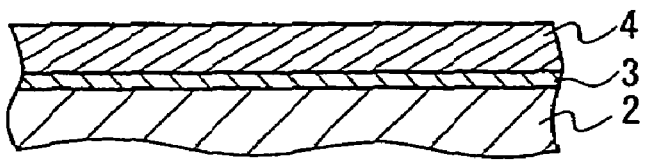
Figure 2C:
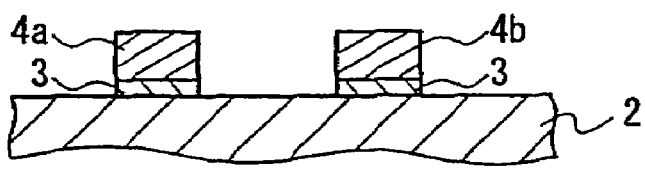

Next, a metal thin film 4 is formed on the surface of the insulating film 3 on the substrate 2 (FIG. 2(B)), and the metal thin film 4 is patterned to form a first electrode 4a and a second electrode 4b (FIG. 2(C)).

Examples of a metal that serves as an electrode material include Ni, Ti, Cr and W, and their alloys, and particularly Ni or Ni alloys are preferable. When a Ni thin film is formed as the metal thin film 4, examples of a material used include Ni, Ni—P alloys, and Ni—B alloys, and among these, Ni and Ni—B alloys are preferable, and Ni is more preferable.

As the method for forming the metal thin film 4, for example, conventionally known methods including evaporation methods such as vacuum evaporation, ion plating, CVD method, and sputtering are applicable. Moreover, patterning can be performed by usually known methods including, for example, etching of the metal thin film 4 using a photoresist, and a lift-off technique.

The thickness of the electrode is usually in the range of 100 to 1000 nm, preferably in the range of 300 to 800 nm, and more preferably in the range of 400 to 500 nm.

Figure 2D:
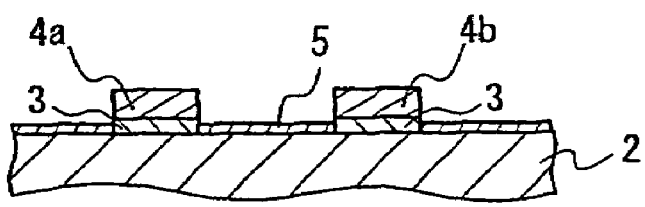

When etching is used as a patterning method at the time of forming the electrodes, in addition to the electrode material, the insulating film 3 present under the electrode material also may be etched. In such a case, the insulating film 5 is formed again on the substrate 2 as shown in FIG. 2(D). As the insulating film 5, one having active hydrogen on its surface preferably is used. As such an insulating film 5, oxides as described above can be used. On the surfaces of these oxides, active hydrogen is present in the form of, for example, an —OH group or a —COOH group.

The insulating film 5 can be formed, for example, in the same manner as described above, and for example, when the substrate is a Si substrate, a very thin natural oxide film (SiO$_2$) is formed on the surface of the substrate by washing, and this film can be used as the insulating film 5. For improving amplifying characteristics of the organic electronic device, for example, it is desirable to reduce the thickness of the insulating film, so that the natural oxide film as described above is particularly preferable because the thickness thereof is usually as small as 0.3 to 10 nm. When the substrate is an insulative substrate, the process can proceed to the next step without forming the insulating film.

Figure 2E:
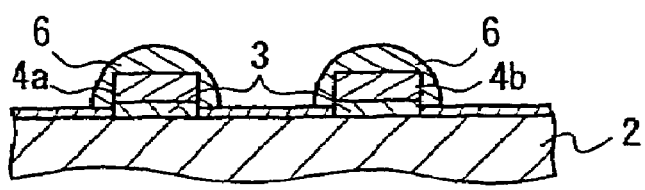

Then, as shown in FIG. 2E, the electrodes 4a and 4b are coated with a metal film for coating 6. Examples of the metal film for coating 6 include Au, Pt, and Ag.

There is no particular limitation regarding the method for coating with the metal film for coating 6, and examples thereof include known methods such as electroless gold plating using substitution or catalytic reduction, and electrolytic plating. Hereinafter, the coating method will be described, taking the case where the electrodes 4a and 4b are Ni layers and the metal film for coating is Au as an example.

It should be noted that also in the case where the metal film for coating is Pt, the same method can be employed.

(1) Substitution-Type Gold Plating

Substitution-type gold plating is a method of utilizing the difference in ionization tendency between metals. In this embodiment, Ni has a greater ionization tendency than Au. Therefore, when Ni layers (electrodes) that are the objects to be plated are immersed in a solution containing Au ions, Ni on the surfaces of the Ni layers are deprived of electrons (oxidized) by the Au ions in the solution and dissolved in the form of Ni ions, whereas the Au ions receive the electrons and are precipitated on the surfaces of the Ni layers, and thus gold plating is achieved.

Substitution-type gold plating can be performed, for example, by using a commercially available substitution gold plating bath, according to the usage method thereof. Usually, gold contained in the plating bath is potassium gold cyanide or the like and the solvent is pure water. Specifically, for example, commercially available plating baths having product names of Aurolectroless SMT-301 and Aurolectroless SMT-210 (manufactured by Meltex Inc.) can be used.

There is no particular limitation regarding the conditions for substitution-type gold plating, but it is preferable to grow the Au layers until the Ni layers on the substrate are completely coated. Specifically, for example, when substitution-type gold plating is performed at a reaction temperature of 80 to 90° C., plating with Au can be performed at a rate of 0.01 to 0.1 μm per minute in thickness.

As long as the Au layers completely coat the Ni layers as described above, there is no limitation regarding the thicknesses thereof, and for example, the thicknesses are in the range of 0.5 to 2 μm, preferably in the range of 0.7 to 1 μm. Moreover, when substitution-type gold plating is performed as above, the thicknesses of the Ni layers are preferably set in the range of 0.3 to 1 μm, more preferably in the range of 0.4 to 0.7 μm, and particularly preferably in the range of 0.5 to 0.6 μm because Ni is eluted.

(2) Electrolytic Plating

The electrolytic plating is a method of precipitating a metal from a metal salt solution on the surface of a cathode by an electrolytic reaction. In this embodiment, for example, Ni layers (electrodes) formed on the substrate, which are taken as cathodes, and a platinum electrode, which is taken as an anode, are immersed in an aqueous solution of a metal salt (e.g., potassium gold cyanide) of Au to cause an electrolytic reaction. Then, Au is precipitated on the surfaces of the Ni layers and thus gold plating is achieved.

Figure 2F:
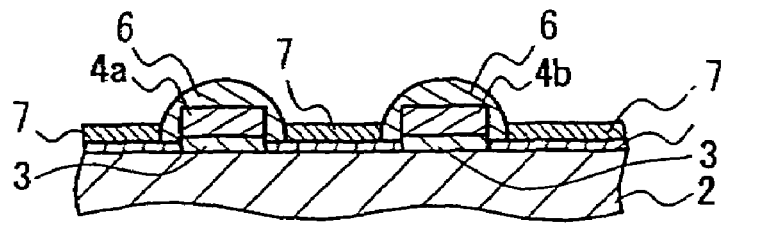

Next, as shown in FIG. 2F, an organic thin film 7 (hereinafter, referred to as "precursor thin film") that serves as a precursor of a conductive organic thin film is formed on the surface of the insulating film 5 on the substrate 2. This precursor thin film may be a monomolecular film or a monomolecular built-up film in which the monomolecular films are layered.

Figure 3:
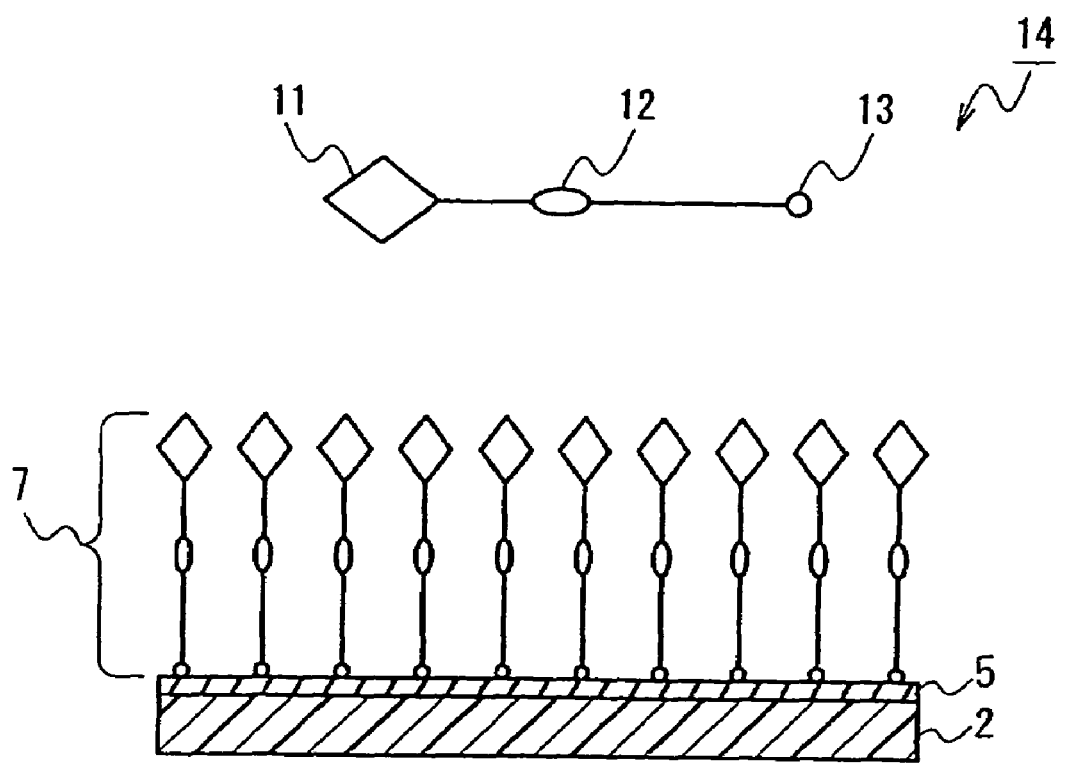
FIG. 3 is a schematic diagram showing a structure of a monomolecular film that is a precursor of a conductive organic thin film in the first embodiment.

FIG. 3 is a schematic diagram showing an example of the precursor thin film 7 constituted by a monomolecular film. In Example of FIG. 3, numeral 14 denotes an organic molecule constituting the precursor thin film and this organic molecule 14 has a conjugated-bondable group 11, a polar or a photoresponsive functional group 12, and an end-bondable group 13. As shown in the drawing, the end-bondable groups 13 are bonded to the surface of the insulating film 5 on the substrate 2, whereby the organic molecules 14 form the monomolecular film.

When the precursor thin film 7 is a monomolecular film, the film thickness is, for example, in the range of 1 to 2 nm.

Moreover, when the organic thin film 7 is a monomolecular built-up film, the film thickness is, for example, in the range of 1 to 50 nm, preferably in the range of 1 to 10 nm, and particularly preferably in the range of 1 to 6 nm. Furthermore, the number of the monomolecular films that are built up is, for example, in the range of 2 to 100, preferably in the range of 2 to 50, and particularly preferably in the range of 2 to 6.

This precursor thin film 7 can be formed by a common method such as chemisorption and the Langmuir-Blodgett (LB) technique as described below. It should be noted that the process is not limited to these methods.

(1) Chemisorption

Chemisorption is a method of bringing organic molecules that serve as a material of the precursor thin film into contact with the surface of the substrate and thus making the organic molecules chemisorbed to the surface of the substrate.

As the organic molecules that serve as material of the precursor thin film 7, one containing an end-bondable group in one end of a molecule and containing a conjugated-bondable group in any portion of the molecule is used, as described above. Specific examples of this organic molecule are as described above.

When the organic molecules are brought into contact with the surface of the substrate, a reaction occurs between active hydrogen on the surface of the substrate and the end-bondable groups in the organic molecules, and a chemical bond, preferably a conjugated bond, is formed. Thus, the organic molecules are fixed to the surface of the substrate to form the precursor thin film 9.

For example, when the end-bondable group is a silyl halide group, an alkoxysilyl group, or an isocyanate silyl group, these groups bring about an elimination reaction such as a dehydrohalogenation reaction, a dealcoholization reaction, or a reaction for removing isocyanate groups with active hydrogen on the surface of the substrate, and thus a covalent bond is formed. For example, when active hydrogen is present in the form of an —OH group, a siloxane (—SiO—) bond is formed as the covalent bond, whereas when active hydrogen is present in the form of a —NH group, a —SiN— bond is formed as the covalent bond.

In chemisorption, as the method for bringing the organic molecules into contact with the surface of the substrate, a method of adding the organic molecules to a solvent to prepare a chemisorption solution and bringing this solution into contact with the surface of the substrate generally is employed. As the organic solvent, for example, a nonaqueous organic solvent such as chloroform, xylene, toluene, and dimethyl siloxane can be used. Moreover, the concentration of the organic molecules in the chemisorption solution is, for example, but not limited to, 0.01 to 1 mol/L, and preferably 0.05 to 0.1 mol/L.

Moreover, the time for bringing the chemisorption solution into contact is, for example, but not limited to, 1 to 10 hours, and preferably 1 to 3 hours. Furthermore, the temperature of the chemisorption solution at this time is, for example, 10 to 80° C., and preferably 20 to 30° C. Also there is no particular limitation regarding other reaction conditions for this chemisorption, but for example, the reaction is preferably performed under a nitrogen atmosphere and the relative humidity is preferably in the range of 0 to 30%.

As the method for bringing the chemisorption solution into contact with the surface of the substrate, for example, a method of immersing the substrate in the chemisorption solution and a method of applying the chemisorption solution to the surface of the substrate can be employed.

When forming the monomolecular built-up film, after a first monomolecular film is formed, the surface of the monomolecular film is further subjected to a hydrophilization treatment, and then another monomolecular film can be formed by chemisorption as described above. The monomolecular built-up film with a desired number of monomolecular films can be formed by repeating such hydrophilization treatment and chemisorption.

There is no limitation regarding the method for hydrophilization treatment, and for example, when an unsaturated group such as a vinyl group is present on the surface of the monomolecular film, a method of irradiating the surface of a monolayer with energy rays such as electron beams or X-rays in an atmosphere containing moisture can be employed. With this method, an —OH group can be introduced into the surface of the monomolecular film. Alternatively, a method of immersing the surface of the monomolecular film in an aqueous solution of potassium permanganate also can be used. In this case, a —COOH group can be introduced into the surface of the monomolecular film.

Moreover, when forming the monomolecular built-up film, the second and the following monomolecular films can be formed by Langmuir-Blodgett (LB) technique and the like. In this case, hydrophilization treatment of the surface of the underlying monomolecular film is not necessarily required. However, it is preferable to perform a hydrophilization treatment because the underlying monomolecular film and the monomolecular film above can be chemically bonded and thus the monomolecular built-up film having excellent durability can be formed.

When forming the monomolecular built-up film, all of the layers may be constituted by the same organic molecules or each of the layers may be constituted by different types of organic molecules. Moreover, there is no particular limitation regarding the structure of the monomolecular built-up film and it may be any of X-type, Y-type, and Z-type structures.

(2) LB Technique

The organic molecules as described above that are dissolved in an organic solvent are added to an aqueous solvent, and on this water surface, the organic molecules are spread. At this point, the organic molecules extend over the water surface with their hydrophilic group side in the water and hydrophobic group side on the air side to form a monomolecular film. Then, after evaporating the organic solvent, the monomolecular film can be compressed by applying a constant surface pressure with a barrier and can be transferred onto the insulating film 5 on the substrate 2. When the precursor thin film is a monomolecular built-up film, monomolecules can be built up by moving the substrate 2 up and down with respect to the liquid surface while applying a constant surface pressure to the monomolecules on the water surface. When moving the substrate up and down, if the monomolecular films are built up only at the time of moving down, an X-type film can be produced, if they are built up only at the time of moving up, a Z-type film can be produced, and if they are built up at every stage of moving up and down, a Y-type film can be produced. The conditions for this LB technique are not limited to particular conditions and can be set by a conventionally known method.

After forming the precursor thin film, it is preferable to wash the surface of the substrate. By carrying out this washing process, unadsorbed organic molecules can be removed from the surface of the substrate, and a coating film whose surface is free from dirt can be provided. As an organic solvent for washing the substrate, for example, chloroform, acetone, methanol, and ethanol can be used.

Figure 2G:
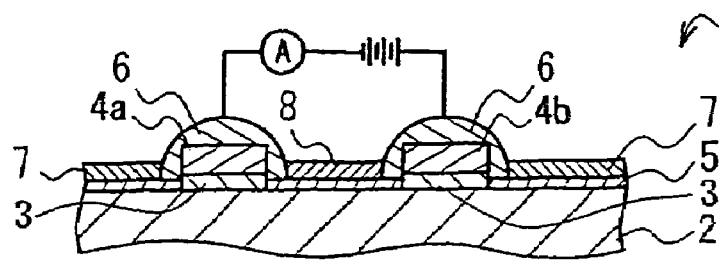

Then, a conductive organic thin film 8 is formed by polymerizing the organic molecules constituting the precursor thin film 7 (FIG. 2G). With this conductive organic thin film 8, the first electrode 4a and the second electrode 4b are electrically connected.

In this process, "polymerization" refers to a reaction in which the conjugated-bondable groups are bonded to form a conjugated bond chain. For example, when the organic molecules constituting the coating film already have been polymerized at sites other than the conjugated-bondable groups, the conjugated-bondable groups within the molecules (polymers) are bonded and crosslinked, and the polymerization in this process includes such crosslinking.

Figure 4:
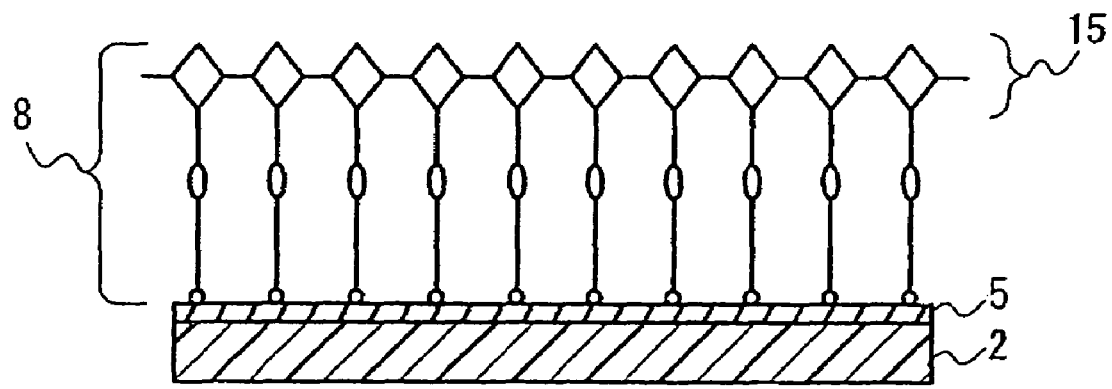
FIG. 4 is a schematic diagram showing a structure of the conductive organic thin film in the first embodiment.

FIG. 4 is a schematic diagram showing an example of a structure of the thin film after polymerization (i.e., the conductive organic thin film 8). This drawing shows the conductive organic thin film 8 obtained by polymerizing the precursor thin film 7 shown in FIG. 3. As shown in the drawing, the conjugated-bondable groups 11 in the organic molecules are bonded by polymerization to form a conjugated bond chain 15. Then, by the formation of this conjugated bond chain 15, a conductive network is formed and thus the thin film is provided with conductivity.

This polymerization process can be carried out by electrolytic polymerization. Specifically, the process can be carried out by applying a voltage between the first electrode 4a and the second electrode 4b, as shown in FIG. 2G. In this case, polymerization of the organic molecules is achieved by electrochemical oxidation or reduction of the conjugated-bondable groups therein, so that the process proceeds only in a region between the first electrode 4a and the second electrode 4b where an electric field is applied. Therefore, with this electrolytic polymerization, the conductive network can be formed between the first electrode 4a and the second electrode 4b in a self-alignment manner. On the other hand, in a region other than the region between the two electrodes, the precursor thin film 7 is not polymerized, so that it remains while maintaining the insulating property.

When performing electrolytic polymerization in this manner, usually, generation of hydrogen or oxygen disadvantageously causes corrosion of the metal electrodes, but the electrodes in the organic electronic device of the present invention can be prevented from being corroded during polymerization because they are coated with the Au layers as described above.

The magnitude of the voltage applied between the electrodes can be set in accordance with the oxidation-reduction potential of the organic molecules constituting the precursor thin film 7. The applied voltage is set in such a manner that the strength of the electric field generated between the two electrodes becomes, for example, in the range of 5 to 500 v/cm, preferably 100 to 300 v/cm, and particularly preferably in the range of 100 to 150 v/cm. The strength of the electric field that is outside these ranges can be used by, for example, adjusting the application time and the like.

As the voltage applied between the electrodes, both direct voltage and alternating voltage can be used. Moreover, the voltage applied between the electrodes also can be a pulse wave. Usually, electrolytic oxidation polymerization generates hydrogen, and when hydrogen is generated locally, the generated hydrogen becomes a bubble and may peel off the electrodes. It is preferable to use alternating voltage as the voltage because it can suppress such local generation of hydrogen. When using direct voltage, it is preferable to apply this in the form of pulse waves. Voltage conditions for preventing such local generation of hydrogen can be determined as appropriate in accordance with, for example, the strength of the electric field and the size of the precursor thin film to be subjected to electrolytic polymerization.

There is no particular limitation regarding the polymerization time and it is set to a time required to form the conductive network between the electrodes. In this electrolytic polymerization process, the coating film is polymerized with the electric field applied between the electrodes, and therefore whether or not formation of the conductive network is finished can be determined easily by observing whether or not current flows between the electrodes. That is to say, when the conductive network has been completed, a phenomenon in which current flows rapidly into the coating film between the electrodes can be observed. The voltage application time is, for example, in the range of 100 to 5000 minutes, preferably 100 to 600 minutes, and particularly preferably 500 to 600 minutes.

There is no particular limitation regarding the other electrolysis conditions. For example, the electrolysis temperature can be set to from 20 to 30° C., and preferably at about room temperature (25° C.).

When performing electrolytic polymerization as above, the conjugated-bondable group in the organic molecule is preferably, for example, a pyrrolyl group or a thienylene group.

When the conductive organic thin film 8 is a monomolecular built-up film, formation and polymerization of each monomolecular film constituting the monomolecular built-up film may be performed alternately or formation of the monomolecular built-up film by layering monomolecules may be followed by polymerization of the entire monomolecular built-up film.

Furthermore, a dopant may be added to the conductive organic thin film. If a charge-transfer dopant is doped, conductivity can be improved in a simple manner. As the dopant, for example, an acceptor dopant (electron acceptor) such as iodine and a BF— ion, and a donor dopant (electron donor) such as alkali metals including Li, Na, and K and alkaline earth metals including Ca can be used. Moreover, for example, a trace amount of components that are contained in the organic solvent for dissolving the organic molecules and the like or substances that are unavoidably mixed from a glass container used during formation of the precursor thin film 7 may be contained as a dopant substance.

Then, polymerization is finished as described above, and thus the organic electronic device 1 of the present invention is completed.

It should be noted that the order of the polymerization process of the precursor thin film 7 is not limited to the above-described process sequence. For example, it is also possible that the organic electronic device is produced in the same manner as described above except that the precursor thin film 7 is not polymerized, and then the precursor thin film 7 is polymerized by applying a voltage at the time of use and changed into the conductive organic thin film 8, whereby the organic electronic device is completed and used as it is.

Regarding operations of this organic electronic device 1, for example, the following is an explanation of an example when the organic molecules constituting the conductive organic thin film have a photoresponsive functional group. When the photoresponsive functional group exhibits photoisomerization, for example, the conductivity of the conductive organic thin film can be changed by irradiating the conductive organic thin film with two types of light having different wavelengths. That is to say, the functional group with photoresponsivity usually has specific absorption characteristics and is isomerized in accordance with the light. For this reason, upon irradiation with a first light of the two types of light having different wavelengths, a shift to a specific conductivity is made by isomerization in accordance with this light, and upon further irradiation with a second light that is the other one, isomerization occurs again in accordance with this light to provide a different specific conductivity. Therefore, the conductivity can be changed by irradiation with the two types of light, and thus current that flows through the conductive organic thin film can be switched. Moreover, the progress of isomerization depends on the quantity of irradiation light, and therefore the conductivity is variably controlled by adjusting the intensity of the irradiation light, the irradiation time, and the like, and also the range of change in the conductivity can be adjusted. Switching also can be performed by irradiation or non-irradiation with light.

As described above, the photoresponsive functional group has absorption characteristics specific to each region in the absorption spectrum, so that when it is irradiated with a wavelength for which absorptance is excellent, the conductivity can be changed efficiently at a high speed. As the irradiation light, for example, ultraviolet light and visible light are applicable, and when the photoresponsive functional group is an azo group, for example, the conductivity can be changed by a shift to a cis-form by irradiation with visible light or a shift to a trans-form by irradiation with ultraviolet light. The wavelength of the visible light is preferably 400 to 700 nm, and the wavelength of the ultraviolet light is preferably 200 to 400 nm and specific examples thereof are wavelengths of 254 nm and 361 nm.

Figure 5A:
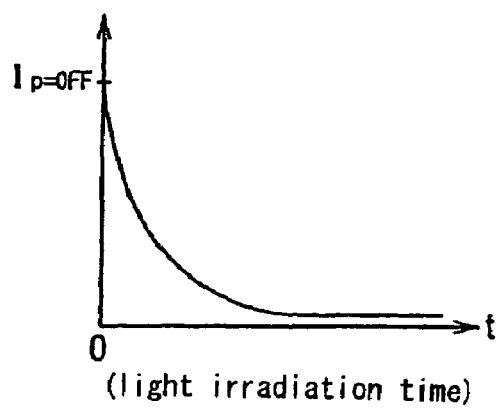
FIGS. 5A and 5B are schematic diagrams showing change in the conductivity of the organic electronic device in the first embodiment.

Specifically, regarding this organic electronic device, change in the conductivity of the conductive organic thin film by light irradiation will be described with reference to FIG. 5A, and the switching operation thereof will be described with reference to FIG. 5B. In a graph in FIG. 5A, the horizontal axis indicates light irradiation time and the vertical axis indicates current between the electrodes, and change in the conductivity with respect to the irradiation time in the case where the conductive organic thin film is irradiated with light of a constant intensity is shown qualitatively. The change in the current is taken when the voltage applied between the first and the second electrodes is constant.

As shown in the drawing, it can be seen that the current between the first and the second electrodes changes according to the light irradiation time and converges on a certain value with the increase in the light irradiation time. That is to say, this indicates the fact that the conductivity of the conductive organic thin film is controlled by irradiating the conductive organic thin film with light. In this manner, the conductive organic thin film is shifted between a stable state in which the conductivity at the time of no light irradiation is provided and a stable state in which the conductivity at the time of predetermined light irradiation is provided by changing the quantity of the irradiation light, and thus the conductivity of the conductive network can be switched. The current value may become 0 A (ampere) when the light irradiation is performed for a sufficient length of time, or on the contrary, the current value may increase with the light irradiation.

Figure 5B:
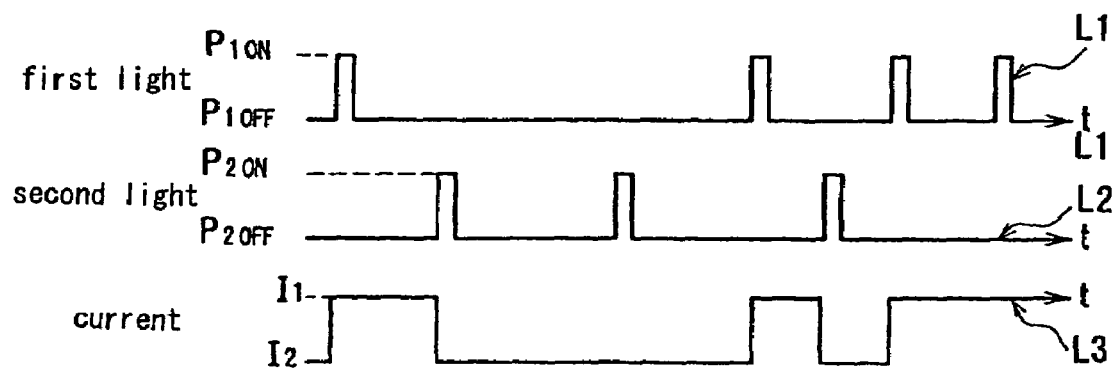

FIG. 5B is a conceptual diagram of the switching operation of the organic electronic device that is performed by irradiation with the first light ($P_1$) and with the second light ($P_2$) having different wavelengths in the case where the photoresponsive functional group is a photoisomerizable functional group. Lines L1 and L2 indicate the states during irradiation with the first light and with the second light, respectively, ($P_{1\ ON}$, $P_{2\ ON}$) and during shielding from these lights ($P_{1\ OFF}$, $P_{2\ OFF}$), and a line L3 shows current $I_1$ during irradiation with the first light and current $I_2$ during irradiation with the second light that are responses to the irradiation states. In these states, the voltage is applied between the first electrode and the second electrode.

As shown in FIG. 5B, the current is changed according to irradiation with the two types of light (L3), so that it can be seen that this operation is current switching using the first light and the second light as triggers and is the same operation as in a reset-set (R-S) flip-flop.

However, in FIG. 5B, only isomers caused by irradiation with the first light are contained in the stable state with the first conductivity, and only the other different isomers caused by irradiation with the second light are contained in the stable state with the second conductivity. That is to say, the stable states with the first conductivity and with the second conductivity are the two states that are totally isomerized. In this case, when irradiation with the first light is further performed in the first stable state, the conductivity remains unchanged, and the same is true also when irradiation with the second light is performed in the second stable state.

SECOND EMBODIMENT

In the above organic electronic device, a layered product containing a plurality of layers of metals or the like also can be used as the electrode. FIG. 6 is a cross-sectional view showing an example of such an organic electronic device, and the same members as in FIG. 1 bear the same numerals.

This organic electronic device 20 has the same structure as in the first embodiment except that electrodes 4a and 4b are layered products. Examples of the layered product constituting the electrodes 4a and 4b include a layered product containing a layer made of at least one metal selected from the group consisting of Ni, Ti, indium tin oxide (ITO), Cr, and W, and particularly a Ni layer is preferable. There is no particular limitation regarding the number of layers. FIG. 6 illustrates the case where the electrode 4a (4b) is a double-layered product consisting of a lower layer 21a (21b) and an upper layer 22a (22b) as an example, and for such a double-layered product, preferred examples of the lower layer 21a (21b)/upper layer 22a (22b) combination include Ti layer/Ni layer, ITO layer/Ni layer, Cr layer/Ni layer, and W layer/Ni layer, and Ti layer/Ni layer and Cr layer/Ni layer are particularly preferable.

The method for manufacturing the above-described organic electronic device is the same as in the first embodiment except that metal thin films that are layered products are formed on the insulating film 3 on the substrate 2 and these layered products are patterned, and the patterned layered products serve as the electrodes.

An example where a layered product of Ti layer/Ni layer is used for the electrodes will be described. First, Ti thin films are formed on an insulating film 3 on a substrate 2, on top of which Ni thin films further are formed. Then, these layered products are patterned, and the patterned layered products consisting of the Ti layers 21a and 21b and the Ni layers 22a and 22b, respectively, serve as the electrodes 4a and 4b. As the method for forming the Ti layer, for example, a method similar to the method for forming the Ni layer described above can be employed. In this case, examples of material used for forming the Ti layer include Ti, Ti—Al alloys, and Ti—Sn alloys, and Ti is preferable.

When the layered product of the Ti layer and the Ni layer is coated with an Au layer by substitution-type gold plating as described above, for example, the thickness of the Ti layer is preferably in the range of 10 to 2000 nm, more preferably in the range of 20 to 1000 nm, and particularly preferably in the range of 30 to 60 nm. The reason for this is that with such a thickness, not only the surface of the Ni layer but also the surface of the Ti layer that is the lower layer can be sufficiently coated because of the growth of the Au layer. Specifically, for example, with the Ti layer of 50 nm and the Ni layer of 500 nm, the Au layer of about 600 to 1000 nm can be formed by electroless gold plating. When an ITO layer is provided in place of the Ti layer, the production process can be performed in the same manner.

THIRD EMBODIMENT

In this embodiment, a form in which a conductive polymeric film is used as the coating film will be described. FIG. 7 is a cross-sectional view showing an example of such a two-terminal organic electronic device, and the same members as in FIG. 1 bear the same numerals.

In this organic electronic device 30, an insulating film 3 is formed on a substrate 2 and a first electrode 4a and a second electrode 4b are formed on this insulating film 3 so as to be spaced away from each other as in the first embodiment. In FIG. 7, a form in which the electrodes 4a and 4b are constituted by inner layers 31a and 31b and outer layers 32a and 32b with which the inner layers are coated, respectively, is shown as an example. The electrodes 4a and 4b are coated with polymeric films for coating 33. Furthermore, on the substrate 2, a conductive organic thin film 8 is formed on the substrate 2 via an insulating film 5 so as to coat a region between the electrodes on the substrate 2. This conductive organic thin film 8 is in contact with the electrodes 4a and 4b via the polymeric films for coating 33. In addition, on a region of the substrate 2 where the electrodes 4a and 4b and the conductive organic thin film 8 are not formed, an insulative organic thin film 7 is formed via the insulating film 5.

The organic electronic device can be manufactured, for example, in the following manner. FIGS. 8A through 8H are schematic cross-sectional views showing a manufacturing process of the organic electronic device.

Figure 8A:
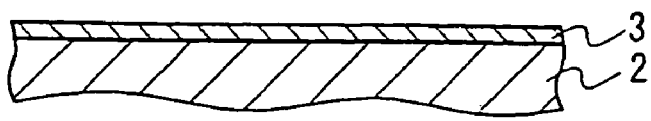
FIGS. 8A through 8H are views showing a process sequence of an example of a method for manufacturing the organic electronic device according to the third embodiment.
Figure 8B:
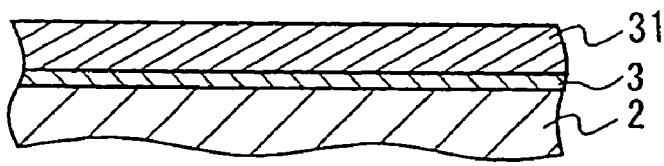
Figure 8C:
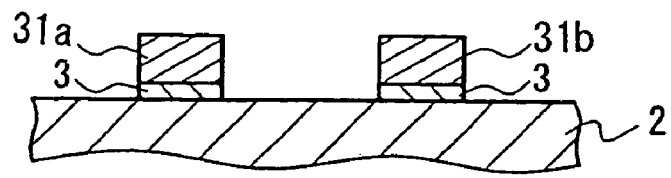

First, as in the first embodiment, the insulating film 3 is formed on the surface of the substrate 2 (FIG. 8A). Subsequently, the electrodes 4a and 4b are formed on the insulating film (FIGS. 8B through 8E). As the electrodes 4a and 4b, for example, but not limited to, metals such as Ti, Ni, Au, and Pt, and their alloys can be used. It is preferable that at least a surface portion of the electrode contains at least either of Au and Pt. In addition to the electrode formed of Au or Pt, examples of such an electrode include an electrode in which an inner electrode formed of Ti, Ni, or the like is coated with an outer electrode formed of Au, Pt, or the like.

The electrodes can be formed by forming a film with an electrode material on the surface of the substrate or the insulating film and patterning this film. As the film formation method, for example, evaporation and sputtering can be employed, and as the patterning method, for example, etching using a resist and lift-off technique can be employed. Moreover, as shown in the drawing, when forming the electrodes 4a and 4b respectively constituted by the inner layers 31a and 31b and the outer layers 32a and 32b with which the inner layers are coated, after forming a film with the electrode material 31 (FIG. 8B) and patterning this film to form the inner layers 31a and 31b (FIG. 8C) by the method described above, the outer layers 32a and 32b can be formed on the surfaces of the inner layers 31a and 31b by a plating method such as electroless plating or electrolytic plating. The plating method can be carried out in the same manner as in the process described in the first embodiment.

Figure 8D:
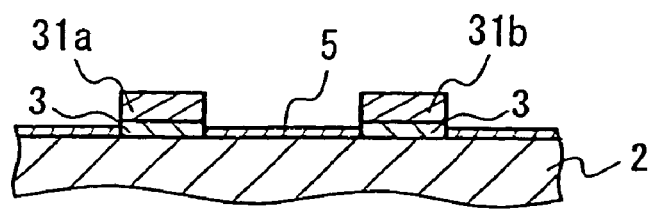

Furthermore, the insulating film 5 is formed, if necessary. This process is the same as in the first embodiment. Moreover, when forming the electrodes constituted by the inner layers and the outer layers as shown in the drawing, the insulating film 5 may be formed after formation of the inner layers 31a and 31b and before formation of the outer layers 32a and 32b (FIG. 8D).

Figure 8E:
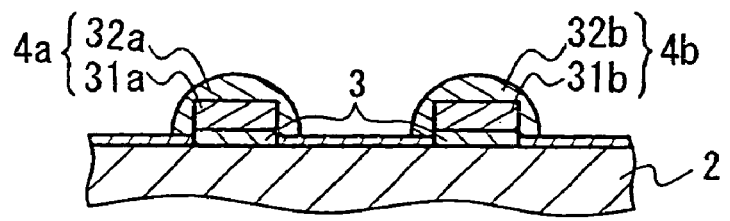
Figure 8F:
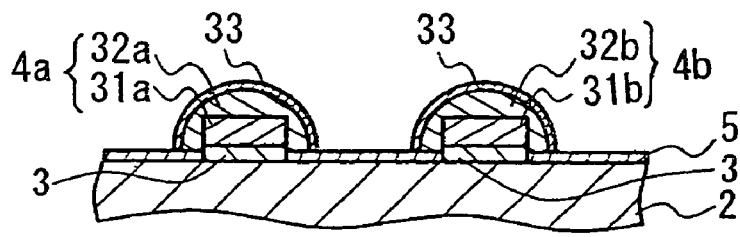
Figure 8G:
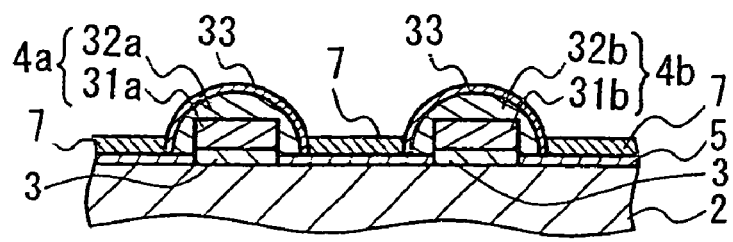
Figure 8H:
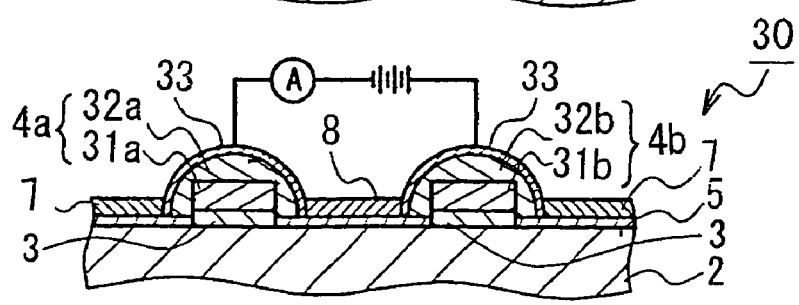

Next, as shown in FIG. 8F, the first electrode 4a and the second electrode 4b are coated with the polymeric films for coating 33.

As the polymeric film for coating 33, for example, polypyrrole-, polythiophene-, polyaniline-, polyacetylene-, polydiacetylene-, and polyacene-based polymeric films can be used, and among these, polypyrrole- and polythiophene-based films are preferable.

Examples of monomer molecules constituting the polymeric film for coating 33 include pyrrole, thiophene, aniline, acetylene, and diacetylene, and derivatives thereof Examples of the acetylene derivatives include methylacetylene, butylacetylene, cyanoacetylene, dicyanoacetylene, pyridylacetylene, and phenylacetylene.

The polymeric film for coating 33 can be formed, for example, by a conventionally known method such as electrolytic polymerization or photopolymerization in accordance with the type of the constituent molecules (monomer molecules). The following is a description of the case where electrolytic polymerization is employed.

For example, when forming a polypyrrole film as the polymeric film for coating 33, the substrate 2 on which the electrodes 4a and 4b are formed is immersed in a solvent containing pyrrole that is the constituent molecule, the electrodes 4a and 4b are immersed as anodes, and a platinum electrode is immersed as a cathode. Then, when a voltage is applied between the anodes and the cathode, pyrrole is polymerized by electrolytic polymerization to form polypyrrole films on the surfaces of the anodes, that is, on the surfaces of the first and the second electrodes 4a and 4b. When forming the polypyrrole films in this manner, pyrrole is polymerized on the anode side, so that if the electrodes that are the anodes consist only of Ni layers, Ti layers, or Al layers, Ni may be eluted by an electrolytic reaction. For this reason, as shown in FIG. 8E, it is preferable to coat the inner layers 31a and 31b with the outer layers 32a and 32b made of gold or platinum.

When using a pyrrole derivative, the process can be performed in the same manner. Moreover, when forming a polythiophene film by using thiol as the constituent molecule or when using a thiophene derivative, the process can be performed in the same manner as well.

As the solvent containing the constituent molecule, for example, water, acetonitrile, and ethanol can be used.

This electrolytic polymerization reaction can be performed by a conventionally known method, but under the conditions that, for example, the strength of the electric field is in the range of 2 to 3 v/cm. Moreover, the voltage application time is, for example, in the range of 1 to 10 minutes.

The thickness of the polymeric film for coating 33 is, for example, in the range of 1 to 2 nm, but not limited thereto.

Next, after forming a precursor 7 (i.e., precursor thin film) of the conductive organic thin film on the surface of the insulating film 5 on the substrate 2, the organic molecules constituting this precursor thin film 7 are polymerized to form the conductive organic thin film 8. This process is the same as in the first embodiment.

FOURTH EMBODIMENT

In this embodiment, a form in which a monomolecular film is used as the coating film will be described. Such an organic electronic device has the same structure as in the third embodiment except that the monomolecular film is formed as the coating film in place of the conductive polymeric film, and the manufacturing method thereof is also the same as in the third embodiment except for the method for forming the coating film.

In this embodiment, the monomolecular film for coating with which the surfaces of the electrodes are coated is a monomolecular film containing an organic molecule whose end on one side is chemically bonded to the surface of the electrode. Furthermore, it is preferable that the organic molecules constituting this monomolecular film are conjugated-bonded to the conductive organic thin film.

As the method for forming such a monomolecular film for coating, for example, chemisorption can be employed. The following is a description of the case where chemisorption is employed.

Chemisorption is a method of bringing organic molecules that serve as material of the monomolecular film for coating into contact with the surface of the electrode so that the organic molecules are adsorbed to the surface of the electrode. As the organic molecules that serve as material of the monomolecular film for coating, an organic molecule having a reactive group that can form a chemical bond with the surface of the substrate at one end is used.

Examples of such organic molecules include, as described above, a monomolecular film constituted by constituent molecules such as pyrrole derivatives, thiophene derivatives, aniline derivatives, acetylene derivatives, and diacetylene derivatives that are substituted with a substituent having a thiol group at an end, and among these, pyrrole derivatives and thiophene derivatives are preferable.

The substituent having a thiol group at an end is, for example, preferably substituted with nitrogen (N) in position 1 of a pyrrole ring in the case of the pyrrole derivatives, preferably substituted with carbon (C) in position 3 or 4 of a thiophene ring in the case of the thiophene derivatives, and preferably substituted with carbon in position 4 of a benzene ring in the case of the aniline derivatives.

Specifically, an example of the substituent having a thiol group in an end is a group expressed by formula (A) below that contains no active hydrogen.

—$R^1$—SH                                    (A)

In this formula, $R^1$ is, for example, but not limited to, a linear or branched saturated hydrocarbon that is or is not substituted, a linear or branched unsaturated hydrocarbon that is or is not substituted, or —$R^2$—Y—$R^3$—, where Y is preferably an ester group (—COO—), an oxycarbonyl group (—OCO—), a carbonyl group (—CO—), a carbonate (—OCOO—) group, or an azo group (—N=N—), and $R^2$ and $R^3$ are preferably linear or branched saturated hydrocarbons that are or are not substituted, or linear or branched unsaturated hydrocarbons that are or are not substituted, and $R^1$ has, for example, 1 to 30 carbon atoms, and preferably 10 to 25 carbon atoms. Specifically, for example, a substituent such as a mercaptoalkyl group or a mercaptofluoroalkyl group is preferable.

Specific examples of the derivatives include pyrrole derivatives such as 1-(mercaptodecyl)pyrrole and 1-(mercaptohexadecyl)pyrrole and thiophene derivatives such as 2-(mercaptodecyl)thiophene and 2-(mercaptohexadecyl)thiophene.

Regarding the combination of the conductive organic thin film and the monomolecular film for coating, for example, when the conductive organic thin film has a polypyrrole-based conjugated bond chain, for example, a monomolecular film formed of a pyrrole derivative is preferable, and when the conductive organic film has a polythiophene conjugated bond chain, a monomolecular film formed of a thiophene derivative is preferable.

When the organic molecules are brought into contact with the surface of the electrode, a reaction occurs between the surface of the electrode and the constituent molecules to form a chemical bond, preferably a covalent bond. For example, when the constituent molecule has a mercapto group (—SH), this group reacts with a metal constituting the electrode to form a —S— bond. This chemical bond allows the organic molecules to be fixed to the surface of the electrode, and thus the monomolecular film is formed.

Figure 9A:
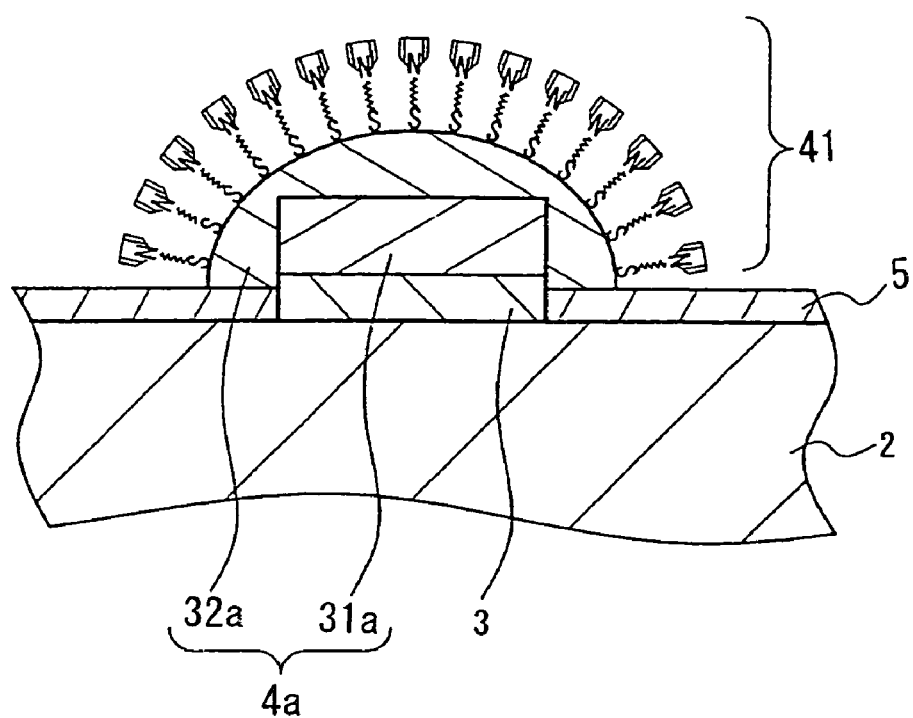
FIG. 9A is a schematic diagram showing a structure of a monomolecular film for coating in an organic electronic device according to a fourth embodiment of the present invention.

As a specific example, FIG. 9A shows a schematic cross-sectional diagram of a state in which the surface of the electrode is coated with a monomolecular film formed of a pyrrole derivative having a mercaptoalkyl group. As shown in the drawing, S is bonded to the surface of the electrode 4a, and thus a monomolecular film 41 of the pyrrole derivative is formed. In FIG. 9A, the same members as in FIG. 7 bear the same numerals.

Regarding the method for bringing the organic molecules into contact with the surface of the electrode, a method of preparing a chemsorption solution by adding the organic molecules to a solvent, and then bringing this solution into contact with the surface of the electrode generally is employed. As the solvent, for example, an alcohol such as ethanol and acetonitrile can be used. The concentration of the organic molecules in the chemisorption solution is, for example, but not limited to, 0.01 to 0.1 mol/L, and preferably 0.02 to 0.05 mol/L. The time for bringing the chemisorption solution into contact with the surface of the electrode is, for example, but not limited to, 10 minutes to 3 hours, and preferably 10 minutes to one hour. Moreover, the temperature of the chemisorption solution at this time is, for example, 10 to 35° C., and preferably 20 to 30° C.

Regarding the method for bringing the chemisorption solution into contact with the surface of the electrode, for example, a method of immersing a substrate provided with the electrodes in the chemisorption solution, and a method of applying the chemisorption solution to the surfaces of the electrodes can be employed.

After forming the monomolecular film for coating, it is preferable to wash the surface of the substrate. This washing process allows unadsorbed organic molecules to be removed from the surfaces of the substrate and the electrodes. As an organic solvent for washing the substrate, for example, chloroform, acetone, methanol, and ethanol can be used.

In this embodiment, the thickness of the monomolecular film for coating is, for example, in the range of 1 to 2 nm. As described above, the coating film is a monomolecular film and is very thin with a film thickness in nanometers, so that a tunneling effect occurs, and thus even if the coating film itself does not exhibit conductivity, current flow from the electrode is not prevented. Therefore, at the time of polymerization of the precursor thin film or use of the organic electronic device, current can be transmitted to the precursor thin film or the conductive organic thin film.

In the coating film, it is preferable to orient the constituent molecules. As the orientation method, for example, a method similar to an orientation treatment of the conductive organic thin film as will be described in a seventh embodiment can be employed, but is not limited thereto.

Moreover, in the monomolecular film for coating, the constituent molecules may be polymerized by conjugated bonding. Through polymerization, a conductive conjugated bond chain is formed in the same manner as in the conductive organic thin film, so that the coating film itself exhibits conductivity, and thus electrical connectivity can be improved even more.

Furthermore, this polymerization process also forms a conjugated bond between the conductive organic thin film and the coating film.

Figure 9B:
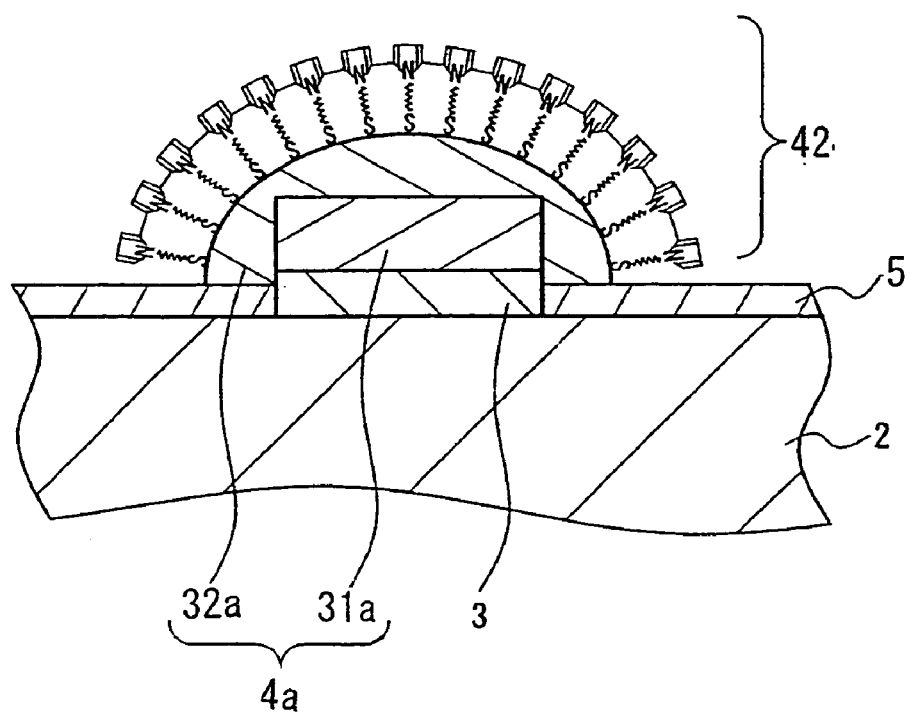
FIG. 9B is a schematic diagram showing the structure when the monomolecular film in FIG. 9A is polymerized.

As a specific example, FIG. 9B schematically shows a monomolecular film for coating 42 in which a monomolecular film 41 formed of a pyrrole derivative having a mercaptoalkyl group shown in FIG. 9A is polymerized. As shown in the drawing, the constituent molecules of the monomolecular film are conjugated-bonded to each other in positions 2 and 5 of the pyrrole rings, and thus the polymerized monomolecular film for coating 42 is formed. In FIG. 9B, the same members as in FIG. 7 bear the same numerals.

The polymerization method can be determined as appropriate in accordance with the type of the constituent molecules, and a method similar to the polymerization method of the precursor thin film as described in the first embodiment can be applied. Moreover, this polymerization process may be performed in advance, but in the case of the monomolecular film formed of a pyrrole derivative or a thiophene derivative, for example, the monomolecular film may be polymerized by application of a voltage at the time of use of the organic electronic device and then used as it is.

FIFTH EMBODIMENT

Figure 10:
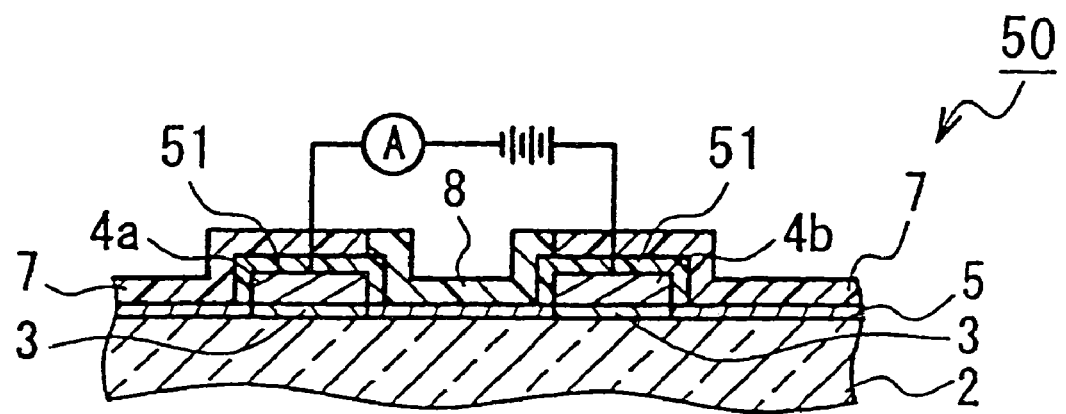
FIG. 10 is a cross-sectional view showing an example of an organic electronic device according to a fifth embodiment of the present invention.

In this embodiment, another form in which a monomolecular film is used as the coating film will be described. FIG. 10 shows an example of such a two-terminal organic electronic device. In FIG. 10, the same members as in FIG. 1 bear the same numerals.

This organic electronic device 50 has substantially the same structure as that in the above embodiments except that a monomolecular film is formed as the coating film, and the manufacturing method thereof is also substantially the same as that in the above embodiments except for the method for forming the coating film.

In this embodiment, monomolecular films for coating 51 for coating the surfaces of electrodes 4a and 4b are monomolecular films containing organic molecules that are chemically bonded to the surfaces of the electrodes 4a and 4b at one end and are chemically bonded to the conductive organic thin film 8 at the other end.

The chemical bonds between the monomolecular films for coating 51 and the surfaces of the electrodes 4a and 4b are preferably covalent bonds. An example of such a bond is a —S— bond. Moreover, the chemical bond between the monomolecular film for coating 51 and the conductive organic thin film 8 is preferably a covalent bond. Examples of such a bond include a —SiO— bond and a —SiN— bond. In this case, Si and N may be bonded to other bonding groups corresponding to respective valences. Examples of the form in which other bonding groups are bonded include a form in which end-bonding groups in organic molecules are bonded to each other and thus the organic molecules are polymerized.

FIG. 10 illustrates a top contact structure in which the top faces of the electrodes 4a and 4b are in contact with the conductive organic thin film 8, but the present invention is not limited to such a structure, and, for example, a side contact structure in which the side faces of the electrodes are in contact with the conductive organic thin film is also possible.

Such an organic electronic device 50 can be formed, for example, in the following manner. FIG. 11A through 11G are views showing a process sequence for illustrating an example of the method for manufacturing the above-described organic electronic device.

Figure 11A:
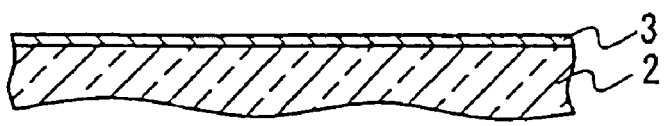
FIG. 11 is a process sequence of an example of a method for manufacturing of the organic electronic device according to the fifth embodiment.
Figure 11B:
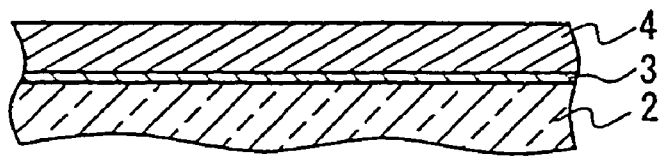
Figure 11C:
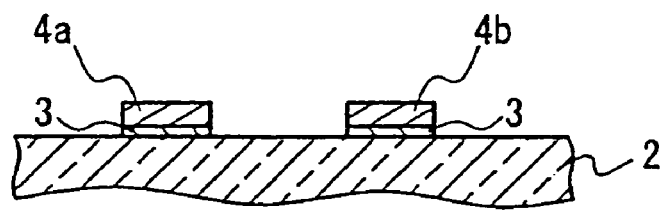
Figure 11D:
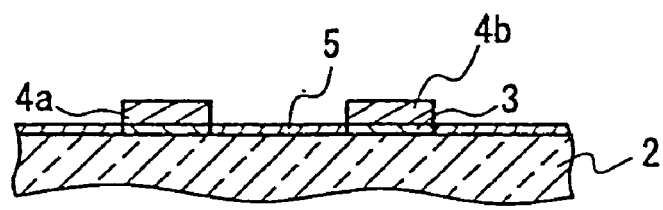

First, an insulating film 3 is formed on a substrate 2 (FIG. 11A) and a first electrode 4a and a second electrode 4b are formed on this insulating film 3 (FIGS. 11B and 11C). Furthermore, an insulating film 5 is formed, if necessary (FIG. 11D). This step can be performed in the same manner as in the third embodiment.

Figure 11E:
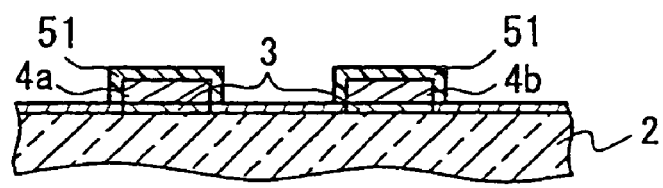

Subsequently, monomolecular films that are chemically bonded to the surfaces of the electrodes 4a and 4b and have active hydrogen on their surfaces are formed as monomolecular films for coating 51 (FIG. 11E).

Figure 12:
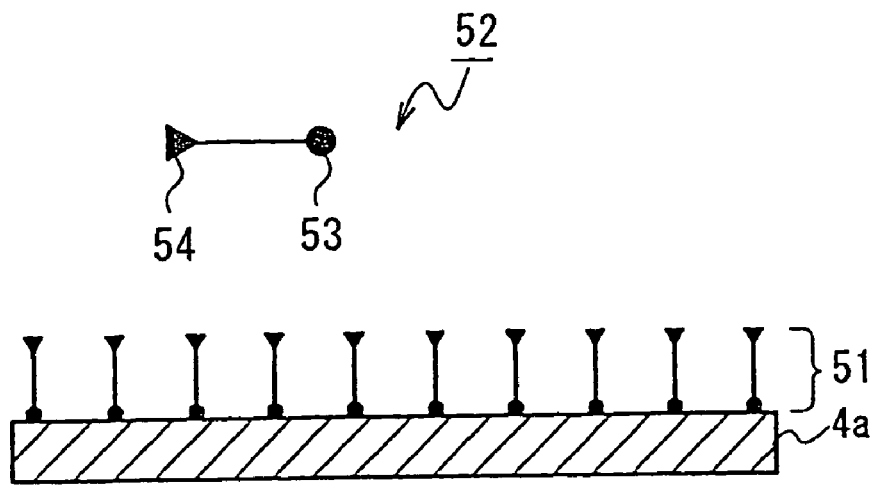
FIG. 12 is a schematic diagram showing a structure of a monomolecular film for coating in the fifth embodiment.

FIG. 12 is a diagram showing an example of the monomolecular film for coating 51. In an example of FIG. 12, numeral 52 denotes an organic molecule constituting the monomolecular film for coating 51, numeral 53 denotes a group that is chemically bonded to the surface of the electrode 4a, and numeral 54 denotes a group that contains active hydrogen. In the Example shown in FIG. 12, the groups 53 present at one end of the organic molecules 52 are bonded to the surface of the electrode 4a, and thus the monomolecular film is formed. Moreover, on the surface of the monomolecular film, the groups 54 that are present in the other end of the organic molecules 52 and contain active hydrogen are exposed.

Regarding the method for forming such a monomolecular film for coating 51, for example, chemisorption can be employed. Chemisorption can be carried out in the same manner as in the fourth embodiment except that the type of the organic molecules that serve as a material of the monomolecular films is different.

In this embodiment, as the organic molecules that serve as the material of the monomolecular film for coating 51, organic molecules having a reactive group that can form a chemical bond with the surface of the electrode at one end and a group that contains active hydrogen at the other end are used.

An example of such organic molecules is a compound that is expressed by chemical formula (25) below.

A—R—SH (25)

In the chemical formula, A is a group having active hydrogen. Examples of such a group include an —OH group, a —COOH group, a —NH$_2$ group, and a —NH group.

Moreover, in the chemical formula, R is a saturated or unsaturated hydrocarbon group. Examples of hydrocarbon groups include linear or branched chain hydrocarbon groups, alicyclic hydrocarbon groups, and aromatic hydrocarbon groups, and these groups may or may not be substituted. In particular, as a hydrocarbon group, chain hydrocarbon groups are preferable. Examples of chain hydrocarbon groups include an alkylene group, an alkenylene group, and an alkynylene group, and particularly a linear alkylene group is preferable. Moreover, R has, for example, 1 to 30 carbon atoms, and preferably 10 to 25 carbon atoms.

Furthermore, R may be a group that is expressed by $R^1$-Q-$R^2$. Each of $R^1$ and $R^2$ is a saturated or unsaturated hydrocarbon group. As in the case of R, examples of hydrocarbon groups include chain hydrocarbon groups, alicyclic hydrocarbon groups, and aromatic hydrocarbon groups that are or are not substituted, and in particular, chain hydrocarbon groups are preferable. Examples of chain hydrocarbon groups include an alkylene group, an alkenylene group, and an alkynylene group, and in particular, a linear alkylene group is preferable. $R^1$ and $R^2$ have, for example, 1 to 30 carbon atoms in total, and preferably 10 to 25 carbon atoms in total. Moreover, Q is an oxy group (—O—), a carboxyl group (—CO—), an ester group (—COO—), an oxycarbonyl group (—OCO—), or a carbonate group (—OCOO—).

Specific examples of the organic molecules include compounds expressed by the following formulae:

HO—$(CH_2)_a$—SH

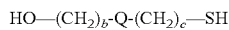

HO—$(CH_2)_b$-Q-$(CH_2)_c$—SH

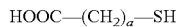

HOOC—$(CH_2)_a$—SH

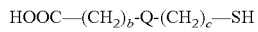

HOOC—$(CH_2)_b$-Q-$(CH_2)_c$—SH

Herein, a is an integer of, for example, 1 to 30, preferably 10 to 25. b and c are integers satisfying, for example, $1 \leq (b+c) \leq 30$, preferably $10 \leq (b+c) \leq 25$. Q is the same as described above.

Furthermore, in the coating film, it is preferable to orient the constituent molecules. As the orientation method, for example, a method similar to the orientation treatment of the conductive organic thin film as will be described in the seventh embodiment can be employed, but not limited thereto.

Then, when the organic molecules are brought into contact with the surfaces of the electrodes 4a and 4b, reactions occur between the reactive groups in the organic molecules and the surfaces of the electrodes to form chemical bonds, preferably covalent bonds. For example, when the end reactive group is a mercapto group, this group reacts with a metal constituting the electrodes to form a —S— bond. This chemical bond allows the organic molecules to be fixed to the surface of the electrode, and thus the monomolecular film is formed.

Figure 11F:
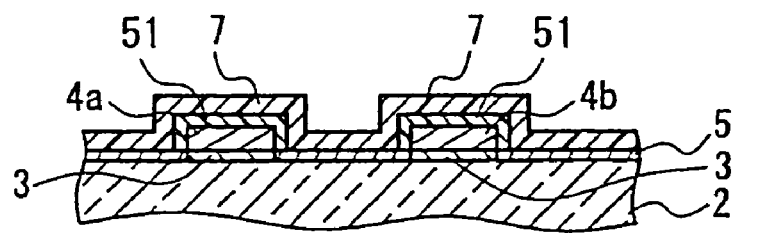

Next, after the substrate is washed, if necessary, an organic thin film 7 (i.e., precursor thin film) that serves as a precursor of the conductive organic thin film is formed on the surface of the insulating film 5 on the substrate 2 as well as on the surfaces of the monomolecular films for coating 51 on the electrodes 4a and 4b, as shown in FIG. 11F. This precursor thin film 7 may be a monomolecular film or a monomolecular built-up film.

Figure 13A:
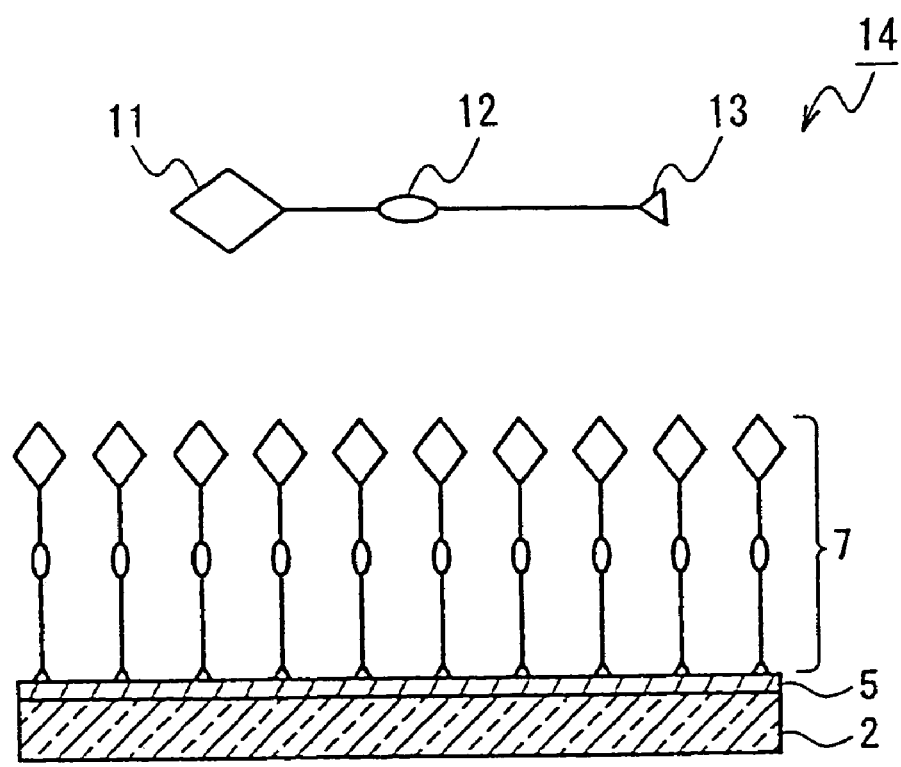
FIGS. 13A and 13B are schematic diagrams showing a structure of a precursor thin film in the fifth embodiment.
Figure 13B:
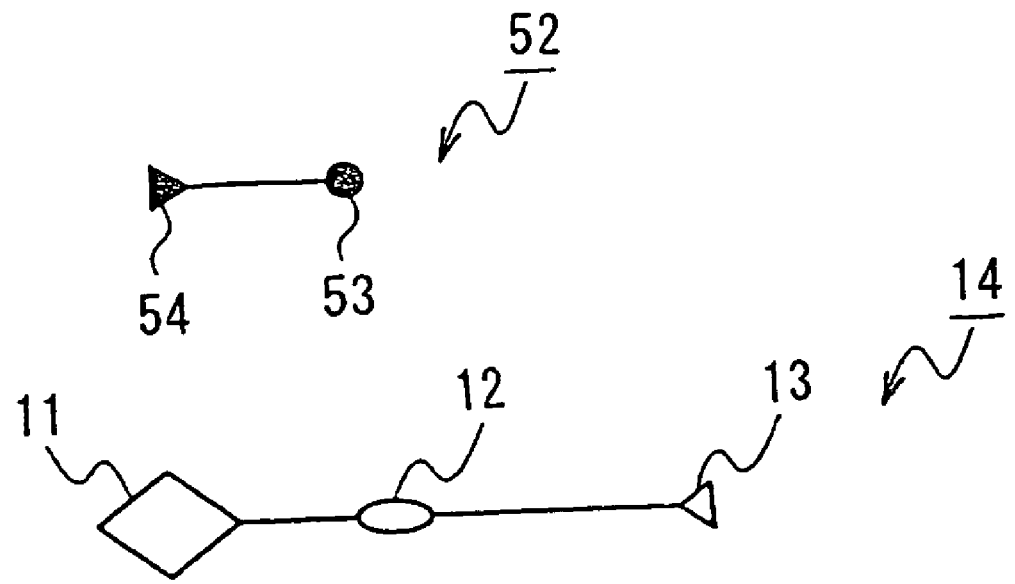
Figure 13B:
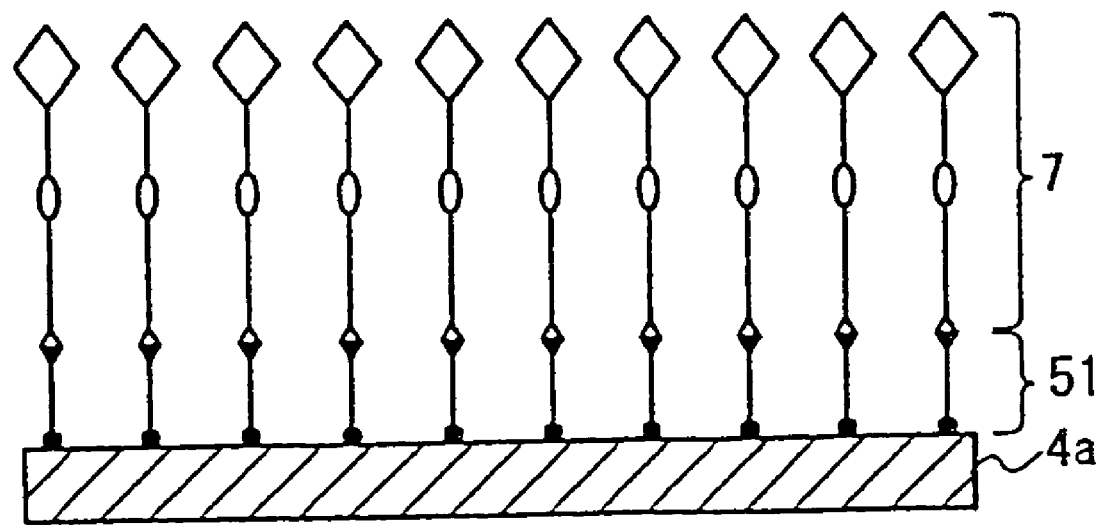

FIGS. 13A and 13B are schematic diagrams showing an example of the precursor thin film 7 constituted by a monomolecular film. FIG. 13A shows a portion formed on the insulating film 5, and FIG. 13B shows a portion formed on the surface of the monomolecular film for coating 51. In FIGS. 13A and 13B, numerals 11 through 14 are the same as in FIG. 3 and numerals 51 through 53 are the same as in FIG. 12.

As shown in FIG. 13A, in a region between the electrodes, end-bondable groups 13 in the organic molecules 14 are bonded to the surface of the insulating film 5 on the substrate 2. Moreover, as shown in FIG. 13B, on the electrodes 4a and 4b, the end-bondable groups 13 in the organic molecules 14 are bonded to the surfaces of the monomolecular films for coating 51. More specifically, the group 54 having active hydrogen and present at an end of the organic molecule 52 constituting the monomolecular film for coating 51 is bonded to the end-bondable group 13 in the organic molecule 14 constituting the precursor thin film 7. In this manner, the organic molecules 14 are fixed to the surface of the insulating film 5 and the surfaces of the monomolecular films for coating 51 by chemical bonds, and thus the monomolecular film is formed.

Figure 11G:
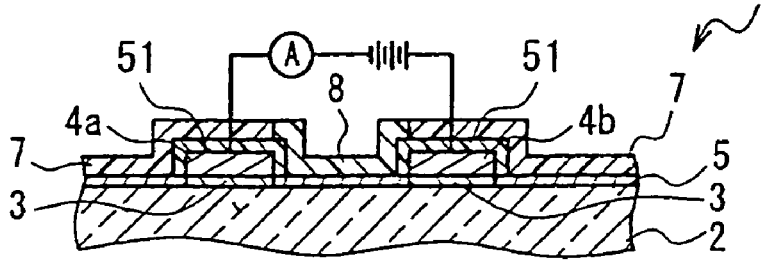

The method for forming the precursor thin film 7 is the same as in the first embodiment. Furthermore, a conductive organic thin film 8 is formed by polymerizing the organic molecules constituting the precursor thin film 7 (FIG. 11G). This polymerization process is also the same as in the first embodiment.

Figure 14A:
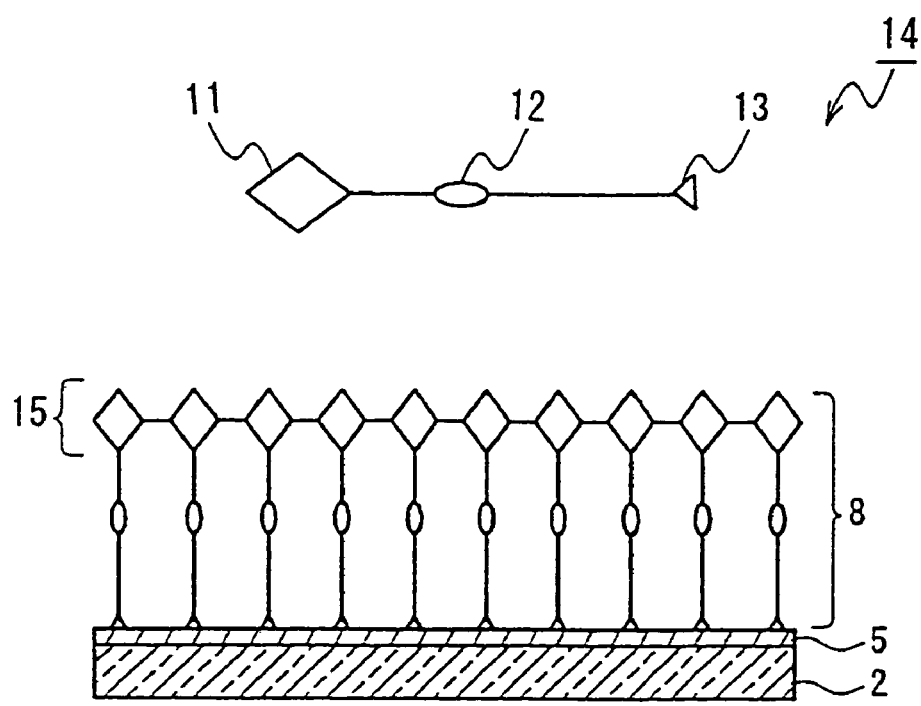
FIGS. 14A and 14B are schematic diagrams showing a structure of a conductive organic thin film in the fifth embodiment.
Figure 14B:
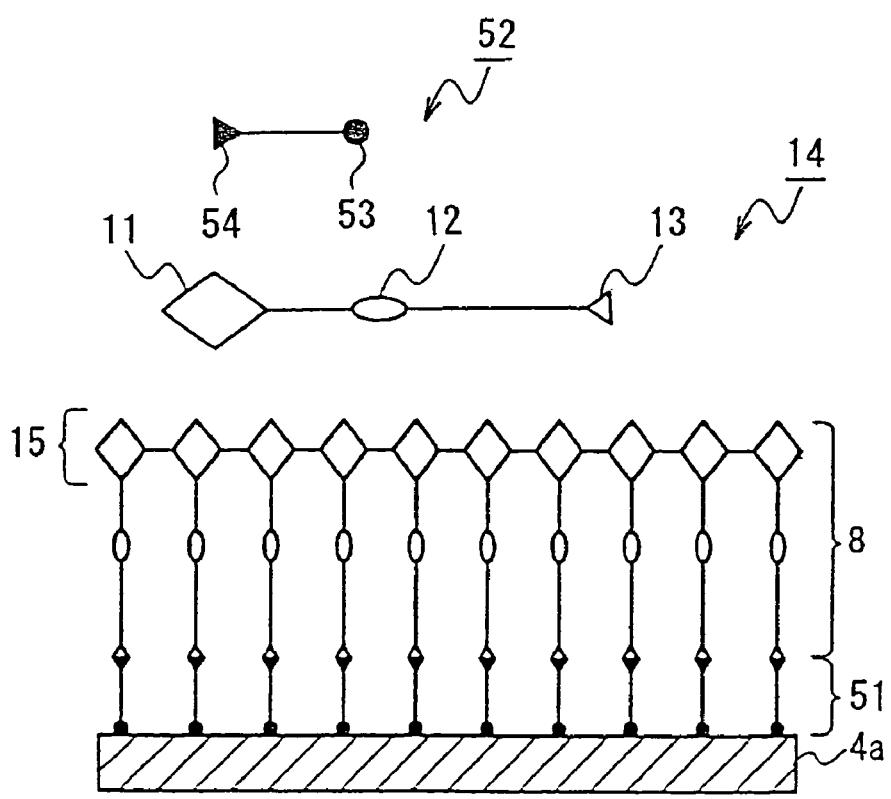

FIGS. 14A and 14B are diagrams showing an example of the structure of the thin film after polymerization (i.e., conductive organic thin film 8). FIGS. 14A and 14B show the conductive organic thin films 8 that can be obtained by polymerizing the precursor thin films 7 shown in FIGS. 13A and 13B, respectively. As shown in the drawings, in both regions on the substrate and on the electrode, the conjugated-bondable groups 11 in the organic molecules are bonded by polymerization to form conjugated bond chains 15. Then, the formation of this conjugated bond chain 15 forms a conductive network, and thus the thin film is provided with conductivity.

SIXTH EMBODIMENT

The method for forming the monomolecular film for coating having active hydrogen on its surface is not limited to the method as described above, and for example, a method of forming a precursor of the monomolecular film for coating on the surface of the electrode and then performing a treatment for providing active hydrogen on the surface of this precursor may be employed.

The precursor of the monomolecular film for coating is a monomolecular film that is chemically bonded to the surface of the electrode. As the organic molecules that serve as material of this precursor, organic molecules having a reactive group that can form a chemical bond with the surface of the electrode at one end and a group that can be provided with active hydrogen at the other end can be used. Examples of such organic molecules include a compound expressed by the chemical formula below.

B—R—SH

In the chemical formula, B is a group that can be provided with active hydrogen. The group that can be provided with active hydrogen refers to a group that can be changed into a group having active hydrogen as described above by performing an appropriate treatment after a film is formed by chemisorption.

Examples of such a group include a group containing an unsaturated hydrocarbon group and a group containing an ester group. The group containing an unsaturated hydrocarbon group can be changed into the group containing active hydrogen by performing an oxidation treatment after a film is formed. Examples of such a group containing an unsaturated hydrocarbon group include a group containing an alkenyl group, an alkyl group, or the like, and specifically include $H_2C$=CH—, $CH_3CH$=CH—, and $(CH_3)_3Si$—

C≡C—. Moreover, the group containing an ester group can be changed into the group containing active hydrogen by performing a hydrolysis treatment after a film is formed. Examples of such a group containing an ester group include CH₃COO—, C₂H₅COO—, and C₃H₇COO—.

In the above chemical formula, R is the same as in the chemical formula (25).

Specific examples of such an organic molecule include compounds expressed by the following chemical formulae:

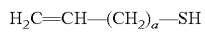

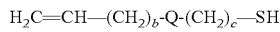

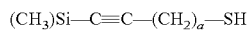

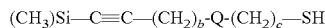

Herein, a is an integer of, for example, 1 to 30, and preferably 10 to 25. b and c are integers satisfying, for example, 1≦(b+c)≦30, and preferably 10≦(b+c)≦25. Moreover, Q is an oxy group (—O—), a carboxyl group (—CO—), an ester group (—COO—), an oxycarbonyl group (—OCO—), or a carbonate group (—OCOO—).

After the precursor of the monomolecular film for coating is formed on the surface of the electrode using the above-described organic molecules, a treatment for providing active hydrogen to the surface of this precursor is performed. As the film formation method of the precursor, for example, chemisorption can be employed. Specific film formation method is the same as the film formation method of the monomolecular film for coating in the fourth embodiment except that the type of the organic molecules to be used is different.

The treatment for providing active hydrogen on the surface of the precursor refers to a treatment for changing the group that can be provided with active hydrogen as described above into the group having active hydrogen. For example, when the group that can be provided with active hydrogen is an unsaturated hydrocarbon group, this group can be changed into the group having active hydrogen by performing a treatment for oxidizing the surface of the monomolecular film. As the oxidation method, for example, a method of irradiating the surface of the monomolecular film with energy rays can be employed. As the energy rays, for example, light rays such as infrared rays, ultraviolet rays, far ultraviolet rays, and visible rays, radiations such as X-rays, and particle beams such as electron beams can be applied. Moreover, this irradiation with the energy rays is preferably carried out in an atmosphere containing moisture. With this method, the unsaturated hydrocarbon group can be changed into, for example, a group containing an —OH group.

Furthermore, as another oxidation method, a method of bringing an oxidizing agent into contact with the surface of the monomolecular film can be employed. As an oxidizing agent, for example, potassium permanganate and hydrogen peroxide can be used. Moreover, as a method for contacting the oxidizing agent, a method of preparing an aqueous solution of the oxidizing agent and immersing the substrate provided with the monomolecular film in this aqueous solution can be applied. In this case, the unsaturated hydrocarbon group can be changed into, for example, a group containing a —COOH group.

Also in this embodiment, it is preferable to orient the constituent molecules of the coating film. As the orientation method, for example, a method similar to the orientation treatment of the conductive organic thin film as will be described in the seventh embodiment can be employed, but not limited thereto.

SEVENTH EMBODIMENT

In each of the above embodiments, before the polymerization process of the precursor thin film formed on the substrate via the insulating film, the organic molecules constituting the organic thin film may be oriented at a tilt. The reason for this is as follows. If the organic molecules are oriented, the conjugated-bondable groups can be aligned in a certain direction and also can be aligned in close proximity to each other. Consequently, polymerization of the organic molecules can proceed easily and the conductivity of the conductive organic thin film that is formed after the polymerization can be further improved.

Figure 15A:
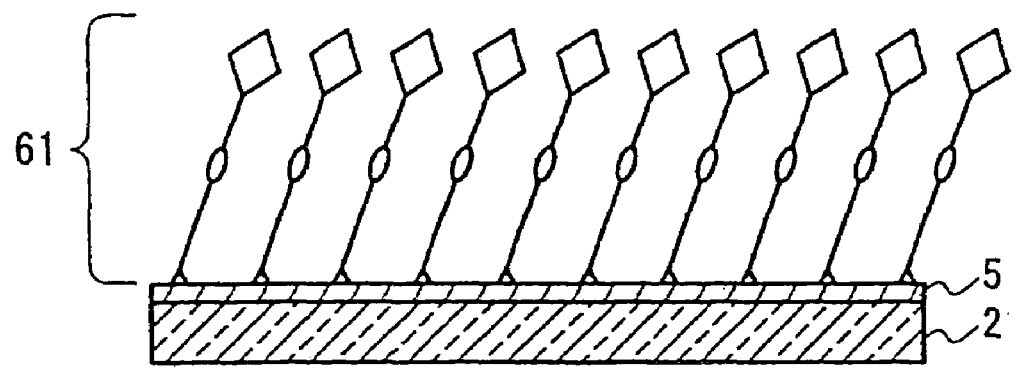
FIG. 15A is a schematic diagram showing a structure of an oriented monomolecular film that is a precursor thin film in a seventh embodiment of the present invention.
Figure 15B:
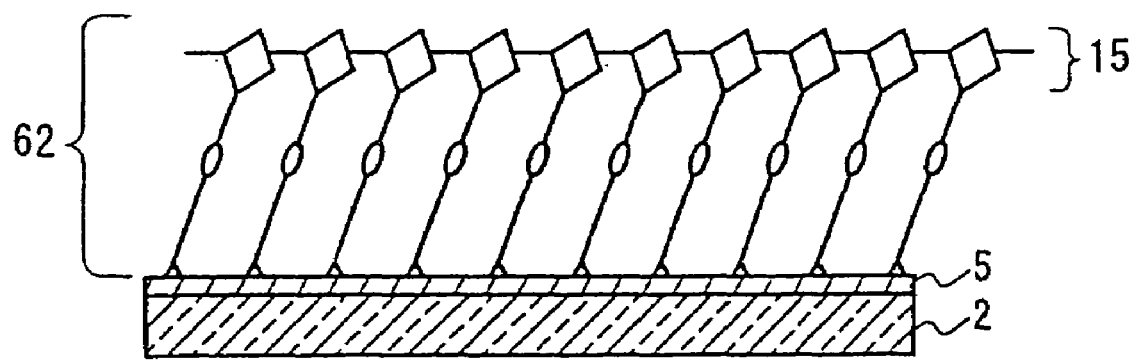
FIG. 15B is a schematic diagram showing a structure of a conductive organic thin film in which oriented monomolecules in FIG. 15A are polymerized.

FIG. 15A shows a schematic diagram of an example of an oriented monomolecular film 61 that is obtained by orienting the monomolecular film 7 shown in FIG. 3, and FIG. 15B shows a schematic diagram of a conductive organic thin film 62 that is obtained by polymerizing the oriented monomolecular film 61 in FIG. 15A. In these drawings, the same members as in FIGS. 3 and 4 bear the same numerals.

Examples of the method for orienting at a tilt include the following methods.

(i) Rubbing

The surface of the organic thin film on the substrate is subjected to rubbing using a rubbing apparatus, and thus the organic molecules constituting the organic thin film can be oriented in the rubbing direction. Moreover, when the surface of the substrate is subjected to rubbing using a rubbing apparatus as a pre-treatment process before the organic thin film formation process, the organic thin film that is formed on the substrate via the insulating film also can be oriented. In this case, the orientation direction of the organic thin film is the same as the rubbing direction. As a rubbing cloth that is used in rubbing process, for example, a cloth made of nylon or rayon is preferable because the orientation accuracy can be improved.

(ii) Polarization

Irradiation with polarized light using a polarizing plate allows the organic molecules constituting the organic thin film to be oriented in the polarization direction. In this case, the orientation direction of the organic molecules is generally the same as the polarization direction. With such an orientation method using irradiation with polarized light, damage of the organic thin film due to elimination of the organic molecule constituting the organic thin film from the surface of the insulating film, breakage of the organic molecule itself, and the like can be prevented or suppressed. As the polarized light, linearly polarized light with a wavelength in the visible region preferably is used.

(iii) Draining

When the organic thin film is formed by chemisorption, the substrate is washed for the purpose of removing an unadsorbed organic molecule, so that the organic thin film also can be oriented in this washing process. Specifically, for example, after the substrate is immersed in an organic solvent for washing and the unadsorbed organic molecule is removed, the substrate is pulled up while maintaining a predetermined tilt angle with respect to the liquid surface of the organic solvent for washing. Thus, the organic molecules constituting the organic thin film can be oriented in the direction in which the liquid flows, which is opposite to the direction of pulling up (hereinafter, referred to as "draining orientation").

The draining method is not limited to the method of pulling up the substrate from the liquid, and a method of blowing a gas such as dry air onto the surface of the substrate from a constant direction and scattering a nonaqueous solvent in the same direction to remove this solvent also can be employed. In this case, the direction in which the nonaqueous solvent is scattered corresponds to the draining direction and the organic molecules constituting the organic thin film can be oriented in this direction.

(iv) Orientation Using Fluctuation of Molecules during Polymerization Process in a Solution In addition to the above-described orientation methods, for example, orientation can be achieved using fluctuation of molecules during polymerization. Among the organic molecules in the present invention, for example, in those containing a polar functional group, a fluctuation tends to occur even at about room temperature (25° C.) because of the rotation of molecules when they are in a solution. Therefore, for example, it is also possible to utilize the fluctuation of the molecules in electrolytic polymerization process for orientation.

Each of the orientation methods as described above may be applied individually or a plurality of the orientation methods may be applied, and when different orientation methods are combined, it is preferable to adjust such that, for example, the rubbing direction, the polarizing direction, and the draining direction are identical with each other for the purpose of orienting molecules with a high accuracy.

The monomolecular film constituting the organic thin film may have partially different orientation directions and orientation angles, and when the organic thin film is a built-up monomolecular film, the orientation direction and the orientation angle may be identical or different between the monomolecular films, as long as the directions of the conductive networks (directions of connections between the first electrodes and the second electrodes) are identical between the monomolecular films.

Figure 16:
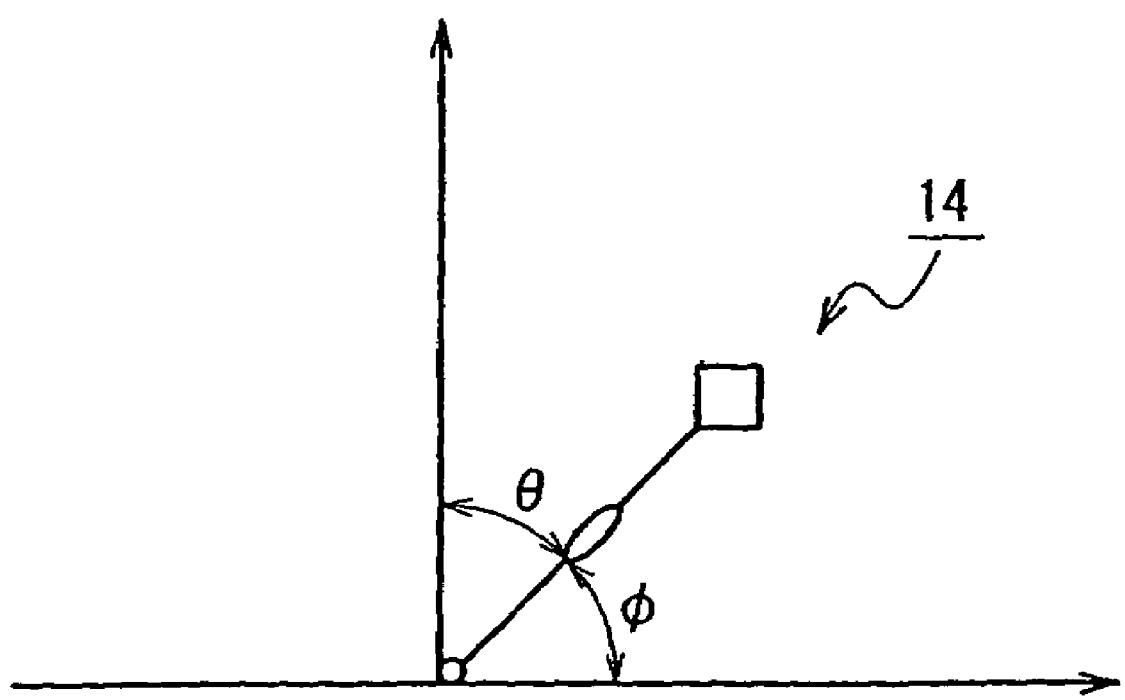
FIG. 16 is a schematic diagram showing an angle of tilt orientation of an organic molecule with respect to a substrate in the seventh embodiment.

The angle of tilt orientation $\phi$ of the monomolecular film is, for example, but not limited to, in the range of $0° \leq \phi < 90°$, preferably in the range of $5° \leq \phi \leq 85°$, and particularly preferably in the range of $50° \leq \phi \leq 85°$. As shown in FIG. 16, the angle of tilt orientation $\phi$ of the organic molecule 14 in the monomolecular film refers to the tilt angle of the organic molecule with respect to the plane of the substrate, whereas the angle of the organic molecule with respect to the direction perpendicular to the plane of the substrate is represented by $\theta$.

EIGHTH EMBODIMENT

The method for polymerizing the monomolecular film constituting the precursor thin film to form the conductive network is not limited to electrolytic polymerization as described above and may be, for example, catalytic polymerization or energy beam irradiation polymerization. Moreover, these polymerization methods can be combined, and it is preferable to perform electrolytic polymerization in the final stage of polymerization process. Specific examples thereof include a combination of performing at least catalytic polymerization or energy beam irradiation polymerization as prepolymerization and then, finally performing electrolytic polymerization. When prepolymerization is performed in this manner to achieve partial polymerization to a certain extent and then partially polymerized polymers are bonded by the final electrolytic polymerization, for example, the polymerization time can be reduced. Each of these polymerization methods can be performed, for example, in the following manner.

(i) Catalytic Polymerization

Catalytic polymerization is a conventionally known method and can be performed in an organic solvent containing a catalyst. The catalyst can be determined as appropriate in accordance with the type of the organic molecules to be used and for example, a Ziegler-Natta catalyst and a metal halide catalyst can be used. It is preferable that the metal halide catalyst contains, for example, Mo, W, Nb, or Ta as a metal, and specific examples thereof include $MoCl_5$, $WCl_6$, $NbCl_5$, $TaCl_5$, $Mo(Co)_5$, $W(CO)_6$, $Nb(CO)_5$, and $Ta(CO)_5$. As the organic solvent, for example, toluene, dioxane, and anisole can be utilized.

The conditions for catalytic reaction can be determined as appropriate in accordance with the type of the organic molecules to be used and the like, and for example, the temperature is set at room temperature and the pressure is set at 1 Pa.

Examples of the conjugated-bondable groups in the organic molecules that are polymerized by catalytic reaction include a pyrrolyl group, a thienylene group, an acetylene group, and a diacetylene group.

(ii) Energy Beam Irradiation Polymerization

As the energy beams, for example, light rays such as infrared rays, ultraviolet rays, far ultraviolet rays, and visible rays, radiation such as X-rays, and particle beams such as electron beams can be applied. Since the conjugated-bondable groups have different absorption properties depending on the type thereof, the type of the energy beams, and the irradiation conditions (amount of irradiation, irradiation time, etc.) may be determined as appropriate in accordance with, for example, the type of the conjugated-bondable groups in the organic molecules. Thus, the efficiency of polymerization reaction can be improved. Moreover, since a large number of types of conjugated-bondable groups have absorptivity for energy beams, this method can be applied even to the case where the monomolecular film is made of the organic molecules having a variety of types of conjugated-bondable groups.

Examples of the conjugated-bondable groups that are polymerized by energy irradiation include an acetylene group and a diacetylene group. Specifically, when the conjugated-bondable group is an acetylene group, irradiation with X-rays or an electron beam of 50-Mrad is preferable, whereas in the case of diacetylene, for example, irradiation with UV light (100 mJ/cm$^2$) is preferable.

When, for example, polarized ultraviolet rays, polarized far ultraviolet rays, polarized X-rays, and the like are used as the energy beams, the tilt orientation treatment and the conductive network formation (polymerization) can be performed at the same time. When irradiated with polarized energy beams in this manner, the organic molecules constituting the monomolecular film can be oriented at a tilt in a predetermined direction and also the organic molecules can be conjugated-bonded to each other, and therefore the manufacturing process can be simplified.

Alternatively, it is also possible that the organic molecules are polymerized by conjugated bonding and further conjugated-bonded by a crosslinking reaction after the polymerization to form the conductive network. Specifically, for example, in the case where the organic molecule has two or more conjugated-bondable groups, one conjugated-bondable group is polymerized with another organic molecule and subsequently further polymerization with still another organic molecule is performed using the other conjugated-bondable group, and thus a conductive network having a different structure from that after the polymerization can be formed. In this manner, when polymerization is followed by further polymerization, the conductivity can be improved even more.

Specifically, for example, when the organic molecule has a diacetylene group as the conjugated-bondable group, one acetylene group can be firstly polymerized by energy beam irradiation polymerization or catalytic polymerization and then, the other acetylene can be polymerized by further catalytic polymerization or energy beam polymerization.

NINTH EMBODIMENT

Figure 17:
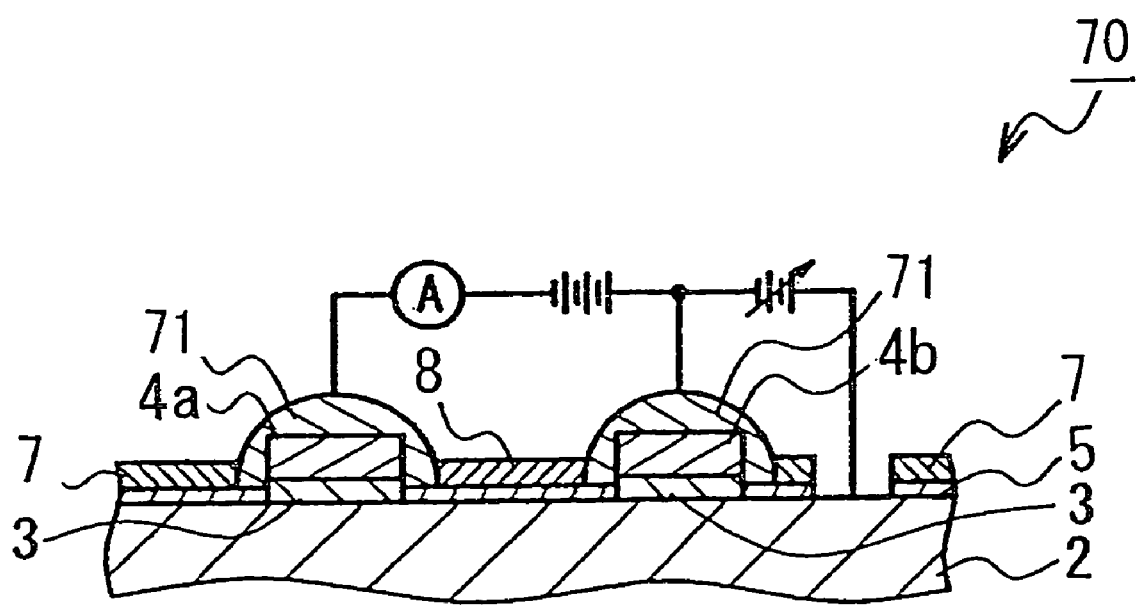
FIG. 17 is a cross-sectional view showing an example of an organic electronic device according to a ninth embodiment of the present invention.

Regarding the organic electronic device of the present invention, an example of a three-terminal organic electronic device will be described with reference to FIG. 17. FIG. 17 is a schematic cross-sectional view of the three-terminal organic electronic device, and the same members as in FIG. 1 bear the same numerals.

As shown in the drawing, the three-terminal organic electronic device 70 is provided with a substrate 2 (e.g., Si substrate) that also serves as a third electrode (gate electrode), insulating films (e.g., $SiO_2$) 3 and 5, first and second electrodes 4a and 4b, and a conductive organic thin film 8. The first electrode 4a and the second electrode 4b are formed on the substrate 2 via the insulating film 3. Furthermore, the conductive organic thin film 8 is formed on the substrate 2 so as to coat a region between the two electrodes on the surface of the substrate. In the region between the two electrodes, this conductive electronic organic device 8 is formed on the substrate 2 via the insulating film 5.

The first and the second electrodes 4a and 4b are coated with coating films 71, and the respective electrodes and the conductive organic thin film are connected electrically via the coating films 71. The coating films 71 are the same as those in the above embodiments.

Moreover, FIG. 17 illustrates a side contact structure in which the side faces of the electrodes are in contact with the conductive organic thin film, but the present invention is not limited to such a structure, and, for example, a top contact structure in which the top faces of the electrodes are in contact with the conductive organic thin film is also possible.

Such an organic electronic device can be manufactured by applying a method similar to that in the above embodiments, for example, using a silicon substrate as the substrate 2 and using $SiO_2$ as the insulating films 3 and 5.

In this organic electronic device, when a voltage is applied between the first electrode 4a and the second electrode 4b and between the second electrode 4b and the third electrode (Si substrate) 2, and the voltage between the second electrode 4b and the third electrode 2 is changed, the electron injection rate in the conjugated bond chain within the conductive organic thin film 8 can be controlled, and consequently, current in the conductive organic thin film 8 between the first electrode 4a and the second electrode 4b can be controlled. Therefore, this organic electronic device can be used as a so-called FET-type organic electronic device. In this organic electronic device, the organic molecules constituting the conductive organic thin film preferably have, for example, a polar functional group.

Figure 18A:
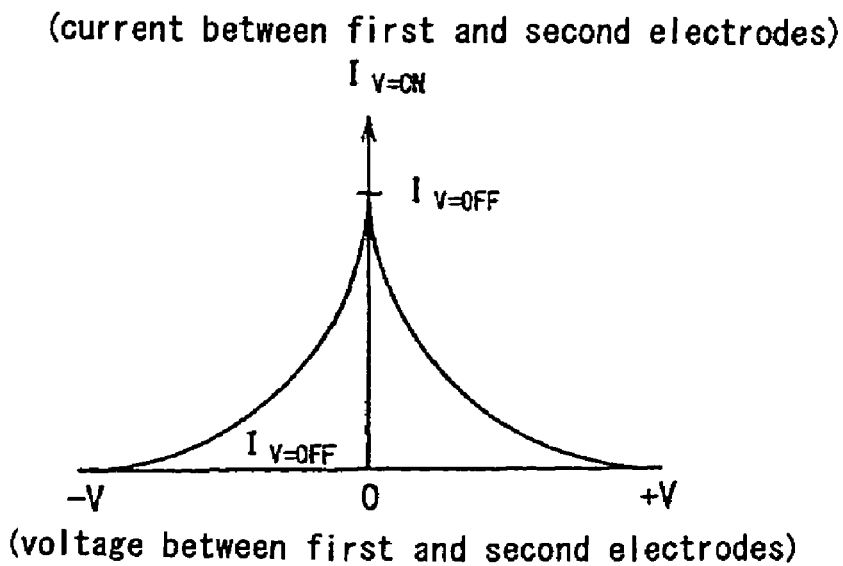
FIGS. 18A and 18B are schematic diagrams showing the change in the conductivity of the organic electronic device according to the ninth embodiment.

Regarding this three-terminal organic electronic device, the change in the conductivity of the conductive organic thin film over time due to the application of the voltage will be described with reference to FIG. 18A, and the switching operation thereof will be described with reference to FIG. 18B. FIG. 18A is a graph qualitatively showing the current and the voltage between the electrodes for the purpose of showing the change in the conductivity of the conductive organic thin film during application of the voltage to the third electrode (Si substrate). In FIG. 18A, the vertical axis indicates the current between the first and the second electrodes. Moreover, since the voltage applied to the third electrode is proportional to an electric field (applied voltage) acting on the conductive organic thin film, the voltage applied between the first and the second electrodes and the voltage applied to the third electrode become equivalent, and therefore the voltage applied between the first and the second electrodes is indicated on the horizontal axis. The change in the current is taken when the voltage applied between the first and the second electrodes is constant.

As shown in the drawing, the current between the first and the second electrodes changes with the voltage applied to the third electrode and converges on a certain value as the applied voltage increases, and thus it can be seen that the current is controlled within a range between a current value when the voltage is not applied to the third electrode (V=0) and the convergent current value. That is to say, the fact that the conductivity of the conductive organic thin film is controlled by the voltage applied to the third electrode is indicated. In this manner, the conductive organic thin film is made to shift between a stable state in which a conductivity at the time of no voltage application is provided and a stable state in which a conductivity at the time of application of a predetermined voltage is provided by changing the applied voltage, and thus the conductivity of the conductive network can be switched.

Figure 18B:
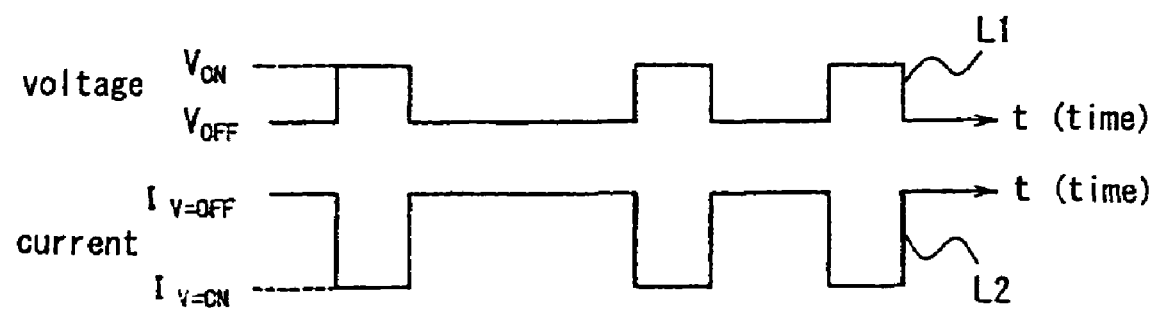

FIG. 18B is a conceptual diagram of the switching operation of the three-terminal organic electronic device and shows that the switching operation is performed between ON current ($I_{V=ON}$) in the state ($V_{ON}$) in which a predetermined voltage is applied to the third electrode and OFF current ($I_{V=OFF}$) in the state ($V_{OFF}$) in which no voltage is applied, when a constant voltage is applied between the first and the second electrodes. The horizontal axis indicates time, and a line L1 and a line L2 indicate voltage change and current change, respectively.

As shown in the drawing, it can be seen that the current between the first and the second electrodes, that is, the conductivity of the conductive organic thin film, can be switched depending on whether the voltage applied to the third electrode is on or off. Although FIG. 18B shows the switching by turning voltage on or off, it should be appreciated that the current also can be switched by applying two different types of voltages to the third electrode.

EXAMPLES

Hereinafter, the contents of the present invention will be described by way of examples, but the present invention is not limited to the following examples. In the following examples, "%" means percentage by weight.

Example 1

PEN, which is an organic molecule, was prepared and, using this, a three-terminal organic electronic device (FET) that is the same as in FIG. 17 of the ninth embodiment was produced, and the performance thereof was examined.

I. Synthesis of PEN

First, PEN expressed by chemical formula (9) below having a 1-pyrrolyl group ($C_4H_4N-$) that can form a conductive network, an oxycarbonyl group ($-OCO-$) that is a polarizable functional group, and a trichlorosilyl group ($-SiCl_3$) that causes a dehydrochlorination reaction with active hydrogen (e.g., hydrogen in a hydroxyl ($-OH$) group) on the surface of the insulating film was synthesized according to the following steps 1 through 5.

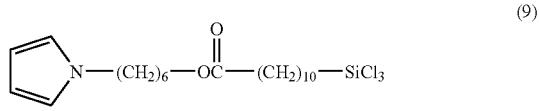
(9)

Step 1: Synthesis of 6-bromo-1-(tetrahydropyranyloxy)hexane

First, 197.8 g (1.09 mol) of 6-bromo-1-hexanol were fed into a 500 mL reactor vessel and cooled to 5° C. or less, and further 102.1 g (1.21 mol) of dihydropyran were dripped at a temperature of 10° C. or less. After completion of dripping, the mixture was warmed to room temperature to carry out a reaction under stirring for one hour. Residues obtained by this reaction were purified by silica gel column with hexane/IPE (diisopropylether)=5/1, and thus 263.4 g of 6-bromo-1-(tetrahydropyranyloxy)hexane were obtained. The yield was 90.9%. Formula (26) below shows the reaction formula of the step 1.

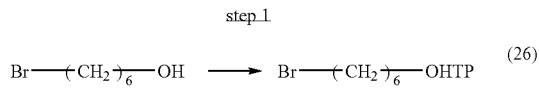
(26)

Step 2: Synthesis of N-[6-(tetrahydropyranyloxy)hexyl]pyrrole

First, 38.0 g (0.567 mol) of pyrrole and 200 mL of dehydrated tetrahydrofuran (THF) were fed into a 2 liter reactor vessel under a stream of argon gas and cooled to 5° C. or less. Then, 354 mL (0.567 mol) of 1.6M n-butyl lithium hexane solution were dripped into this mixture at 10° C. or less. After stirring for one hour at the same temperature, 600 ml of dimethylsulfoxide were further added, and THF was removed by distillation by heating for solvent substitution. Then, 165.2 g (0.623 mol) of 6-bromo-1-(tetrahydropyranyloxy)hexane were further dripped at room temperature. After dripping, the mixture was stirred for 2 hours at the same temperature. Then, 600 mol of water were added to the resultant reaction mixture to extract hexane and the organic layer was washed with water. Furthermore, after drying with anhydrous magnesium sulfate, the solvent was removed by distillation. The resultant residues were purified by silica gel column with hexane/ethyl acetate=4/1, and thus 107.0 g of N-[6-(tetrahydropyranyloxy)hexyl]pyrrole were obtained. The yield was 75.2%. Formula (27) below shows the reaction formula of the step 2.

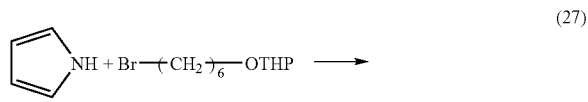
(27)

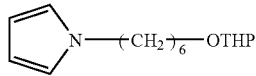

Step 3: Synthesis of N-(6-hydroxyhexyl)-pyrrole

First, 105.0 g (0.418 mol) of N-[6-(tetrahydropyranyloxy)hexyl]pyrrole obtained in the step 2, 450 mL of methanol, 225 mL of water, and 37.5 mL of concentrated hydrochloric acid were fed into a one-liter reactor vessel and stirred for six hours at room temperature. The resultant reaction mixture was poured into 750 mL of saturated brine and IPE was extracted. The organic layer was washed with saturated brine and further dried with anhydrous magnesium sulfate, and the solvent was removed by distillation. Then, the resultant residues were purified by silica gel column with n-hexane/ethyl acetate=3/1, and thus 63.1 g of N-(6-hydroxyhexyl)-pyrrole were obtained. The yield was 90.3%. Formula (28) below shows the reaction formula of the step 3.

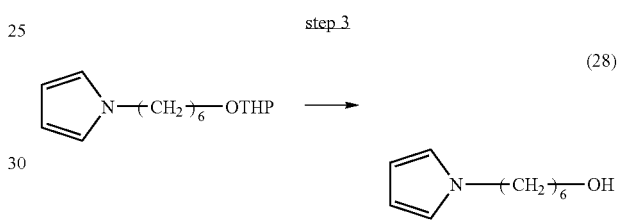
(28)

Step 4: Synthesis of N-[6-(10-undecenoiloxy)hexyl]-pyrrole

First, 62.0 g (0.371 mol) of N-(6-hydroxyhexyl)-pyrrole, 33.2 g (0.420 mol) of dry pyridine, and 1850 ml of dry toluene were fed into a 2 liter reactive vessel, and a solution of 75.7 g (0.373 mol) of 10-undecenoilchloride in 300 mL of dry toluene were further dripped at 20° C. or less. Dripping time was 30 minutes. Then, the mixture was stirred for one hour at the same temperature. The resultant reaction mixture was poured into 1.5 liters of ice water and acidified with 1N hydrochloric acid. Furthermore, ethyl acetate was extracted, and the organic layer was washed with water and with saturated brine and dried with anhydrous magnesium sulfate, and then the solvent was removed to obtain 128.2 g of a crude substance. This substance was purified by silica gel column with n-hexane/acetone=20/1, and thus 99.6 g of N-[6-(10-undecenoiloxy)hexyl]-pyrrole were obtained. The yield was 80.1%. Formula (29) below shows the reaction formula of the step 4.

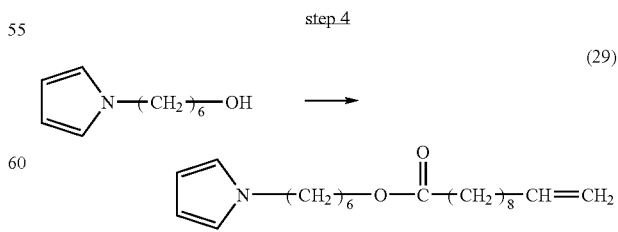
(29)

Step 5: Synthesis of PEN

First, 2.0 g ($6.0 \times 10^{-3}$ mol) of N-[6-(10-undecenoiloxy)hexyl]-pyrrole, 0.98 g ($7.23 \times 10^{-3}$ mol) of trichlorosilane, and 0.01 g of 5% isopropyl alcohol solution of H$_2$PtCl$_6$.6H$_2$O were fed into a 100 ml pressure resistant test tube provided with a cap and reacted for 12 hours at 100° C. After treating this reaction liquid with active carbon, low boiling point components were removed by distillation under a reduced pressure of 2.66×10$^3$ Pa (20 Torr), and thus 2.3 g of PEN were obtained. The yield was 81.7%. Formula (30) below shows the reaction formula of the step 5.

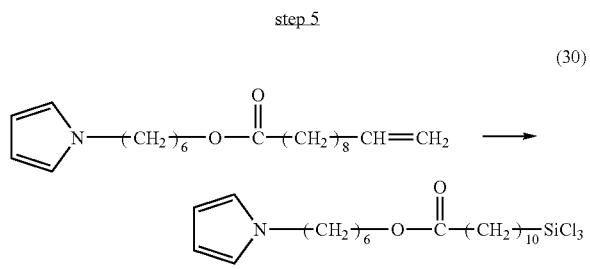

(30)

A trimethoxysilyl group can be substituted for a trichlorosilyl group at an end of PEN by causing a dehydrochlorination reaction by stirring PEN with methyl alcohol in a molar amount three times as much as PEN in the moles at room temperature (25° C.). The hydrogen chloride generated by this reaction can be separated in the form of sodium chloride by adding sodium hydroxide, if necessary.

Figure 19:
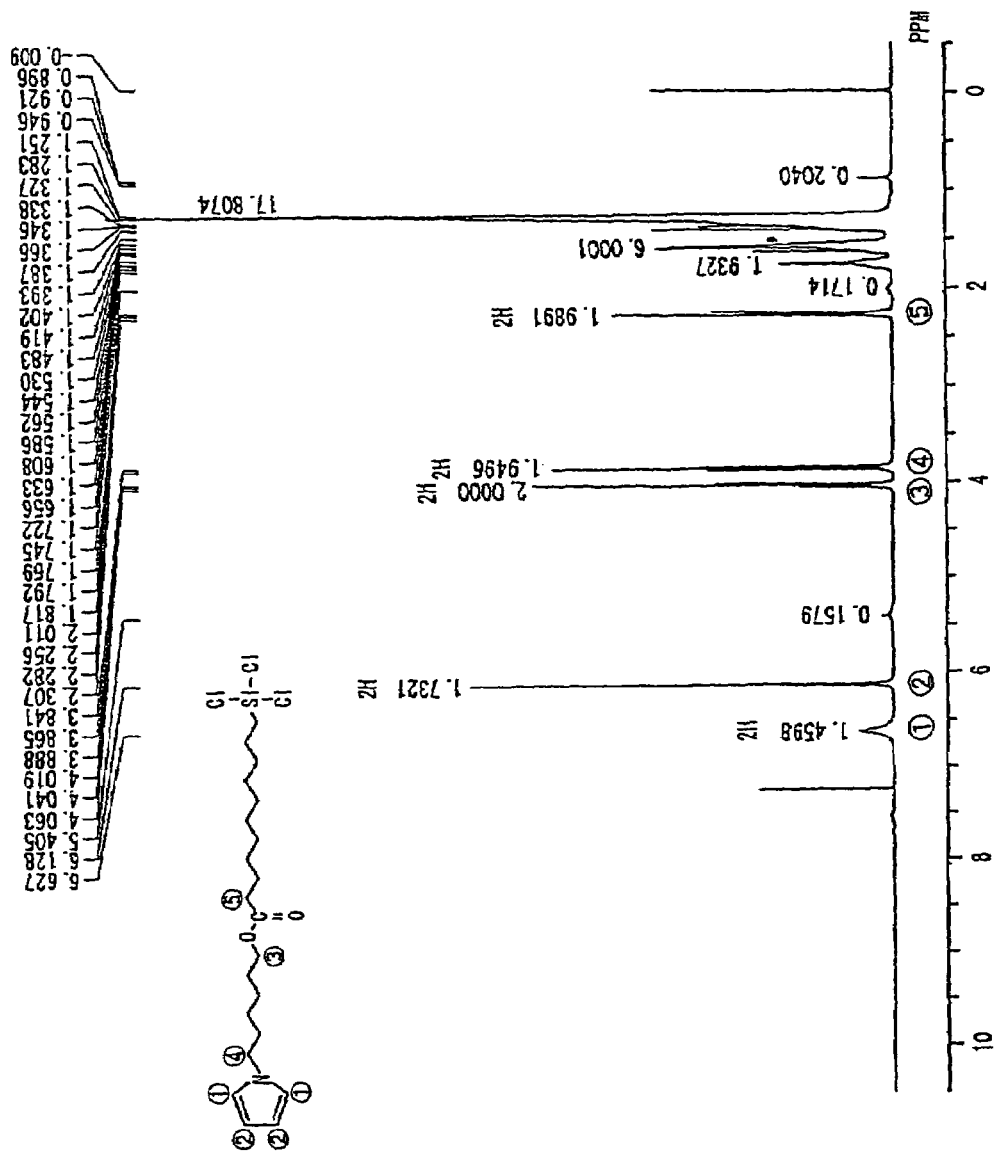
FIG. 19 is an NMR chart of a pyrrolyl compound obtained in one example of the present invention.
Figure 20:
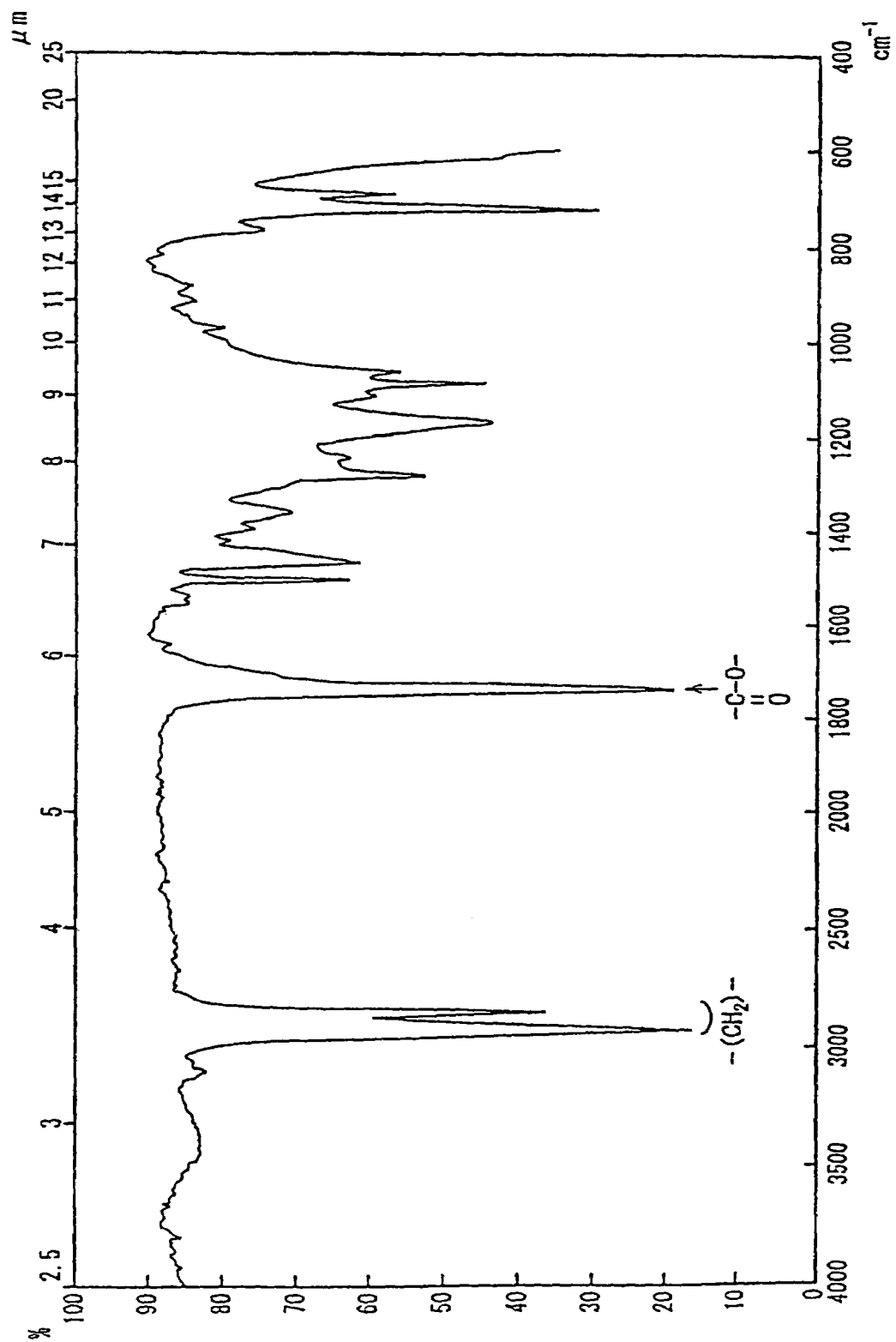
FIG. 20 is an IR chart of the pyrrolyl compound.

Regarding the obtained PEN, FIG. 19 shows a chart of NMR, and FIG. 20 shows a chart of infrared absorption spectrum (IR). Measurement conditions for NMR and IR are shown below.

(NMR)
(1) Measuring apparatus: apparatus name AL300 (manufactured by JEOL. Ltd)
(2) Measurement conditions: $^1$H-NMR (300 MHz), measurement by dissolving 30 mg of a sample in CDCl$_3$ (Infrared Absorption Spectrum: IR)
(1) Measuring apparatus: apparatus name 270-30 model (manufactured by Hitachi, Ltd.)
(2) Measurement conditions: neat (measurement by a sample being sandwitched between two NaCl plates)

II. Formation of Electrodes and Coating Films

First, a substrate made of Si was prepared, and a SiO$_2$ film that serves as an insulating film was formed on the surface of the substrate. The SiO$_2$ film was formed by oxidization of the surface of the Si substrate by immersing this substrate in 10% nitric acid for one hour.

Next, a Ni thin film (film thickness 0.6 μm (6000 angstrom)) was evaporated onto the surface of the SiO$_2$ film on the substrate. Then, the Ni thin film was etched by the photolithographic method to form two Ni electrodes both having a gap distance of 10 μm, a length of 30 μm, and a width of 100 μm.

Furthermore, after forming a SiO$_2$ film again as an insulating film on the surface of the substrate where the electrodes were not formed, the substrate was immersed in a substitution-type gold plating bath (product name Aurolectroless SMT-301: manufactured by Meltex Inc.) containing gold potassium cyanide. Then, a reaction was carried out for 10 minutes at 85° C. while stirring the solution in the gold plating bath, and thus the entire surface of each of the Ni electrodes on the substrate was coated with an Au layer as a metal thin film for coating. The thickness of the Au layer with which the top face of the Ni electrode was coated was about 0.8 μm, and the thickness of the Au layer with which the side faces of the Ni electrode were coated was about 0.8 μm.

III. Method for Forming Precursor Thin Film

First, the obtained PEN was diluted with dehydrated dimethyl silicone solvent to a concentration of 1 wt % to prepare a chemisorption solution.

Then, the substrate on which the electrodes were formed was immersed in the previously prepared chemisorption solution for one hour at room temperature (25° C.), and thus a precursor thin film was formed on the surface of the insulating film on the substrate. Unreacted PEN remaining on the substrate 2 was removed by washing with anhydrous chloroform.

A large number of hydroxyl groups containing active hydrogen are present on the surface of the insulating film 3, so that when the substrate is immersed in the chemisorption solution as described above, a dehydrochlorination reaction occurs between these hydroxyl groups and trichlorosilyl groups (—SiCl$_3$) at the ends of PEN, and thus PEN is adsorbed. Therefore, a monomolecular film made of molecules expressed by chemical formula (31) below that are covalently bonded to the surface of the insulating film 3 was formed as the precursor thin film.

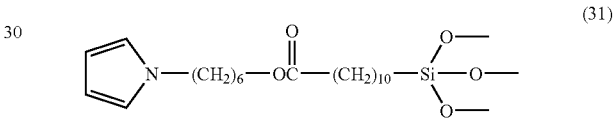

(31)

IV. Orientation of Organic Thin Film

As described above, orientation of the monomolecular film was performed at the same time of removing the unreacted PEN by washing the substrate on which the monomolecular film was formed with a chloroform solution. The substrate was immersed in a chloroform solution and washed, and when pulled up from the solution, the substrate was pulled up vertically so that the liquid flows in the direction parallel to the direction from the first electrode formed on the surface of the insulating film on the substrate to the second electrode. Thus, the monomolecular film primarily oriented in the direction from the first electrode toward the second electrode was formed.

V. Electrolytic Polymerization Method

The substrate was immersed in a pure water solution, and the monomolecular film was subjected to electrolytic polymerization by applying a voltage between the first electrode and the second electrode, and thus a conductive organic thin film was formed. The conditions for the electrolytic polymerization were that the electric field was 5 V/cm, the reaction temperature was at 25° C., and the reaction time was 5 hours. A conductive network was formed by this electrolytic polymerization. In this conductive network, conjugated bonds of the organic molecules are formed in a self-assembling manner along the direction of the electric field, and therefore when the polymerization is completely finished, the first electrode and the second electrode are electrically connected by this conductive network. Chemical formula (32) below shows a unit of the obtained conductive organic thin film.

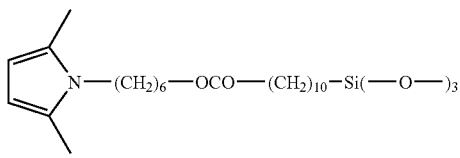

(32)

The conductive organic thin film obtained in this manner had a film thickness of about 2.0 nm, a thickness of about 0.2 nm in a polypyrrole portion, a length of 10 mm, and a width of 100 μm. Moreover, the angle of tilt orientation of the organic molecules (PEN) constituting this conductive organic thin film was about 85°.

Finally, the substrate was made accessible as the third electrode, and thus the three-terminal organic electronic device can be manufactured. In this three-terminal organic electronic device, the first electrode and the second electrode were connected by the conductive network made of a polypyrrole-based conjugated bond chain.

VI. Measurement (1) Properties of Conductive Organic Thin Film

The performance of the obtained conductive organic thin film was examined using a commercially available atomic force microscope (AFM) (manufactured by Seiko Instruments Inc., SAP 3800N). The electrical conductivity ρ under the conditions that the voltage was 1 mV and the current was 160 nA in AFM-CITS mode was $\rho > 1 \times 10^7$ S/cm at room temperature (25° C.) without doping. This value results from the fact that the ampere meter used was capable of determining only up to $1 \times 10^7$ S/cm and thus the indicator swung past the maximum. Considering the fact that the electrical conductivity of gold, which is a metal having a good conductivity, is $5.2 \times 10^5$ S/cm at room temperature (25° C.) and that of silver is $5.4 \times 10^5$ S/cm, it can be said that the electrical conductivity ρ of the conductive organic thin film in this example indicates remarkably high conductivity. Based on the above value, the conductive organic thin film in the present invention can be referred to as "super metal conductive film".

(2) Properties of Three-Terminal Organic Electronic Device

Then, regarding the obtained three-terminal organic electronic device, when a voltage of 0 V was applied between the first electrode and the third electrode (substrate) while applying a voltage of 1 V between the first electrode and the second electrode, a current of about 1 mA flowed between the first electrode and the second electrode. Subsequently, when a voltage of 5 V was applied between the first electrode and the third electrode (substrate) while applying a voltage of 1 V between the first electrode and the second electrode, the current value between the first electrode and the second electrode became substantially 0 A. Then, when the voltage between the first electrode and the third electrode was turned to 0 V from 5 V, the current flow was restored between the first electrode and the second electrode and the original conductivity was reproduced.

It seems that when applying a voltage of 5 V between the third electrode (substrate) and the first electrode, polarization of an oxycarbonyl group (—OCO—) that is a polar functional group was increased and thus a distortion occurred in the conjugated bond chain formed of polypyrrole to cause a reduction in the degree of conjugation of the conjugated bond, which led to deterioration in the conductivity of the conductive network. Then, it seems that by turning the voltage to its original value, the polarization was returned to its normal state, the distortion was restored, and the degree of conjugation was recovered. That is to say, it can be said that with the voltage applied between the first electrode and the third electrode (substrate), the conductivity of the conductive network could be controlled and the current flowing between the first electrode and the second electrode could be switched.

(3) Properties of Electrodes

The electrodes could be prevented from being corroded by coating the entire surfaces of the Ni electrodes with the Au layers and had good contact with the conductive organic thin film.

Example 2

TEN, which is an organic molecule, was prepared and, using this, an organic electronic device (FET) that is the same as in Example 1 was produced, and the performance thereof was examined.

I. Synthesis of TEN

TEN expressed by chemical formula (11) below was synthesized according to the following steps 1 through 5.

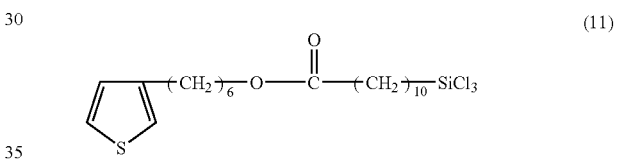

(11)

Step 1: Synthesis of 6-bromo-1-(tetrahydropyranyloxy)hexane 6-bromo-1-(tetrahydropyranyloxy)hexane was synthesized in the same manner as in Example 1 (the formula (26): step 1). First, 197.8 g (1.09 mol) of 6-bromo-1-hexanol were fed into a 500 mL reactor vessel and cooled to 5° C. or less, and then 102.1 g (1.21 mol) of dihydropyran were dripped at 10° C. or less. After completion of dripping, the mixture was warmed to room temperature and stirred for one hour. The obtained residues were subjected to silica gel column and purified using a mixed solvent of hexane/diisopropylether (IPE) (volume ratio 5:1) as an eluting solvent, and thus 263.4 g of 6-bromo-1-(tetrahydropyranyloxy)hexane were obtained. The yield in this case was 90.9%.

Step 2: Synthesis of 3-[6-(tetrahydropyranyloxy)hexyl]thiophene

3-[6-(tetrahydropyranyloxy)hexyl]thiophene was synthesized by performing a reaction expressed by chemical formula (33) below.

step 2

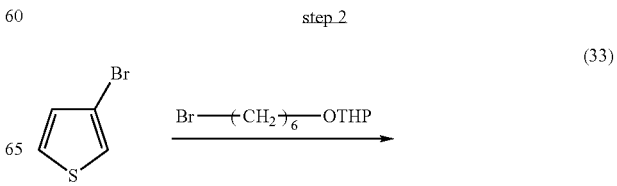

(33)

-continued

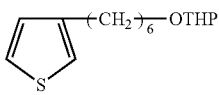

First, 25.6 g (1.06 mol) of shaved magnesium were fed into a 2 L reactor vessel under a stream of argon gas, and further 4 L of dry tetrahydrofuran (dry THF) solution containing 140.2 g (0.529 mol) of 6-bromo-1-(tetrahydropyranyloxy)hexane were dripped at room temperature. At this time, the dripping time was one hour and 50 minutes and an exothermic reaction was caused. Then, the mixture was stirred for 1.5 hours at room temperature, and thus a Grignard reagent was prepared.

Next, 88.2 g (541 mol) of 3-bromothiophene and 3.27 g of dichlorobis(triphenylphosphine)nickel (II) were fed into another 2 L reactor vessel under a stream of argon gas, and the whole Grignard reagent prepared was dripped at room temperature. At this time, the temperature in the reactor vessel was kept at room temperature (50° C. or less) and dripping time was 30 minutes. After dripping, the mixture was stirred for 23 hours at room temperature. This reaction mixture was added to 1.3 L of 0.5N HCl maintained at 0° C. and IPE was extracted. The obtained organic layer was washed with water and further washed with saturated brine, and then dried by adding anhydrous magnesium sulfate. Then, the solvent was removed by distillation, and thus 199.5 g of a crude substance containing 3-[6-(tetrahydropyranyloxy)hexyl]-thiophene were obtained. This crude substance was subjected to the next step 3 without being purified.

Step 3: Synthesis of 3-(6-hydroxyhexyl)-thiophene 3-(6-hydroxyhexyl)-thiophene was synthesized by performing a reaction expressed by chemical formula (34) below.

First, 199.5 g of the unpurified 3-[6-(tetrahydropyranyloxy)hexyl]-thiophene obtained in the step 2, 450 mL of methanol, 225 mL of water, and 37.5 mL of concentrated hydrochloric acid were fed into a 1 L reactor vessel and reacted under stirring for 6 hours at room temperature. This reaction mixture was added to 750 mL of saturated brine and IPE extraction was performed. Then, the obtained organic layer was washed with saturated brine and further dried with anhydrous magnesium sulfate, and subsequently the solvent was removed by distillation to obtain 148.8 g of a crude substance containing 3-(6-hydroxyhexyl)-thiophene. This crude substance was subjected to silica gel column and purified using a mixed solvent of n-hexane/ethyl acetate (volume ratio 3:1) as an eluting solvent, and thus 84.8 g of 3-(6-hydroxyhexyl)-thiophene were obtained. The yield in this case was 87.0% with respect to the crude substance containing 3-[6-(tetrahydropyranyloxy)hexyl]-thiophene obtained in the step 2.

Step 4: Synthesis of 3-[6-(10-undecenoiloxy)hexyl]-thiophene

3-[6-(10-undecenoiloxy)hexyl]-thiophene was synthesized by performing a reaction expressed by chemical formula (35) below

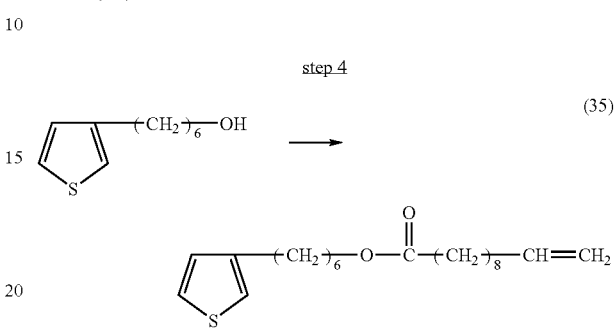

First, 84.4 g (0.458 mol) of the crude substance containing 3-(6-hydroxyhexyl)-thiophene obtained in the step 3, 34.9 g (0.442 mol) of dry pyridine, and 1450 mL of dry toluene were fed into a 2 L reactive vessel, and further 250 mL of dry toluene solution containing 79.1 g (0.390 mol) of 10-undecenoilchloride were dripped in a condition at 20° C. or less. Dripping time was 30 minutes, and subsequently a reaction was carried out under stirring for 23 hours at the same temperature. The resultant reaction mixture was added to 2 L of ice water, and further 75 mL of 1N hydrochloric acid were added. This mixture was subjected to ethyl acetate extraction, and the obtained organic layer was washed with water and further washed with saturated brine, and then dried by adding anhydrous magnesium sulfate. Then, the solvent was removed, and thus 161.3 g of a crude substance containing 3-[6-(10-undecenoiloxy)hexyl]-thiophene were obtained. This crude substance was subjected to silica gel column and purified using a mixed solvent of n-hexane/acetone (volume ratio 20:1) as an eluting solvent, and thus 157.6 g of 3-[6-(10-undecenoiloxy)hexyl]-thiophene were obtained. The yield in this case was 98.2% with respect to the crude substance containing 3-(6-hydroxyhexyl)-thiophene obtained in the step 3.

Step 5: Synthesis of TEN

TEN was synthesized by performing a reaction expressed by chemical formula (36) below.

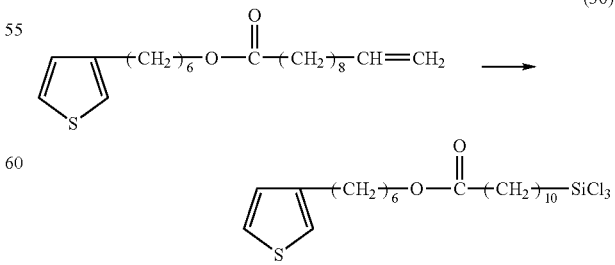

(a) First, 10.0 g ($2.86 \times 10^{-2}$ mol) of 3-[6-(10-undecenoiloxy)hexyl]-thiophene, 4.65 g ($3.43 \times 10^{-4}$ mol) of trichlorosilane, and 0.05 g of an isopropyl alcohol solution containing $H_2PtCl_6 \cdot 6H_2O$ in the proportion of 5 wt % were fed into a 100 ml pressure resistant test tube provided with a cap and reacted for 14 hours at 100° C. After treating this reaction liquid with active carbon, low boiling point components were removed by distillation under a reduced pressure. The condition for the reduced pressure was $2.66 \times 10^3$ Pa (20 Torr).

(b) In the same manner, 39.0 g ($1.11 \times 10^{-1}$ mol) of 3-[6-(10-undecenoiloxy)hexyl]-thiophene, 18.2 g ($1.34 \times 10^{-1}$ mol) of trichlorosilane, and 0.20 g of the isopropyl alcohol solution containing $H_2PtCl_6 \cdot 6H_2O$ in the proportion of 5 wt % were fed into a 100 ml pressure resistant test tube provided with a cap and reacted for 12 hours at 100° C. After treating this reaction liquid with active carbon, low boiling point components were removed by distillation under a reduced pressure. The condition for the reduced pressure was as described above.

Then, residues obtained in (a) and (b) were mixed and argon gas was passed through this mixture for one hour to remove hydrochloric acid gas, and thus 65.9 g of the targeted TEN were obtained. The yield in this case was 97.2% with respect to the crude substance containing 3-[6-(10-undecenoiloxy)hexyl]-thiophene obtained in the step 4.

Figure 21:
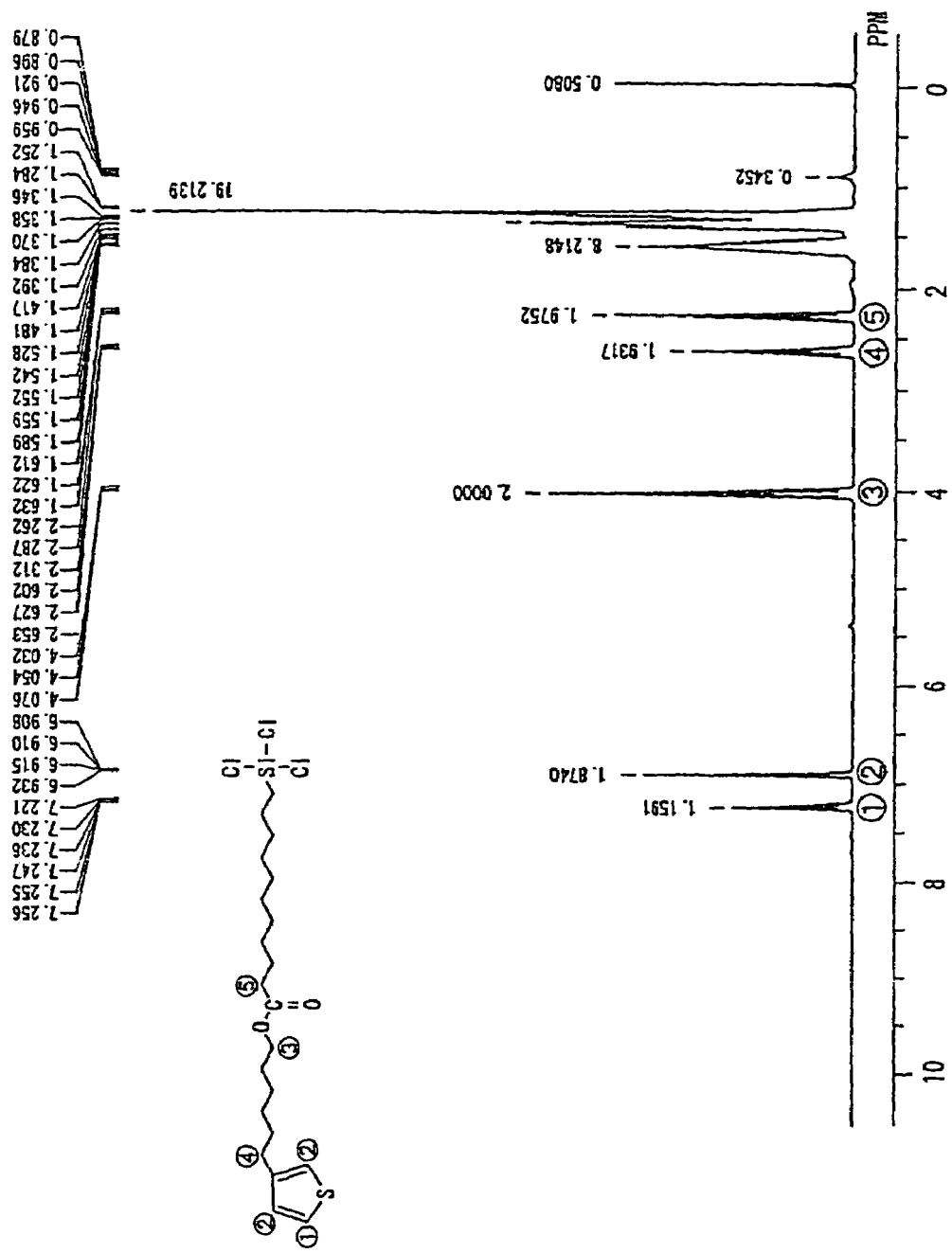
FIG. 21 is an NMR chart of a thienyl compound obtained by another example of the present invention.

The obtained TEN was subjected to IR analysis and NMR analysis. The conditions and the results thereof will be described below. FIG. 21 shows a chart of NMR and FIG. 22 shows a chart of IR.

(NMR)
(1) Measuring apparatus: apparatus name AL300 (manufactured by JEOL. Ltd)
(2) Measurement conditions: $^1$H-NMR (300 MHz), measurement by dissolving 30 mg of a sample in $CDCl_3$ (Infrared Absorption Spectrum: IR)
(1) Measuring apparatus: apparatus name 270-30 model (manufactured by Hitachi, Ltd.)
(2) Measurement conditions: neat (measurement by a sample being sandwitched between two NaCl plates)

II. Manufacturing of Three-Terminal Organic Electronic Device

A three-terminal organic electronic device was manufactured in the same manner as in Example 1 except that the obtained TEN was used.

A conductive organic thin film in the obtained organic electronic device had a film thickness of about 2.0 nm, a thickness of about 0.2 nm in a polythiophene portion, a length of 10 mm, and a width of 100 µm, and was transparent in visible light. Chemical formula (37) below shows the structure of one unit in this conductive organic thin film.

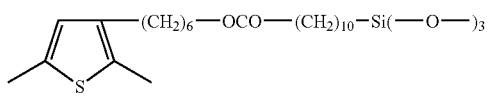

(37)

III. Measurement (1) Properties of Conductive Organic Thin Film

The performance of the obtained conductive organic thin film was examined under the same conditions, and the electrical conductivity ρ thereof was $ρ > 1 \times 10^7$ S/cm at room temperature (25° C.) without doping. Thus, this conductive organic thin film exhibited a remarkably high conductivity as in the case of the conductive organic thin film in Example 1. Moreover, the angle of tilt orientation of the organic molecules (TEN) constituting this conductive organic thin film was about 75°.

(2) Properties of Three-Terminal Organic Electronic Device

The properties of the obtained three-terminal organic electronic device were examined in the same manner as in Example 1, and the same result as in Example 1 was obtained.

(3) Properties of Electrodes

Even the side faces of the electrodes could be sufficiently coated with the Au layers As by performing electroless gold plating on the entire surfaces of the Ni electrodes, so that the electrodes could be prevented from being corroded and had good contact with the conductive organic thin film.

Example 3

A three-terminal organic electronic device was produced in the same manner as in Example 1 except that after evaporating a Ti thin film (film thickness 0.1 µm) onto the surface of the insulating film on the substrate, a Ni thin film (film thickness 0.5 µm) was formed on the Ti thin film by continuous evaporation, and these thin films were etched by the photolithographic method to form electrodes, each constituted by a layered product formed of a Ti layer and a Ni layer, and then the electrodes were coated with Au layers as the coating films. The electrodes were subjected to substitution-type gold plating for 10 minutes at 85° C., so that even the side faces of the Ti layers were plated with Au, and thus the entire surfaces of the electrodes were coated with the Au layers. The thickness of the Au layer on the top face of the electrode was about 0.8 µm and the thickness of the Au layers on the side faces of the electrode was about 0.8 µm.

Even when the electrodes were layered products each consisting of the Ti layer and the Ni layer as above, the Ti layers and the Ni layers could be prevented from being corroded by coating the entire surfaces of the electrodes with the Au layers, and also the electrodes had good contact with the conductive organic thin film.

Example 4

The compound expressed by the formula (10) was prepared by performing syntheses in the same manner as in Example 1 except that 8-bromo-octanol was used in place of 6-bromo-1-hexanol in the manufacturing step 1 of PEN and 6-hexenylchloride was used in place of 10-undecenoilchloride in the manufacturing step 4. A three-terminal organic electronic device was produced using this compound in the same manner as in Example 1, and the obtained conductive organic thin film and three-terminal organic electronic device showed the same results as in Example 1.

Example 5

The compound expressed by the formula (12) was prepared by performing syntheses in the same manner as in Example 2 except that 8-bromo-octanol was used in place of 6-bromo-1-hexanol in the manufacturing step 1 of TEN and 6-hexenylchloride was used in place of 10-undecenoilchloride in the manufacturing step 4. A three-terminal organic electronic device was produced using this compound in the same manner as in Example 1, and the obtained conductive organic thin film and three-terminal organic electronic device showed the same results as in Example 1.

Example 6

A two-terminal organic electronic device that is the same as in FIG. 1 described in the first embodiment was produced using organic molecules having a photoresponsive functional group, and the performance thereof was examined. In this example, an insulative glass substrate was used as the substrate, and thus the insulating films 3 and 8 shown in FIG. 1 were not formed.

I. Formation of Electrodes and Formation of Organic Thin Film

Electrodes and coating films were formed in the same manner as in Example 1. On the other hand, a chemisorption solution was prepared by using organic molecules of chemical formula (38) below containing an ethynylene group (—C≡C—) to be conjugated-bonded by polymerization, an azo group (—N=N—) that is a photoresponsive functional group to be photoisomerized, and a trichlorosilyl group (—SiCl₃) that causes a reaction with active hydrogen (e.g., hydroxyl group (—OH)) on the surface of the substrate as the organic molecules and diluting these organic molecules with dehydrated dimethyl silicone solvent to a concentration of 1%.

(38)

Then, an organic thin film was formed in the same manner as in Example 1 except that the chemisorption solution containing the organic molecules was used. Since a large number of hydroxyl groups containing active hydrogen are present on the surface of the glass substrate, the trichlorosilyl groups (—SiCl₃) in the organic molecules caused a dehydrochlorination reaction with the hydroxyl groups and thus are covalently bonded to the surface of the substrate. Chemical formula (39) below shows a unit constituting the obtained organic thin film (monomolecular film).

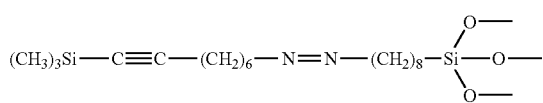

(39)

II. Orientation

Figure 23:
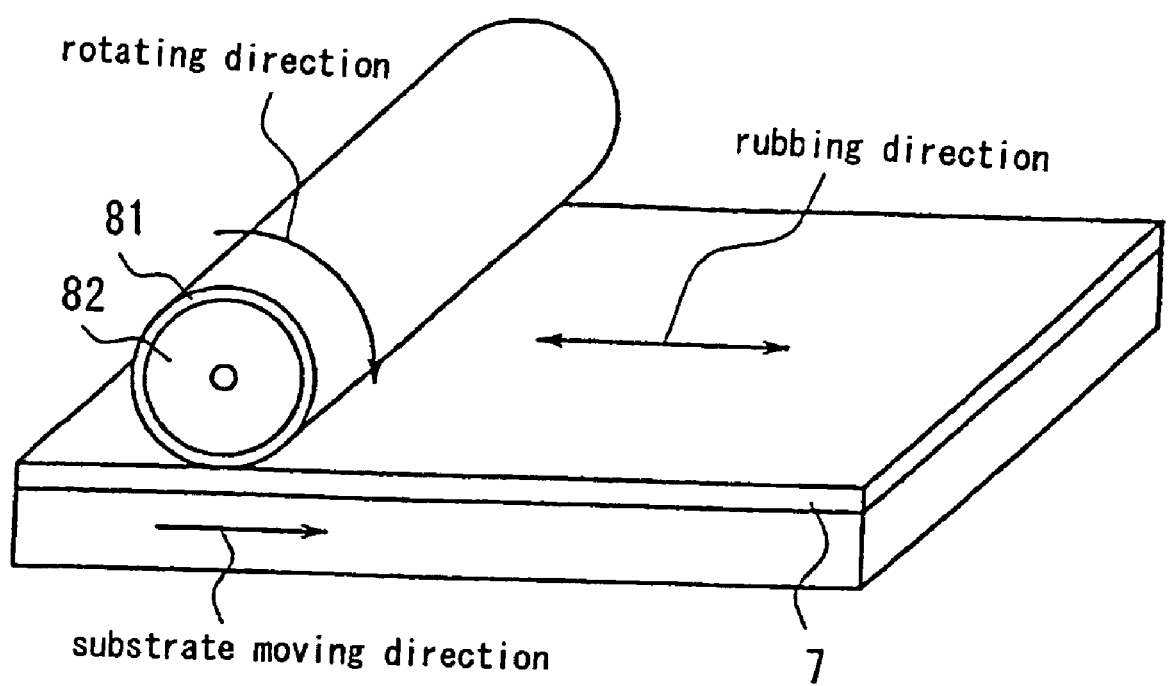
FIG. 23 is a schematic view for illustrating a rubbing method in one example of the present invention.

Next, the precursor thin film formed on the surface of the substrate was subjected to rubbing. This process was carried out by bringing a roll 82 wrapped around with a rubbing cloth 81 into contact with the surface of the substrate provided with the precursor thin film while rotating the roll at a predetermined rate, and at the same time, moving the substrate at a predetermined speed, as shown in FIG. 23. The rubbing process was performed using a rubbing roll having a diameter of 7 cm and wrapped around with a rubbing cloth made of rayon (manufactured by YOSHIKAWA CHEMICAL CO., LTD.: YA-20-R) under the conditions that the nip width was 11.7 mm, the rotation rate of the roll was 1200 revolutions/sec and the substrate transporting speed was 40 mm/sec.

III. Catalytic Polymerization Method

The glass substrate was immersed in a toluene solvent containing a Ziegler-Natta catalyst ($5 \times 10^{-2}$ mol/L triethylalminum solution and $2.5 \times 10^{-2}$ mol/L tetrabutyltitanate solution) to perform catalytic polymerization of ethynylene groups in the organic molecules constituting the organic thin film. Thus, a conductive organic thin film having a conductive network formed of a polyacetylene-based conjugated bond chain was obtained. The first electrode and the second electrode are connected electrically by this polyacetylene-based conductive network. The film thickness of the obtained organic thin film was about 2.0 nm, the length was about 10 mm, and the width was about 100 µm. Formula (40) below shows a unit constituting the obtained conductive organic thin film.

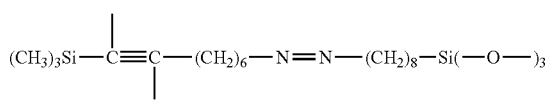

(40)

IV. Measurement (1) Properties of Two-Terminal Organic Electronic Device

When the conductive organic thin film of the obtained two-terminal organic electronic device was irradiated with visible light and then a voltage was applied between the first electrode and the second electrode, current flowed between the electrodes because the electrodes are connected by the polyacetylene-based conductive network of the organic conductive thin film. Specifically, a current of about 100 nA flowed at a voltage of 1 V. Subsequently, when the conductive organic thin film was irradiated with ultraviolet light, the current value became substantially 0 A because the azo groups in the organic molecules constituting the conductive organic thin film changed from the cis-form into the trans-form. Then, when irradiated with visible light again, the azo groups changed from the trans-form into the cis-form and current that is the same as the original current flowed, and thus it was found that the conductivity of the conductive organic thin film was restored.

It is seems that such a reduction in the conductivity due to irradiation with ultraviolet light results from a reduction in the conductivity of the conductive organic thin film because the polyacetylene-based conjugated bonds in the conductive organic thin film are distorted by photoisomerization (change from the trans-form into the cis-form) of the azo groups. That is to say, it can be said that the current flowing between the first electrode and the second electrode could be switched by controlling the conductivity of the conductive organic thin film (conductivity of the conductive network) by irradiation with light.

When the polyacetylene-based conjugated bonds are used as the conductive network, the lower the degree of polymerization is, the higher the resistance becomes. That is to say, the ON current decreases. However, in such a case, the ON current could be increased by diffusing, that is, doping, a dopant substance (e.g., halogen gas or Lewis acid as an acceptor molecule and an alkali metal or ammonium salt as a donor molecule) having a charge-transfer type functional group into the conductive network. For example, in the case where the conductive monomolecular film in this example was doped with iodine, when a voltage of 1 V was applied between the first electrode and the second electrode, a current of 0.2 mA flowed.

When a greater ON current is required, the distance between the first electrode and the second electrode can be decreased or the widths of the electrodes can be increased, and when a still greater ON current is required, it is preferable that the conductive organic thin film is a monomolecular built-up film.

(2) Properties of Electrodes

The Ni layers could be prevented from being corroded by coating the entire surfaces of the electrodes with the Au layers, and also the electrodes had good contact with the conductive organic thin film.

Example 7

A two-terminal organic electronic device was produced in the same manner as in Example 6 using organic molecules having a photoresponsive functional group expressed by formula (17) below, and the performance thereof was examined. In this example, an insulative glass substrate was used as the substrate, so that the insulating films were not formed.

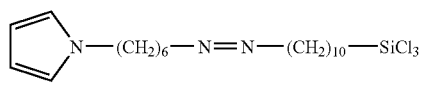
(17)

First, an organic thin film 9 was formed on a glass substrate 2 on which electrodes were formed in the same manner as in Example 6 except that a chemisorption solution was prepared by diluting organic molecules of the chemical formula (17) with a dehydrated dimethyl silicone solution to a concentration of 1 wt %. Then, the organic thin film 9 was immersed in a chloroform solution and washed, and draining orientation was performed in the same manner as in Example 1. Formula (41) below shows a unit structure constituting the obtained organic thin film.

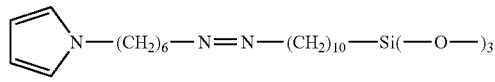
(41)

Next, the glass substrate 2 was immersed in a pure water solution and a voltage was applied between the first electrode and the second electrode (electric field 5 V/cm) to perform electrolytic polymerization of the organic thin film (reaction temperature was 25° C. and reaction time was 8 hours). A polypyrrole-based conductive network was formed by this electrolytic polymerization, and the two electrodes were electrically connected. At this time, conjugated bonds of the organic molecules are formed in a self-assembling manner along the direction of the electric field, and therefore when polymerization is completely finished, the two electrodes are electrically connected by the conductive network. Formula (42) below shows a structure of a unit constituting the obtained conductive organic thin film.

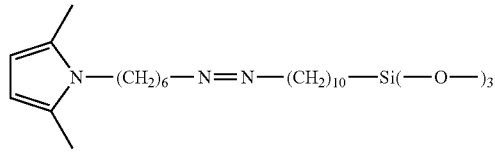
(42)

The obtained organic conductive film had a film thickness of about 2.0 nm, a thickness of about 0.2 nm in a polypyrrole chain portion, a length of 10 mm, and a width of 100 µm, and was transparent in visible light.

IV. Measurement (1) Properties of Conductive Organic Thin Film

The electrical conductivity ρ of the conductive organic thin film was determined using a commercially available atomic force microscope (AFM) (manufactured by Seiko Instruments Inc., SAP 3800N) in AFM-CITS mode (voltage: 1 mV, current: 160 nA), and the result was ρ: $1 \times 10^3$ S/cm at room temperature (25° C.) without doping. Furthermore, the electrical conductivity ρ became $1 \times 10^4$ S/cm by doping the conductive organic thin film with iodine ions.

(2) Properties of Two-Terminal Organic Electronic Device

Regarding this two-terminal organic electronic device, the change in the current was determined in the same manner as in Example 6, and as in the case of Example 6, the current flowing between the first electrode and the second electrode could be switched by controlling the conductivity of the conductive organic thin film (conductivity of the conductive network) by irradiation with light.

(3) Properties of Electrodes

The Ni layers could be prevented from being corroded by coating the entire surfaces of the electrodes with the Au layers as described above, and also the electrodes had good contact with the conductive organic thin film.

Example 8

PEN was synthesized in the same manner as in Example 1. Then, an organic electronic device (FET) was produced in the substantially same manner as in Example 1 except that a polypyrrole film was formed as the coating film, and the performance thereof was examined.

In this example, each of the electrodes had a structure in which the surface of an inner layer constituted by a Ni layer was coated with an outer layer constituted by an Au layer. Such an electrode was formed by the same method as that for forming the electrodes and the metal films for coating in Example 1.

First, a pyrrole solution was prepared by dissolving pyrrole in an ethanol solvent to a concentration of 0.1 mol/L, and a substrate on which the electrodes were formed was immersed in the pyrrole solution. Furthermore, a platinum electrode was immersed as a cathode and the electrodes on the substrate were immersed as anodes, and a voltage was applied between each of the anodes and the cathode to cause electrolytic polymerization of pyrrole, and thus polypyrrole films were formed as the coating films on the surfaces of the anodes (the first electrode and the second electrode). The conditions for this electrolytic polymerization were that the electric field was 2 v/cm, the time was 60 minutes, and the temperature was 25° C. The film thicknesses of the polypyrrole films formed on the surfaces of the first electrode and the second electrode were about 1 nm.

A device in which the conductive organic film was in good contact with the electrodes was provided by coating the electrodes with the conductive polymeric films (polypyrrole films) as above. In particular, the polypyrrole film having such conductivity and the polypyrrole bond chain in the conductive organic thin film can be directly bonded by electrolytic polymerization, so that a connection with almost no energy barrier can be achieved.

Example 9

An organic electronic device (FET) was produced in the same manner as in Example 8 except that a monomolecular film having 1-(mercaptononadecyl)pyrrole as a constituent molecule was formed as the coating film by the following method.

First, 1-(mercaptononadecyl)pyrrole that is the constituent molecule was dissolved in an acetonitrile solvent to a concentration of 0.01 mol/L. Then, the substrate was immersed in this solution, and monomolecular films that are the coating films were formed on the surfaces of the Au layers of the electrodes.

The film thicknesses of the monomolecular films formed on the surfaces of the first electrode and the second electrode were about 1 nm. The obtained result was that, as in the case of Example 8, the electrodes had good contact with the conductive organic thin film in this device.

Example 10

First, TEN was synthesized in the same manner as in Example 3. Then, an organic electronic device (FET) was produced in the substantially same manner as in Example 3 except that a polythiophene film was formed as the coating film by the following method, and the performance thereof was examined.

In this example, each of the electrodes had a structure in which the surface of an inner layer formed of a Ni layer was coated with an outer layer formed of an Au layer. Such an electrode was formed by the same method as that for forming the electrodes and the metal films for coating in Example 1.

First, thiophene was dissolved in an ethanol solvent to a concentration of 0.1 mol/L to prepare a thiophene solution, and a substrate on which electrodes were formed was immersed in the thiophene solution. Furthermore, a platinum electrode was immersed as a cathode and the electrodes on the substrate were immersed as anodes, and a voltage was applied between the cathode and each of the anodes to cause electrolytic polymerization of pyrrole, and thus polythiophene films were formed on the surfaces of the anodes. The conditions for this electrolytic polymerization were that the electric field was 3 v/cm, the time was 10 minutes and the temperature was 25° C. The film thicknesses of the polythiophene films formed on the surfaces of the first electrode and the second electrode were about 1 nm.

Consequently, a device in which the conductive electronic thin film had good contact with the electrodes was obtained by coating the electrodes with the coating films (polythiophene films). In particular, the polythiophene film having such conductivity and a polythiophene bond chain in the conductive organic thin film can be directly bonded by electrolytic polymerization, so that a connection with almost no energy barrier can be achieved.

Example 11

An organic electronic device (FET) was produced in the same manner as in Example 10 except that a monomolecular film having 1-(mercaptohexadecyl)thiophene as a constituent molecule was formed as the coating film.

First, 1-(mercaptohexadecyl)thiophene that is the constituent molecule was dissolved in an ethanol solvent to a concentration of 0.01 mol/L, and the substrate was immersed in this solution to form monomolecular films for coating on the surfaces of the outer layers (Au layers) of the electrodes.

The film thicknesses of the monomolecular films for coating formed on the surfaces of the first electrode and the second electrode were about 1 nm. The obtained three-terminal organic electronic device was a device in which the contact with the conductive organic thin film was good, as in the case of Example 3.

Example 12

A three-terminal organic electronic device was produced in the same manner as in Example 8 except that after evaporating a Ti thin film (film thickness 0.1 µm) onto the surface of the insulating film on the substrate, a Ni thin film (film thickness 0.5 µm) was formed on the Ti thin film by continuous evaporation and these thin films were etched by the photolithographic method to form inner layers each consisting of a layered product of a Ti layer and a Ni layer, and then the layered products were coated with Au layers that were outer layers to form the first and the second electrodes. The layered products were subjected to substitution-type gold plating for 10 minutes at 85° C., so that even the side faces of the Ti layers were plated with Au, and thus the entire surfaces of the layered products were coated with the Au layers. The thickness of the Au layer on the top face of the layered product was about 0.9 µm and the thickness of the Au layer on the side faces of the layered product was about 0.9 µm.

Also in this example, a device in which the electrodes had good contact with the conductive organic thin film as in the case of Example 10 was obtained by coating the electrodes with the coating films.

Example 13

The compound expressed by the formula (10) was prepared by performing syntheses in the same manner as in Example 1 except that 8-bromo-octanol was used in place of 6-bromo-1-hexanol in the manufacturing step 1 of PEN and 6-hexenylchloride was used in place of 10-undecenoilchloride in the manufacturing step 4. A three-terminal organic electronic device was produced in the same manner as in Example 8 using this compound, and the obtained conductive organic thin film and three-terminal organic electronic device showed the same results as in Example 8.

Example 14

The compound expressed by the formula (12) was prepared by performing syntheses in the same manner as in Example 3 except that 8-bromo-octanol was used in place of 6-bromo-1-hexanol in the manufacturing step 1 of TEN and 6-hexenylchloride was used in place of 10-undecenoilchloride in the manufacturing step 4. A three-terminal organic electronic device was produced in the same manner as in Example 10 using this compound, and the obtained conductive organic thin film and three-terminal organic electronic device showed the same results as in Example 10.

Example 15

A first and a second electrode were formed in the same manner as in Example 8 except that an insulative glass substrate was used as the substrate and no insulating film was formed. Then, polyacetylene-based monomolecular films for coating films were formed on the surfaces of the electrodes in the following manner.

First, an acetylene derivative, $(CH_3)_3Si-C\equiv C-(CH_2)_6-N=N-(CH_2)_8-SH$, was dissolved in an acetonitrile solvent to a concentration of 0.1 mol/L, and this acetylene solution was applied to the surfaces of the first and the second electrodes on the substrate (applied thickness: about 10 μm) to be adsorbed. Then, after an adsorption reaction, the solvent was removed by washing to form acetylene derivative monomolecular films. Subsequently, the monomolecular films were irradiated with an electron beam (100 Mrad) in a nitrogen atmosphere to polymerize the acetylene, and thus the surfaces of the electrodes were coated with polyacetylene monomolecular films (thickness of about 1 nm).

Then, a two-terminal organic electronic device was produced in the same manner as in Example 6 except that a substrate provided with the above-described electrodes and coating films was used.

Also in this example, a two-terminal organic electronic device having the same properties as that of Example 6 was obtained. Moreover, the device in which the electrodes had good contact with the conductive organic thin film was obtained by coating the electrodes with the coating films.

Example 16

First, electrodes were formed on a substrate in the same manner as in Example 15, and coating films were formed on the surfaces of these electrodes. Then, a two-terminal organic electronic device was produced in the same manner as in Example 7 except that the substrate provided with the above-described electrodes and coating films was used.

Also in this example, a two-terminal organic electronic device having the same properties as that of Example 7 was obtained. Moreover, the device in which the electrodes had good contact with the conductive organic thin film was obtained by coating the electrodes with the coating films.

Example 17

First, PEN was synthesized in the same manner as in Example 1. Then, an organic electronic device (FET) was produced in the substantially same manner as in Example 1 except that coating films were formed by the following method, and the performance thereof was examined.

In this example, each of the electrodes had a structure in which the surface of an inner layer formed of a Ni layer was coated with an outer layer formed of an Au layer. Such electrodes were formed by the same method as that for forming the electrodes and the metal films for coating in Example 1.

First, a thiol compound (4-mercapto-1-butanol: HO—$(CH_2)_4$—SH) having a mercapto group in one end of a molecule and having a hydroxyl group in the other end was added to 100 mL of butyl alcohol under a dry atmosphere to prepare a 0.01 mol/L solution. The substrate provided with the electrodes was immersed in this solution for 30 minutes at 25° C. The substrate was pulled up from the solution, and butyl alcohol and unreacted thiol compound were removed from the surface of the substrate by drying.

By the above-described operation, a reaction occurred between the metals constituting the electrode and the mercapto groups (—SH) in the thiol compound, and thus the thiol compound was adsorbed to the surface of the electrode. Thus, monomolecular films constituted by molecules expressed by chemical formula (43) below that were chemically bonded to the surfaces of the electrodes were formed as the coating films.

$$HO—(CH_2)_4—S— \hspace{2cm} (43)$$

In this example, a large number of hydroxyl groups containing active hydrogen are present not only on the surface of the substrate but also on the surfaces of the coating films, so that when the substrate provided with the above-described coating films and electrodes is immersed in a chemisorption solution containing the PEN, a dechlorination reaction occurs also on the surfaces of the coating films. The chlorosilyl groups (—SiCl) in the substance are covalently bonded to the surfaces of the coating films by this reaction.

As described above, the coating films that are chemically bonded to the respective electrodes and the conductive organic thin film are arranged between the respective electrodes and the conductive organic thin film, and thus an organic electronic device having excellent connectivity of the electrodes with the conductive organic thin film can be obtained.

Moreover, when a compound expressed by chemical formula: HO—$(CH_2)_6$—COO—$(CH_2)_4$—SH or chemical formula: HO—$(CH_2)_8$—COO—$(CH_2)_4$—SH is used as a material for forming the coating films, excellent connectivity between the electrodes and the conductive organic thin film also can be achieved.

Example 18

First, TEN was synthesized in the same manner as in Example 3. Then, an organic electronic device (FET) was produced in the same manner as in Example 17 except that this TEN was used, and the performance thereof was examined.

Also in this example, coating films that are chemically bonded to the respective electrodes and the conductive organic thin film are arranged between the respective electrodes and the conductive organic thin film, and thus an organic electronic device having excellent connectivity between the electrodes and the conductive organic thin film was obtained.

Example 19

An organic electronic device was produced in the same manner as in Examples 17 and 18 except that the method for forming the coating films was different.

The method for forming molecular films for coating in this example is as follows. First, a thiol compound (18-nonadecenylthiol: $CH_2=CH—(CH_2)_{17}—SH$) having a mercapto group in one end of a molecule and having a vinyl group in the other end was added to 100 mL of acetonitrile to prepare a 1 wt % solution. The substrate provided with the electrodes was immersed in this solution for 30 minutes at 25° C. Then, the substrate was pulled up from the solution, and the surface of the substrate was washed with chloroform.

By the above-described operation, a reaction occurred between the metals constituting the electrodes and the mercapto groups (—SH) in the thiol compound, so that the thiol compound was adsorbed to the surfaces of the electrodes. Thus, monomolecular films constituted by molecules expressed by chemical formula (44) below that were chemically bonded to the surfaces of the electrodes were formed as precursors of the coating films.

$$CH_2=CH—(CH_2)_{17}—S— \hspace{2cm} (44)$$

Subsequently, the substrate provided with the precursors of the coating films was immersed in a 5 mmol/L aqueous solution of permanganate for 24 hours at room temperature. Then, the substrate was pulled up from the solution and washed with water. Through this treatment, the vinyl groups in the organic molecules constituting the precursors of the coating films were oxidized and changed into groups containing active hydrogen (—OH groups). Thus, the coating films that were chemically bonded to the surfaces of the electrodes and also had active hydrogen on their surfaces were formed.

When the substrate provided with such coating films is immersed in a chemisorption solution containing organic molecules (PEN and TEN) that are the same as those in Examples 17 and 18, since a large number of hydroxyl groups containing active hydrogen are present on the surfaces of the coating films and the surface of the substrate, the chlorosilyl groups (—SiCl) in the organic molecules cause a dehydrochlorination reaction with the hydroxyl groups to be covalently bonded to the surfaces of the coating films and the surface of the substrate. Thus, as in the cases of Examples 17 and 18, a monomolecular film that was a precursor thin film was formed on the surfaces of the coating films and the surface of the substrate.

Moreover, the precursor thin film was polymerized to form a conductive organic thin film and an organic electronic device was produced, and then it could be confirmed that an organic electronic device having excellent connectivity between the electrodes and the conductive organic thin film was obtained by arranging the coating films that were chemically bonded to the respective electrodes and the conductive organic thin film between the respective electrodes and the conductive organic thin film.

Moreover, it could be confirmed that when a compound expressed by chemical formula: $CH_2=CH-(CH_2)_6-COO-(CH_2)_4-SH$ was used as a material for forming the coating films, excellent connectivity between the electrodes and the conductive organic thin film also was achieved.

Example 20

First, electrodes were formed on a substrate and coating films were formed on the surfaces of these electrodes in the same manner as in Example 17. Then, a two-terminal organic electronic device was produced in the same manner as in Example 6 except that this substrate was used.

Also in this example, a two-terminal organic electronic device having the same properties as that of Example 6 was obtained. Moreover, the device in which the electrodes had good contact with the conductive organic thin film was obtained by coating the electrodes with the coating films.

Example 21

First, electrodes were formed on a substrate and coating films were formed on the surfaces of these electrodes in the same manner as in Example 18. Then, a two-terminal organic electronic device was produced in the same manner as in Example 7 except that the substrate provided with the above-described electrodes and coating films was used.

Also in this example, a two-terminal organic electronic device having the same properties as that of Example 7 was obtained. Moreover, the device in which the electrodes had good contact with the conductive organic thin film was obtained by coating the electrodes with the coating films.

INDUSTRIAL APPLICABILITY

The organic electronic device of the present invention has the coating films for coating the surfaces of the electrodes, which electrically connect the electrodes to the conductive organic thin film and also reduce the connection resistance, so that the organic electronic device has excellent electrical connectivity between the electrodes and the conductive organic thin film. Furthermore, the conductive organic thin film is used for electrically connecting the electrodes, so that the organic electronic device exhibits an excellent property of being independent of crystallinity, for example, even when further fine processing is performed to increase the density of the device. Such an organic electronic device can be applied to, for example, various apparatuses such as liquid display apparatuses, electroluminescent display apparatuses, and electroluminescent elements, and is useful.

The invention claimed is:

1. An organic electronic device comprising
a substrate,
at least two electrodes formed on the substrate,
a conductive organic thin film that is formed on the substrate and electrically connects the electrodes, and
a coating film coating at least a portion of the electrodes,
wherein the conductive organic thin film is a polymer of organic molecules containing a conjugated-bondable group, and one end of each of the organic molecules is chemically bonded to the surface of the substrate and the conjugated-bondable groups in the organic molecules are polymerized with other conjugated-bondable groups to form a conjugated bond chain, and
the coating film electrically connects the electrodes to the conductive organic thin film and achieves a smaller connection resistance than that in the case where the electrodes and the conductive organic thin film are connected directly.

2. The organic electronic device according to claim 1, wherein the coating film is a metal film.

3. The organic electronic device according to claim 2, wherein the coating film is a metal film containing at least one selected from the group consisting of gold, platinum, and silver.

4. The organic electronic device according to claim 3, wherein the electrodes contain at least one metal selected from the group consisting of Ni, Ti, indium tin oxide (ITO), Cr, and W.

5. The organic electronic device according to claim 4, wherein each of the electrodes is a single Ni layer or a layered product having a Ni layer as an uppermost layer.

6. The organic electronic device according to claim 1, wherein the coating film is a conductive polymeric film.

7. The organic electronic device according to claim 6, wherein the coating film is a conductive polymeric film based on at least one selected from the group consisting of polypyrrole, polythiophene, polyaniline, polyacetylene, polydiacetylene, and polyacene.

8. The organic electronic device according to claim 6, wherein at least surface portions of the electrodes contain at least one metal selected from the group consisting of gold, platinum, and silver.

9. The organic electronic device according to claim 8, wherein each of the electrodes comprises an inner layer containing at least one metal selected from the group consisting of Ni, Ti, indium tin oxide (ITO), Cr and W, and a gold layer, a platinum layer or a silver layer for coating the inner layer.

10. The organic electronic device according to claim 9, wherein the inner layer is a single Ni layer or a layered product having a Ni layer as an uppermost layer.

11. The organic electronic device according to claim 1, wherein the coating film is a monomolecular film that is chemically bonded to the electrodes.

12. The organic electronic device according to claim 11, wherein the coating film is a monomolecular film containing constituent molecules that are chemically bonded to the surfaces of the electrodes by a —S— bond.

13. The organic electronic device according to claim 11, wherein at least a part of the constituent molecules of the coating film are conjugated-bonded to the conjugated-bondable groups in the organic molecules constituting the conductive organic thin film.

14. The organic electronic device according to claim 11, wherein the constituent molecule of the coating film is selceted from the group consisting of pyrrole derivatives, thiopherte derivatives, aniline derivatives, acetylene derivatives, and diacetylene derivatives containing a substituent that is bonded to the surface of the electrode by a —S— bond.

15. The organic electronic device according to claim 14, wherein the constituent molecule of the coating film is a pyrrole derivative having a substituent that is bonded to the surface of the electrode by a —S— bond witb nitrogen (N) in position 1 of a pyrrole ring.

16. The organic electronic device according to claim 14, wherein the constituent molecule of the coating film is a thiophene derivative having a substituent that is bonded to the surface of the electrode by a —S— bond with at least one of carbons (C) in positions 3 and 4 of a thiophene ring.

17. The organic electronic device according to claim 13, wherein the constituent molecules of the coating film are polymerized by conjugated bonding.

18. The organic electronic device according to claim 11, wherein at least a part of the constituent molecules of the coating film are covalently bonded to portions other than the conjugated-bondable groups in the organic molecules constituting the conductive organic thin film.

19. The organic electronic device according to claim 18, wherein the constituent molecules of the coating film and the organic molecules constituting the conductive organic thin film are bonded by at least one of a siloxane bond (—SiO—) and a —SiN— bond.

20. The organic electronic device according to claim 11, wherein the constituent molecules of the coating film are oriented.

21. The organic electronic device according to claim 11, wherein at least surface portions of the electrodes contain at least one of metal selected from the group consisting of gold, platinum, and silver.

22. The organic electronic device according to claim 21, wherein each of the electrodes comprises an inner layer containing at least one metal selected from the group consisting of Ni, Ti, indium tin oxide (ITO), Cr and W, and a gold layer, a platinum layer or a silver layer for coating the inner layer.

23. The organic electronic device according to claim 22, wherein the inner layer is a single Ni layer or a layered product having a Ni layer as an uppermost layer.

24. The organic electronic dcvicc according to claim 1, wherein the conductive organic thin film is a monomolecular film or a monomolecular built-up film.

25. The organic electronic device according to claim 24, wherein the organic molecules constituting the conductive organic thin film are oriented.

26. The organic electronic device according to claim 1, wherein the conductive organic thin film has a conjugated bond chain polymerized by conjugated bonding of the organic molecules, and the conjugated bond chain is a chain of at least one selected from the group consisting of polypyrrole, polythiophene, polyacetylene, polydiacetylene, polyacene, polyphenylene, polyphenylenevinylene, polypyridinopyridine, and polyaniline, and derivatives thereof.

27. The organic electronic device according to claim 26, wherein the derivative of polyacetylene is at least one group selected from the group consisting of polymethylacetylene, polybutylacetylene, polycyanoacetylene, polydicyanoacetylene, polypyridylacetylene, and polyphenylacetylene.

28. The organic electronic device according to claim 1, wherein a covalent bond between one end of the organic molecule constituting the conductivc organic thin film and the surface of the substrate is at least one bond of a siloxane bond (—SiO—) and a —SiN— bond.

29. The organic electronic device according to claim 1, wherein the organic molecule constituting the conductive organic thin film has a polar functional group containing no active hydrogen between a site that forms a covalent bond with the surface of the substrate and a site that forms a conjugated bond with another organic molecule.

30. The organic electronic device according to claim 29, wherein the polar functional group is at least one group selected from the group consisting of an ester group (—COO—), an oxycarbonyl group (—OCO—), a carbonyl group (—CO—), and a carbonate group (—OCOO—).

31. The organic electronic device according to claim 29, wherein a unit of the polymer constituting the conductive organic thin film is at least one of units expressed by chemical formulae (1) and (2)below:

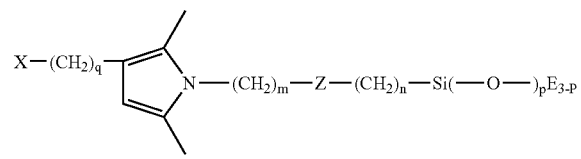

(1)

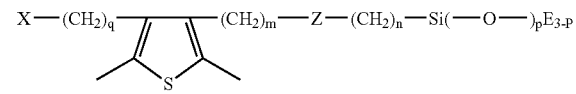

(2)

where X is hydrogen, an organic group containing an ester group, or an organic group containing an unsaturated group, q is an integer of 0 to 10, Z is an ester group (—COO—), an oxycarbonyl group (—OCO—), a carbonyl group (—CO—), or a carbonate group (—OCOO—), E is hydrogen or an alkyl group having 1 to 3 carbon atoms, m and n are integers and m+n is an integer of 2 to 25, and p is an integer of 1 to 3.

32. The organic electronic device according to claim 1, wherein the organic molecule constituting the conductive organic thin film has a photoresponsive functional group containing no active hydrogen between a site that forms a covalent bond with the surface of the substrate and a site that forms a conjugated bond with another organic molecule.

33. The organic electronic device according to claim 32, wherein the photoresponsive functional group is an azo group (—N=N—).

34. The organic electronic device according to claim 32, wherein the unit of the polymer constituting the conductive organic thin film is at least one of units expressed by chemical formulae (3) and (4) below:

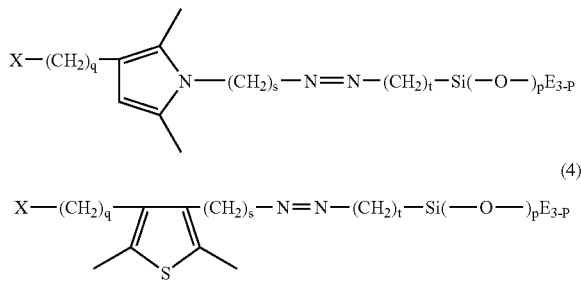

where X is hydrogen, an organic group containing an ester group or an organic group containing an unsaturated group, q is an integer of 0 to 10, E is hydrogen or an alkyl group having 1 to 3 carbon atoms, each s and t is an integer of 1 to 20, and p is an integer of 1 to 3.

35. The organic electronic device according to claim 1, wherein the substrate is a substrate selected from the group consisting of glass, quartz, and plastics.

36. The organic electronic device according to claim 1, wherein the surface of the substrate is coated with an oxide film, and the surface of the oxide film, in place of the substrate, is covalently bonded to one end of the organic molecule constituting the conductive organic thin film.

37. The organic electronic device according to claim 36, wherein the oxide film contains at least one inorganic oxide selected from the group consisting of $SiO_2$, $Al_2O_3$, $Y_2O_3$, $ZrO_2$, $Ta_2O_5$, $La_2O_3$, $Nb_2O_3$, $TiO_2$, barium zirconate titanate (BZT), and barium strontium titanale (BST).

38. The organic electronic device according to claim 36, wherein the oxide film comprises an organic oxide.

39. The organic electronic device according to claim 1 further comprising a third electrode for controlling an electric field that acts on the conductive organic thin film.

40. The organic electronic device according to claim 39, wherein the substrate is a silicon substrate, and the conductive organic thin film is provided on the substrate via an oxide film, and the substrate functions as the third electrode for controlling the electric field that acts on the conductive organic thin film by applying a voltage between the two electrodes.

* * * * *

UNITED STATES PATENT AND TRADEMARK OFFICE
CERTIFICATE OF CORRECTION

PATENT NO. : 7,259,389 B2  Page 1 of 1
APPLICATION NO. : 10/503829
DATED : August 21, 2007
INVENTOR(S) : Yamamoto et al.

It is certified that error appears in the above-identified patent and that said Letters Patent is hereby corrected as shown below:

Column 59, line 12 (claim 14): "selceted" should read --selected--.
Column 59, line 20 (claim 15): "witb" should be --with--.
Column 59, line 56 (claim 24): "dcvicc" should be --device--.
Column 60, line 11 (claim 28): "conductivc" should be --conductive--.
Column 60, line 29 (claim 31): "(2)below" should read --(2) below--.
Column 62, line 9 (claim 37): "titanale" should be --titanate--.

Signed and Sealed this

Twenty-first Day of October, 2008

JON W. DUDAS
*Director of the United States Patent and Trademark Office*